(12) United States Patent
Marshall et al.

(10) Patent No.: US 11,754,607 B2
(45) Date of Patent: Sep. 12, 2023

(54) DETECTION OF ELECTRIC DISCHARGES THAT PRECEDE FIRES IN ELECTRICAL WIRING

(71) Applicant: Whisker Labs, Inc., Germantown, MD (US)

(72) Inventors: Robert S. Marshall, Ijamsville, MD (US); Christopher Dale Sloop, Mount Airy, MD (US); Stan Heckman, Chelmsford, MA (US); Donnie Bixler, Woodsboro, MD (US); Eric Hoppmann, Rockville, MD (US)

(73) Assignee: Whisker Labs, Inc., Germantown, MD (US)

( * ) Notice: Subject to any disclaimer, the term of this patent is extended or adjusted under 35 U.S.C. 154(b) by 0 days.

(21) Appl. No.: 17/670,691

(22) Filed: Feb. 14, 2022

(65) Prior Publication Data

US 2022/0163578 A1    May 26, 2022

Related U.S. Application Data

(63) Continuation of application No. 16/811,756, filed on Mar. 6, 2020, now Pat. No. 11,249,125, which is a
(Continued)

(51) Int. Cl.
*G01R 31/08* (2020.01)
*G01R 27/28* (2006.01)
(Continued)

(52) U.S. Cl.
CPC .......... *G01R 27/28* (2013.01); *G01R 31/001* (2013.01); *G01R 31/085* (2013.01); *G01R 31/086* (2013.01); *H02H 1/0015* (2013.01)

(58) Field of Classification Search
CPC .... G01R 31/001; G01R 31/14; G01R 31/085; G01R 31/086; G01R 31/58; H02H 1/0015
See application file for complete search history.

(56) References Cited

U.S. PATENT DOCUMENTS

| 4,858,054 A | 8/1989 | Franklin |
| 5,117,191 A | 5/1992 | Saigo et al. |

(Continued)

FOREIGN PATENT DOCUMENTS

| CN | 205246122 U | 5/2016 |
| EP | 1657559 A1 | 5/2006 |

(Continued)

OTHER PUBLICATIONS

Tang, K. et al., "A Novel Arc Fault Detector for Early Detection of Electrical Fires," Sensors 2016, 16, 500, published Apr. 9, 2016, 24 pages.

(Continued)

*Primary Examiner* — Patrick Assouad
*Assistant Examiner* — Demetrius R Pretlow
(74) *Attorney, Agent, or Firm* — Cesari & McKenna, LLP

(57) ABSTRACT

Described herein are methods and systems for detecting electrical discharges that precede electrical fires in electrical wiring. One or more sensor devices coupled to a circuit detect one or more signal waveforms generated by electrical activity on the circuit. The sensor devices identify one or more transient signals within the one or more signal waveforms, and generate one or more transient characteristics based upon the identified transient signals. A server communicably coupled to the sensor devices receives the one or more transient characteristics. The server analyzes the one or more transient characteristics to identify one or more elec- (Continued)

trical discharge indications. The server generates one or more alert signals when one or more electrical discharge indications are identified.

52 Claims, 42 Drawing Sheets

Related U.S. Application Data continuation of application No. 16/359,755, filed on Mar. 20, 2019, now Pat. No. 10,641,806.

(60) Provisional application No. 62/645,743, filed on Mar. 20, 2018.

(51) Int. Cl.
*H02H 1/00* (2006.01)
*G01R 31/00* (2006.01)

(56) References Cited

U.S. PATENT DOCUMENTS

| | | | |
|---|---|---|---|
| 5,434,509 A * | 7/1995 | Blades | G01R 31/66 |
| | | | 324/613 |
| 5,600,526 A | 2/1997 | Russell et al. | |
| 5,608,328 A | 3/1997 | Sanderson | |
| 5,659,453 A * | 8/1997 | Russell | H02H 1/0015 |
| | | | 361/76 |
| 5,729,145 A | 3/1998 | Blades | |
| 6,002,561 A | 12/1999 | Dougherty | |
| 6,049,143 A | 4/2000 | Simpson et al. | |
| 6,313,641 B1 | 11/2001 | Brooks | |
| 6,362,629 B1 | 3/2002 | Parker et al. | |
| 6,420,863 B1 | 7/2002 | Milde et al. | |
| 6,504,692 B1 | 1/2003 | Macbeth et al. | |
| 6,654,219 B1 | 11/2003 | Romano et al. | |
| 6,667,691 B2 | 12/2003 | Sapir | |
| 6,772,077 B1 | 8/2004 | Parker et al. | |
| 6,798,211 B1 | 9/2004 | Rockwell et al. | |
| 7,285,961 B2 | 10/2007 | Shinmoto et al. | |
| 7,489,138 B2 | 2/2009 | Yu et al. | |
| 8,008,926 B2 | 8/2011 | Park et al. | |
| 8,421,473 B2 | 4/2013 | Shea | |
| 9,577,420 B2 | 2/2017 | Ostrovsky et al. | |
| 9,640,968 B2 | 5/2017 | Li et al. | |
| 9,746,512 B2 | 8/2017 | Shipley | |
| 9,945,894 B2 | 4/2018 | Grosjean | |
| 10,359,466 B2 * | 7/2019 | Alberto | G01R 23/17 |
| 10,690,713 B2 * | 6/2020 | Alberto | G01H 1/00 |
| 2002/0097065 A1 | 7/2002 | Krahn et al. | |
| 2003/0030448 A1 | 2/2003 | Sapir | |
| 2003/0169544 A1 | 9/2003 | Langford et al. | |
| 2004/0156154 A1 | 8/2004 | Lazarovich et al. | |
| 2004/0263182 A1 * | 12/2004 | Parker | G01R 31/52 |
| | | | 324/536 |
| 2005/0286185 A1 | 12/2005 | Henson et al. | |
| 2007/0052425 A1 | 3/2007 | Kraz | |
| 2007/0085548 A1 | 4/2007 | Shinmoto et al. | |
| 2007/0151446 A1 * | 7/2007 | Younsi | B03C 3/08 |
| | | | 95/2 |
| 2007/0153436 A1 | 7/2007 | Pellon et al. | |
| 2007/0247767 A1 | 10/2007 | Zhang | |
| 2007/0252603 A1 | 11/2007 | Restrepo et al. | |
| 2008/0036472 A1 | 2/2008 | Collins, Jr. et al. | |
| 2008/0068027 A1 | 3/2008 | Crain et al. | |
| 2008/0203068 A1 | 8/2008 | Ukai et al. | |
| 2008/0309351 A1 * | 12/2008 | Stewart | G01R 31/1272 |
| | | | 324/551 |
| 2009/0012727 A1 * | 1/2009 | Siew | G01R 31/088 |
| | | | 702/59 |
| 2009/0088988 A1 | 4/2009 | Muthu-Mannivannan et al. | |
| 2009/0119035 A1 * | 5/2009 | Younsi | G01R 31/343 |
| | | | 702/58 |
| 2009/0265041 A1 | 10/2009 | Benjamin | |
| 2010/0148791 A1 | 6/2010 | Oldenburg et al. | |
| 2010/0219838 A1 | 9/2010 | Prabhu K et al. | |
| 2011/0241697 A1 | 10/2011 | Omatsu et al. | |
| 2012/0185185 A1 | 7/2012 | Bae et al. | |
| 2012/0330583 A1 | 12/2012 | Serra et al. | |
| 2013/0128396 A1 | 5/2013 | Danesh et al. | |
| 2013/0226479 A1 | 8/2013 | Grosjean | |
| 2014/0067291 A1 * | 3/2014 | Balog | G01R 31/1227 |
| | | | 702/58 |
| 2014/0314122 A1 | 10/2014 | Knoop | |
| 2014/0320139 A1 * | 10/2014 | Renforth | G01R 31/11 |
| | | | 324/415 |
| 2015/0155698 A1 | 6/2015 | Li et al. | |
| 2015/0355256 A1 * | 12/2015 | Yoshimura | G01R 31/44 |
| | | | 324/551 |
| 2016/0291073 A1 | 10/2016 | Handy et al. | |
| 2016/0359311 A1 | 12/2016 | Handy et al. | |
| 2018/0120380 A1 * | 5/2018 | Giussani | G01R 15/186 |
| 2018/0145496 A1 * | 5/2018 | Zeller | G01R 31/086 |
| 2018/0180677 A1 * | 6/2018 | Lee | G01R 31/129 |
| 2021/0190850 A1 * | 6/2021 | Gundel | G01R 15/16 |

FOREIGN PATENT DOCUMENTS

| | | |
|---|---|---|
| JP | 2007/121189 A | 5/2007 |
| JP | 2010/262388 A | 11/2010 |
| JP | 2014/241062 A | 12/2014 |
| KR | 10-1046141 B1 | 4/2010 |
| KR | 10-1457881 B1 | 11/2014 |
| KR | 10-1519923 B1 | 5/2015 |
| KR | 10-1535923 B1 | 7/2015 |
| KR | 10-1685101 B1 | 12/2016 |
| KR | 101824718 B1 | 2/2018 |

OTHER PUBLICATIONS

International Search Report and Written Opinion of the International Searching Authority in PCT Application No. PCT/US2019/023215 in the name of Whisker Labs, Inc., dated Jul. 1, 2019, 14 pages.

Non-Final Office Action dated Jul. 22, 2019 for related U.S. Appl. No. 16/359,755, 10 pages.

Non-Final Office Action dated Jul. 1, 2021 for related U.S. Appl. No. 16/811,756, 10 pages.

* cited by examiner

DETECTION OF ELECTRIC DISCHARGES THAT PRECEDE FIRES IN ELECTRICAL WIRING

RELATED APPLICATIONS

This application is a continuation of U.S. patent application Ser. No. 16/811,756, filed Mar. 6, 2020, which is a continuation of U.S. Pat. No. 10,641,806, filed Mar. 20, 2019, which claims priority to U.S. Provisional Patent Application No. 62/645,743, filed on Mar. 20, 2018, the entirety of each of which is incorporated by reference herein.

TECHNICAL FIELD

The subject matter of the application relates generally to detection of early-stage electrical discharges, including arc faults, in electrical wiring.

BACKGROUND

Electricity travels over conductors ("wires") on the grid, inside the home (e.g., circuits, breaker panels, etc.), up to and inside connected devices and appliances. According to statistics released by the United States Fire Administration National Fire Data Center (available at www.usfa.fema.gov/downloads/pdf/statistics/v19i8.pdf, see Table 7), electrical arcing in residential electrical wiring and outlets account for over 87% of electrical fires—which are one of the most dangerous threats to life and property. Arc faults (also called arcs) are high-power, continuous electric discharges between two or more conductors—typically occurring in residential buildings when the integrity of an electrical wire or insulation is compromised (e.g., through physical damage, water damage, corrosion, age, or loose connections, among others). Events such as lightning strikes and power surges can also initiate the breakdown of insulation and lead to a compromised wire. As a result of the compromised wire, small, sporadic electrical discharges begin to occur and the insulating material that surrounds the wire is carbonized. As the electrical discharges continue over time, the insulation is increasingly eroded, and the electrical discharges increase in intensity. Eventually, strong electrical discharges become continuous arc faults that form in the wire—resulting in large flow of current and large releases of energy (with correspondingly high temperatures). Due to the proximity of the wire to wood frame, insulation, and/or similar combustible materials, when the temperatures produced by the arcs are high enough, they are likely to produce fire. It would be a great advantage in preventing electrical fires if one could detect, and be warned about, the small electrical discharges that may occur for days, weeks, or months before they become large enough to create electrical arcing (as is described in Yereance, R. A., and Kerkhoff, T., *Electrical Fire Analysis,* 3rd ed., page 206, Charles C. Thomas, Springfield Ill. (2010)).

Electrical fires occur when a conductor fails to conduct, or an insulator fails to insulate. Conductors fail to conduct because of joint fractures, the last strand of a cable breaks, an outlet, 'push-in' or other connection or junction on a conductor loosen, or in some other way the surface area between the conductors becomes too small to serve as a safe and reliable connection. Consequently, the lack of a quality connection can result in a high resistance connection that produces heat and leads to physical and chemical processes that oxidize the connection, further increasing resistance and heat. Electrical arcing often occurs across these poor connections depending on many factors, including but not limited to physical changes in the connection (temperature), the energy load drawn across the connection, and the changing quality (or lack of quality) of the connection.

Insulators fail where a flexible cord or rigid insulator fractures or pollutants or water infiltrates an intended insulation opening. Fractures may arise from defects in manufacturing, hammer blows during construction, or repeated stress in use. Each time a small electrical failure occurs across one of these fractures, a bit more of the insulator is damaged, (usually) extinguishing the immediate failure but (usually) facilitating future failures. Most organic insulators "char," slowly transforming them into more conductive simpler organic materials through a process named "carbonization of insulation." In other words, the job of the insulator is slowly compromised.

In turn, arcing along these carbonized paths produces "scintillations," dim flashes of red, orange, yellow, or white light. Scintillations and the fault currents associated with them are sporadic and highly intermittent. As scintillations and fault currents evolve and become more active, they generate pulses with high-frequency content. These pulses propagate through the home's electrical network. This process, arc tracking, is a slow process that can take from a few weeks up to many years. These electrical discharges may eventually become continuous arc faults, resulting in a large flow of current and large energy releases (with correspondingly high temperatures) that can ignite a fire.

Electrical arcing produces impulsive signals at ignition and extinction many times in each 60 Hz electrical cycle. Impulsive signals produce broadband electrical noise, including high-frequency energy that propagates freely through home wiring, which behaves as a communications network at high frequencies.

The above-mentioned electrical discharges can occur in various ways, including: parallel, series, and line-to-ground discharges. A parallel electrical discharge occurs when current/electrons flows from one conductor to another through a gas or dielectric material because of a large voltage difference between the conductors—typically through damaged insulation or the air. FIG. 1A is a diagram of a parallel electrical discharge. The electrical circuit has two wires 102a, 102b, each of which is surrounded by an insulating material. If the insulation between the wires breaks down, then electrical discharges (such as discharge 104) can occur between the wires. Examples of parallel electrical discharges include carbonization (i.e., breakdown of the insulating material) and wet tracking (i.e., moisture on the surface of the wire that enables currents to form).

A series electrical discharge occurs when a single conductor is damaged to an extent that resistance through the conductor is increased and creates voltage differences high enough for discharges to occur within the conductor and into the surrounding insulation (or even to external objects, if the conductor is exposed). FIG. 1B is a diagram of a series electrical discharge. The electrical circuit includes a damaged wire 106 that produces an electrical discharge 108. Examples of series electrical discharges include ground pyrolysis (i.e., current flowing from the conductor to nearby wood), and last strand (i.e., breakage of the wire resulting in increase in heat and ignitable gases). A special type of series discharges occurs in a phenomenon known as a glowing connection (as shown in FIG. 1C). In such cases electrical conductors are touching, but not firmly connected together. An oxide layer forms at the boundary of the interface which increases the resistance of the conductors at the junction. If current is flowing through the interface, the temperature can rise to dangerous levels (e.g., the white area 110 shows a high temperature at an electrical outlet) which can ignite nearby materials and cause a destructive fire. By the time an electrical discharge has progressed to the point that it causes a fire, it is too late to take corrective action and prevent loss. It is important to detect the occurrence of such electrical discharges in electrical wiring as early as possible so that remedial measures can be put in place.

Technology such as arc-fault circuit interrupters (AFCI) currently exist to detect early-stage electrical discharges, such as arc faults. In electrical outlets equipped with AFCI technology, an AFCI detects arc faults in a circuit and breaks the circuit upon detection of such faults to prevent an electrical fire from happening. However, AFCIs are relatively expensive and must be installed on each circuit in a building to detect electrical discharges on the individual circuits.

Detecting electrical discharges on a circuit within an electrical infrastructure is sufficient to finding and mitigating hazards which could become electrical fires, however a further improvement would be to develop methods and technologies that allow customers and professionals to more quickly identify when and where electrical discharges are occurring.

SUMMARY

Therefore, what is needed is a method and system that detects early-stage electrical discharges before they are large enough to start a fire in electrical wiring systems, such as those found in homes and other buildings. The methods and systems described herein provide the advantage of detecting early-stage electrical discharges in electrical wiring when they begin to form, which enables rapid notification of the potential fire danger. In addition, the techniques described herein enable the long-term automatic monitoring of electrical wiring systems for electrical discharges (e.g., weeks, months, years) to obtain detailed information on activity and trends in a building's electrical wiring system—including the ability to distinguish between different electrical discharge severity levels, monitoring for events such as surges, sags and brownouts which can initiate carbonization of insulation and initiation of electrical discharges, correlate detection of electrical discharges with the operation of appliances and devices running in the home (for example, the arcing may occur within a device such as an air conditioning unit; long-term monitoring provides the opportunity to correlate the discharges with the operation of the air conditioning unit, and the device can correlate electrical problems on the electrical grid by aggregating information from monitoring across multiple homes). Also, in some embodiments, the system leverages a single monitoring device that plugs into an existing electrical outlet—instead of complicated, expensive, or dangerous installation of other devices or monitoring components.

The invention, in one aspect, features a system for detecting electric discharges that precede electrical fires in electrical wiring. The system comprises one or more sensor devices coupled to a circuit, each sensor device is configured to detect one or more signal waveforms generated by electrical activity on the circuit. Each sensor device is configured to identify one or more transient signals within the one or more signal waveforms, and each sensor device is configured to generate one or more transient characteristics based upon the one or more transient signals. The system comprises a server computing device communicably coupled to the one or more sensor devices. The server computing device is configured to receive the transient characteristics from each of the sensor devices. The server computing device is configured to analyze the transient characteristics to identify one or more electrical discharge indications. The server computing device is configured to generate one or more alert signals when one or more electrical discharge indications are identified.

The invention, in another aspect, features a computerized method of detecting electrical discharges that precede electrical fires in electrical wiring. One or more sensor devices coupled to a circuit detect one or more signal waveforms generated by electrical activity on the circuit. Each sensor device identifies one or more transient signals within the one or more signal waveforms, and each sensor device generates one or more transient characteristics based upon the one or more transient signals. A server computing device communicably coupled to the one or more sensor devices receives the one or more transient characteristics from each of the sensor devices. The server computing device analyzes the transient characteristics to identify one or more electrical discharge indications. The server computing device generates one or more alert signals when one or more electrical discharge indications are identified.

The invention, in another aspect, features a sensor device for detecting electrical discharges that precede electrical fires in electrical wiring, the sensor device coupled to a circuit. The sensor device comprises a module that senses electrical activity on the circuit and detects one or more signal waveforms of the electrical activity. The sensor device comprises a processor that identifies one or more transient signals within the one or more signal waveforms, generates one or more transient characteristics based upon the identified transient signals, analyzes the transient characteristics to identify one or more electrical discharge indications, and generates one or more alert signals when one or more electrical discharge indications are identified.

The invention, in another aspect, features a system for detecting electrical discharges that precede electrical fires in electrical wiring. The system comprises one or more sensor devices coupled to a circuit, each sensor device configured to detect one or more signal waveforms generated by electrical activity on the circuit. The system comprises a server computing device communicably coupled to the one or more sensor devices. The server computing device receives the one or more signal waveforms from each sensor device. The server computing device analyzes the one or more signal waveforms to identify one or more electrical discharge indications. The server computing device generates one or more alert signals when one or more electrical discharge indications are identified.

The invention, in another aspect, features a computerized method of detecting electrical discharges that precede electrical fires in electrical wiring. One or more sensor devices each coupled to a circuit detect one or more signal waveforms generated by electrical activity on the circuit. A server computing device communicably coupled to the one or more sensor devices receives the one or more signal waveforms from each sensor device. The server computing device analyzes the one or more signal waveforms to identify one or more electrical discharge indications. The server computing device generates one or more alert signals when one or more electrical discharge indications are identified.

The invention, in another aspect, features a sensor device for detecting electrical discharges that precede electrical fires in electrical wiring. The sensor device comprises a module that detects one or more signal waveforms generated by electrical activity on the circuit. The sensor device comprises a processor that receives the one or more signal waveforms from each sensor device, analyzes the one or more signal waveforms to identify one or more electrical discharge indications, generates one or more alert signals when one or more electrical discharge indications are identified.

Any of the above aspects can include one or more of the following features. In some embodiments, the one or more signal waveforms comprise a full voltage cycle waveform. In some embodiments, the one or more sensor devices sample the full voltage cycle waveform at a frequency in a range between 10 MHz and 100 MHz.

In some embodiments, identifying one or more transient signals within the one or more signal waveforms comprises: a) dividing the samples of the full voltage cycle waveform into a plurality of bins; b) determining a mean value and a maximum value for each of the plurality of bins; c) determining a difference between the mean value and the maximum value; d) repeating steps a)-c) for each of a plurality of other samples of the full voltage cycle waveform to determine an accumulated maximum value for each bin across all of the samples; and e) determining a derivative of each accumulated maximum value across the plurality of bins. In some embodiments, generating one or more transient characteristics based the identified transient signals comprises determining an average transient amplitude over a voltage cycle of the full voltage cycle waveform, and determining an average transient amplitude for a plurality of phase sections within the voltage cycle.

In some embodiments, analyzing the transient characteristics to identify one or more electrical discharge indications comprises determining a ratio of average peak transients in one or more of the phase sections near a maximum voltage to average peak transients near a zero crossing of the voltage cycle, and identifying the average peak transients in one or more of the phase sections near a maximum voltage as electrical discharge indications, when the ratio is above a predetermined threshold. In some embodiments, generating one or more alert signals when one or more electrical discharge indications are identified comprises determining a count of the identified electrical discharge indications occurred within a predetermined amount of time, and generating one or more alert signals based upon the count of the identified electrical discharge indications.

In some embodiments, identifying one or more transient signals within the one or more signal waveforms comprises a) determining a derivative of the samples of the full voltage signal waveform across a full voltage cycle; b) dividing the samples of the full voltage cycle waveform into a plurality of bins; c) determining a maximum value for each of the plurality of bins; d) repeating steps a)-c) for each of a plurality of other samples of the full voltage cycle waveform to determine an accumulated maximum value for each bin across all of the samples; and e) determining a derivative of each accumulated maximum value across the plurality of bins. In some embodiments, generating one or more transient characteristics based upon the identified transient signals comprises determining an average transient amplitude over a voltage cycle of the full voltage cycle waveform, and determining an average transient amplitude for a plurality of phase sections within the voltage cycle.

In some embodiments, analyzing the transient characteristics to identify one or more electrical discharge indications comprises determining a ratio of average peak transients in one or more of the phase sections near a maximum voltage to average peak transients near a zero crossing of the voltage cycle, and identifying the average peak transients in one or more of the phase sections near a maximum voltage as electrical discharge indications, when the ratio is above a predetermined threshold. In some embodiments, generating one or more alert signals when one or more electrical discharge indications are identified comprises determining a count of the identified electrical discharge indications occurred within a predetermined amount of time, and generating one or more alert signals based upon the count of the identified electrical discharge indications.

In some embodiments, the one or more sensor devices sample the full voltage cycle waveform at 80 MHz upon detecting that the one or more signal waveforms have reached a threshold value. In some embodiments, identifying one or more transient signals within the one or more signal waveforms comprises identifying one or more samples of the full voltage cycle waveform that exceed a threshold value, and storing the identified one or more samples. In some embodiments, generating one or more transient characteristics based upon the identified transient signals comprises, for each identified sample: determining a count of peaks in the identified sample; determining a rise time of the peaks in the identified sample; determining a pulse width of the identified sample; and determining an integral of the identified sample. In some embodiments, analyzing the transient characteristics to identify one or more electrical discharge indications comprises categorizing the identified sample as an electrical discharge indication when the count of peaks in the identified sample is above a predetermined threshold and when the rise time of the peaks in the identified sample is above a predetermined threshold. In some embodiments, generating one or more alert signals when one or more electrical discharge indications are identified comprises determining a count of the identified electrical discharge indications occurred within a predetermined amount of time, and generating one or more alert signals based upon the count of the identified electrical discharge indications.

In some embodiments, the one or more sensor devices identify one or more transient signals within the one or more signal waveforms and generate one or more transient characteristics based upon the identified transient signals using a transient detection profile stored in a memory module of the sensor device. In some embodiments, the server computing device generates an updated transient detection profile based upon transient characteristics received from one or more of the sensor devices and transmits the updated transient detection profile to each of the one or more sensor devices. In some embodiments, the one or more sensor devices apply the updated transient detection profile to identify subsequent transient signals within the one or more signal waveforms and generate the one or more transient characteristics.

In some embodiments, the server computing device transmits the one or more alert signals to a remote computing device. In some embodiments, the server computing device transmits the one or more alert signals to at least one of the one or more sensor devices. In some embodiments, the at least one of the one or more sensor devices activates a visual indicator upon receiving at least one of the one or more alert signals. In some embodiments, the visual indicator is a light emitting diode (LED) component of the at least one of the one or more sensor devices. In some embodiments, the server computing device uses one or more machine learning algorithms to analyze the one or more signal waveforms to identify one or more electrical discharge indications.

The invention, in another aspect, features a computerized method of detecting hazardous electrical discharge activity patterns in electrical wiring. One or more sensor devices, coupled to a circuit, sense a multiple voltage cycle waveform generated by electrical activity on the circuit. A computing device coupled to the sensor devices detects a pattern of electrical discharge activity occurring in the multiple voltage cycle waveform based upon transient characteristics of the waveform in each of a plurality of cycles. The computing device recognizes the pattern of electrical discharge activity as a hazard event. The computing device identifies one or more conditions related to the pattern of electrical discharge activity. The computing device generates one or more alert messages based upon the pattern of electrical discharge activity and the identified conditions.

The invention, in another aspect, features a system for detecting hazardous electrical discharge activity patterns in electrical wiring. The system includes one or more sensor devices coupled to a circuit, and a computing device coupled to the sensor devices. The sensor devices sense a multiple voltage cycle waveform generated by electrical activity on the circuit. The computing device detects a pattern of electrical discharge activity occurring in the multiple voltage cycle waveform based upon transient characteristics of the waveform in each of a plurality of cycles. The computing device recognizes the pattern of electrical discharge activity as a hazard event. The computing device identifies one or more conditions related to the pattern of electrical discharge activity. The computing device generates one or more alert messages based upon the pattern of electrical discharge activity and the identified conditions.

Any of the above aspects can include one or more of the following features. In some embodiments, detecting the pattern of electrical discharge activity occurring in the multiple voltage cycle waveform comprises detecting an instance of electrical discharge activity in each of a plurality of cycles of the multiple voltage cycle waveform; comparing the detected electrical discharge activity instances using characteristics of each electrical discharge activity instance to determine a match; and grouping the matching electrical discharge activity instances into a patterns of electrical discharge activity. In some embodiments, the transient characteristics comprise one or more of: a ratio of (i) average peak transients in one or more phase sections of the waveform cycle near a maximum voltage to (ii) average peak transients near a zero crossing of the waveform cycle, and an average of peak transients in one or more of the phase sections near a maximum voltage when the ratio is above a predetermined threshold. In some embodiments, the computing device determines a cause of the pattern of electrical discharge activity using the identified conditions.

In some embodiments, the conditions related to the pattern of electrical discharge activity comprise one or more of: atmospheric conditions at a location of the sensor devices, temporal conditions, electrical activity conditions associated with an electrical device coupled to the circuit, or power quality conditions associated with a power distribution system to which the sensor devices are coupled. In some embodiments, the atmospheric conditions comprise one or more of precipitation, wind activity, solar activity, or outdoor temperature. In some embodiments, the temporal conditions comprise a discrete time of day or a continuous period of time. In some embodiments, the power quality conditions are one or more of: a power surge or a power sag. In some embodiments, the power quality conditions are identified on a power distribution system inside a building where the sensor devices and the circuit are located. In some embodiments, the power quality conditions are identified on a power distribution system that provides power to a building where the sensor devices and the circuit are located. In some embodiments, the electrical activity conditions comprise one or more of: the electrical device turning on or the electrical device turning off.

In some embodiments, the computing device transmits the generated alert messages to one or more remote computing devices. In some embodiments, one or more of the sensor devices receives at least one of the alert messages and activates an alert indication device embedded in the sensor device upon receiving the alert message. In some embodiments, the alert indication device comprises a light emitting diode (LED).

The invention, in another aspect, features a computerized method of detecting hazardous electrical discharge activity patterns in electrical wiring. One or more sensor devices, coupled to a circuit, sense a multiple voltage cycle waveform generated by electrical activity on the circuit. A computing device, coupled to the sensor devices, detects a pattern of electrical discharge activity occurring in the multiple voltage cycle waveform based upon transient characteristics of the waveform in each of a plurality of cycles. The computing device classifies the detected pattern of electrical discharge activity as a hazard event based upon a similarity between the detected pattern of electrical discharge activity and one or more known patterns of hazardous electrical discharge activity. The computing device generates one or more alert messages based upon the classified pattern of electrical discharge activity.

The invention, in another aspect, features a system for detecting hazardous electrical discharge activity patterns in electrical wiring. The system includes one or more sensor devices coupled to a circuit and a computing device coupled to the sensor devices. The sensor devices sense a multiple voltage cycle waveform generated by electrical activity on the circuit. The computing device detects a pattern of electrical discharge activity occurring in the multiple voltage cycle waveform based upon transient characteristics of the waveform in each of a plurality of cycles. The computing device classifies the detected pattern of electrical discharge activity as a hazard event based upon a similarity of the detected pattern of electrical discharge activity to one or more known patterns of hazardous electrical discharge activity. The computing device generates one or more alert messages based upon the classified pattern of electrical discharge activity.

Any of the above aspects can include one or more of the following features. In some embodiments, the one or more known patterns of hazardous electrical discharge activity include a pattern of circuit breaker arcing within an electric panel, a pattern of electric device arcing, and a pattern of power supply arcing. In some embodiments, the one or more known patterns of hazardous electrical discharge activity are stored as two-dimensional images in a database communicatively coupled to the computing device. In some embodiments, the computing device generates a two-dimensional image corresponding to the detected pattern of electrical discharge activity occurring in the multiple voltage cycle waveform. In some embodiments, classifying the detected pattern of electrical discharge activity as a hazard event comprises comparing one or more characteristics of the two-dimensional image of the detected pattern of electrical discharge activity to one or more characteristics of the two-dimensional images of the known patterns of hazardous electrical discharge activity to determine the similarity. In some embodiments, classifying the detected pattern of electrical discharge activity as a hazard event comprises executing a machine learning image classification model using the two-dimensional image of the detected pattern of electrical discharge activity as input to generate the similarity to one or more of the two-dimensional images of the known patterns of hazardous electrical discharge activity. In some embodiments, the machine learning image classification model is based upon a convolutional neural network.

In some embodiments, the computing device transmits the generated alert messages to one or more remote computing devices. In some embodiments, one or more of the sensor devices receives at least one of the alert messages and activates an alert indication device embedded in the sensor device upon receiving the alert message. In some embodiments, the alert indication device comprises a light emitting diode (LED). In some embodiments, the computing device identifies one or more conditions related to the detected pattern of electrical discharge activity. In some embodiments, the computing device generates the one or more alert messages based upon the classified pattern of electrical discharge activity and the identified conditions.

Other aspects and advantages of the invention will become apparent from the following detailed description, taken in conjunction with the accompanying drawings, illustrating the principles of the invention by way of example only.

BRIEF DESCRIPTION OF THE DRAWINGS

The advantages of the technology described above, together with further advantages, may be better understood by referring to the following description taken in conjunction with the accompanying drawings. The drawings are not necessarily to scale, emphasis instead generally being placed upon illustrating the principles of the technology.

DETAILED DESCRIPTION

Figure 1A:
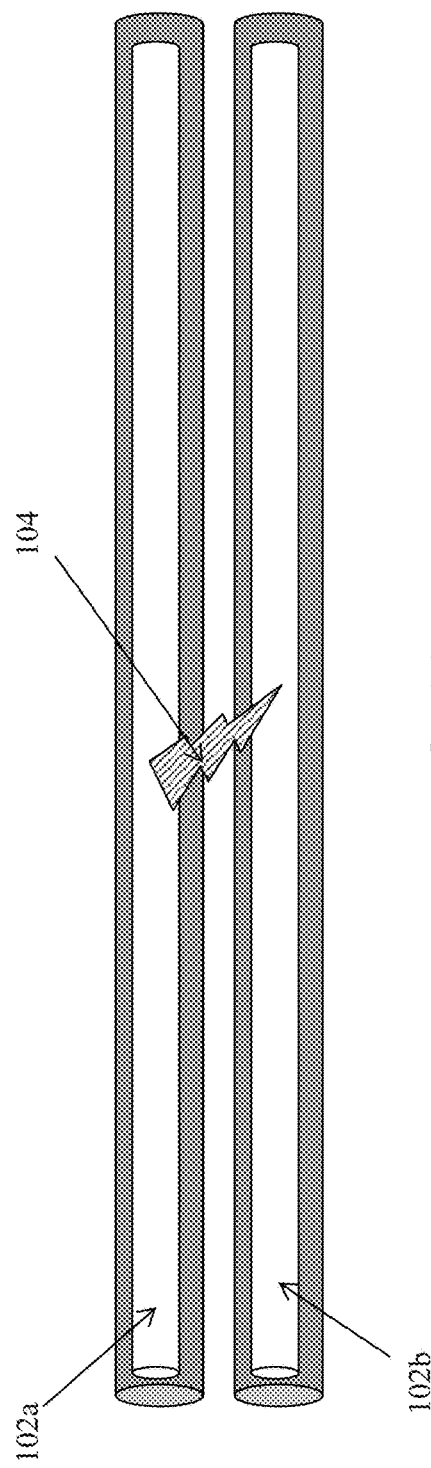
FIG. 1A is a diagram of a parallel arc fault.
Figure 1B:
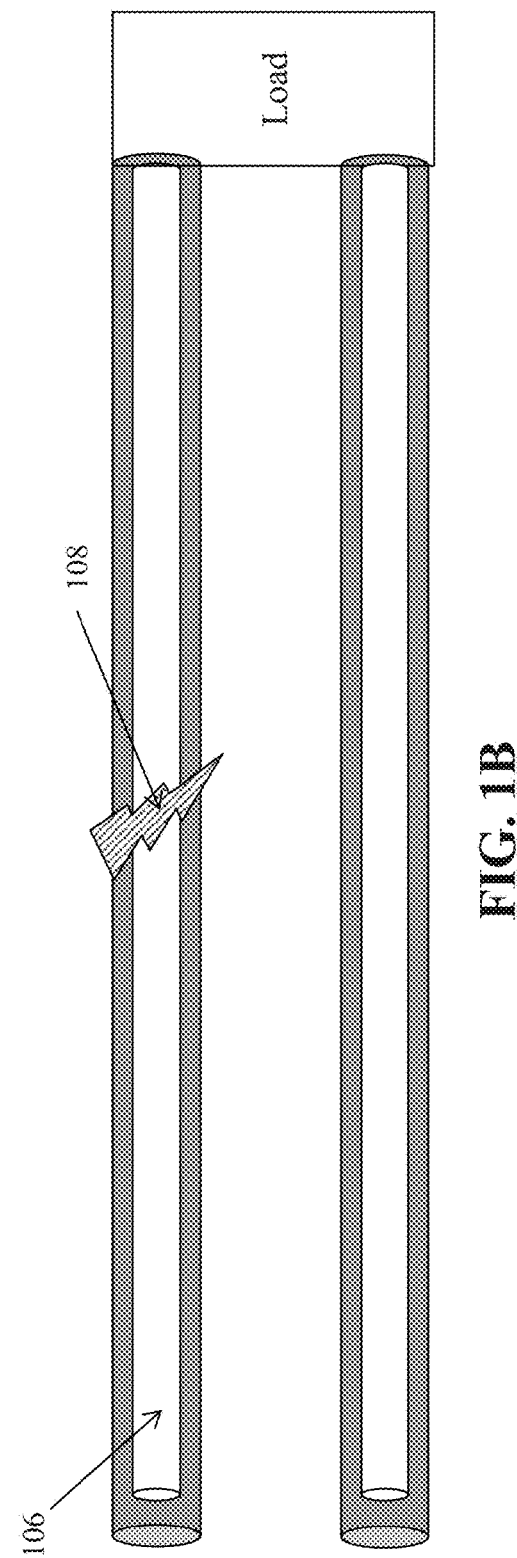
FIG. 1B is a diagram of a series arc fault.
Figure 1C:
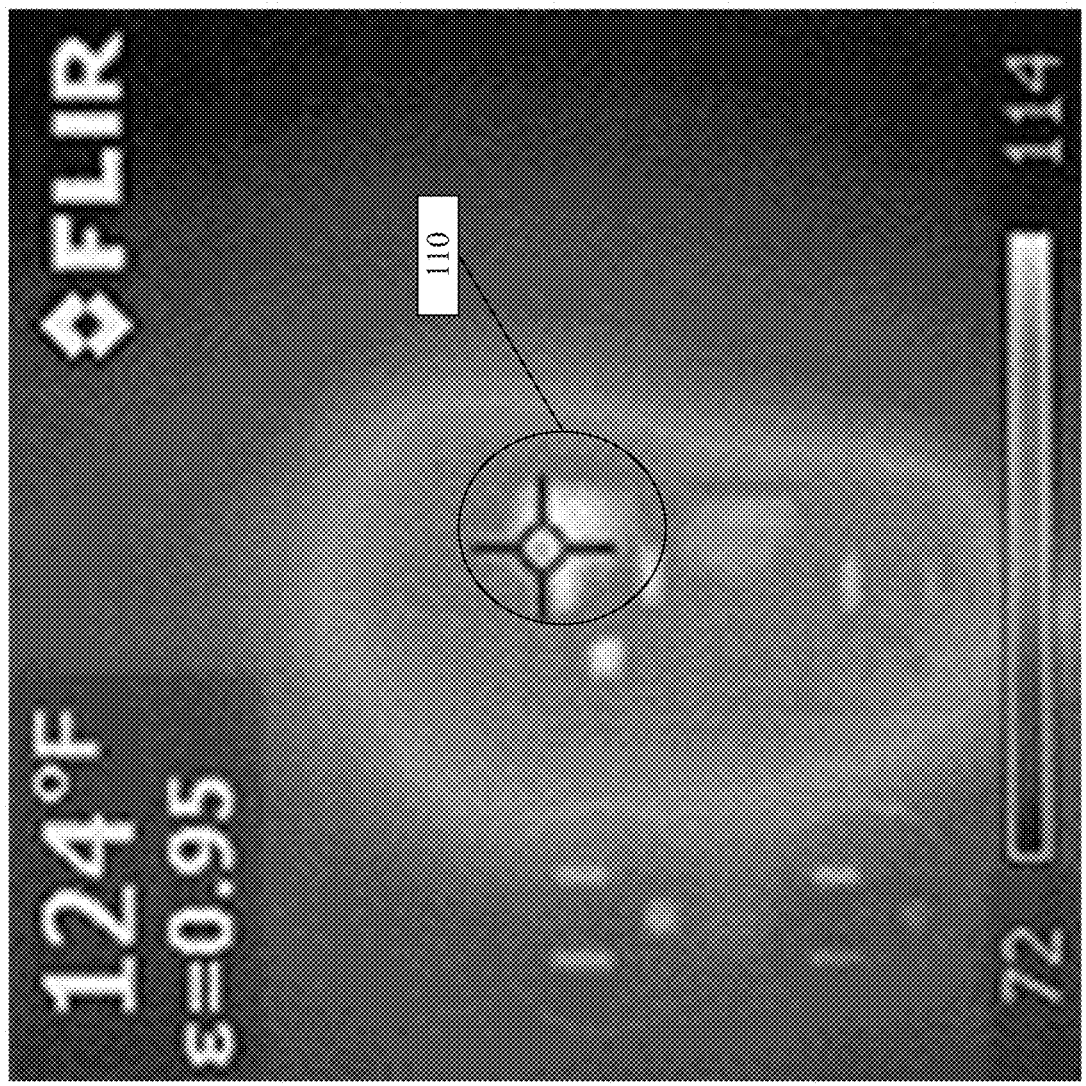
FIG. 1C is a diagram of a glowing connection.
Figure 2:
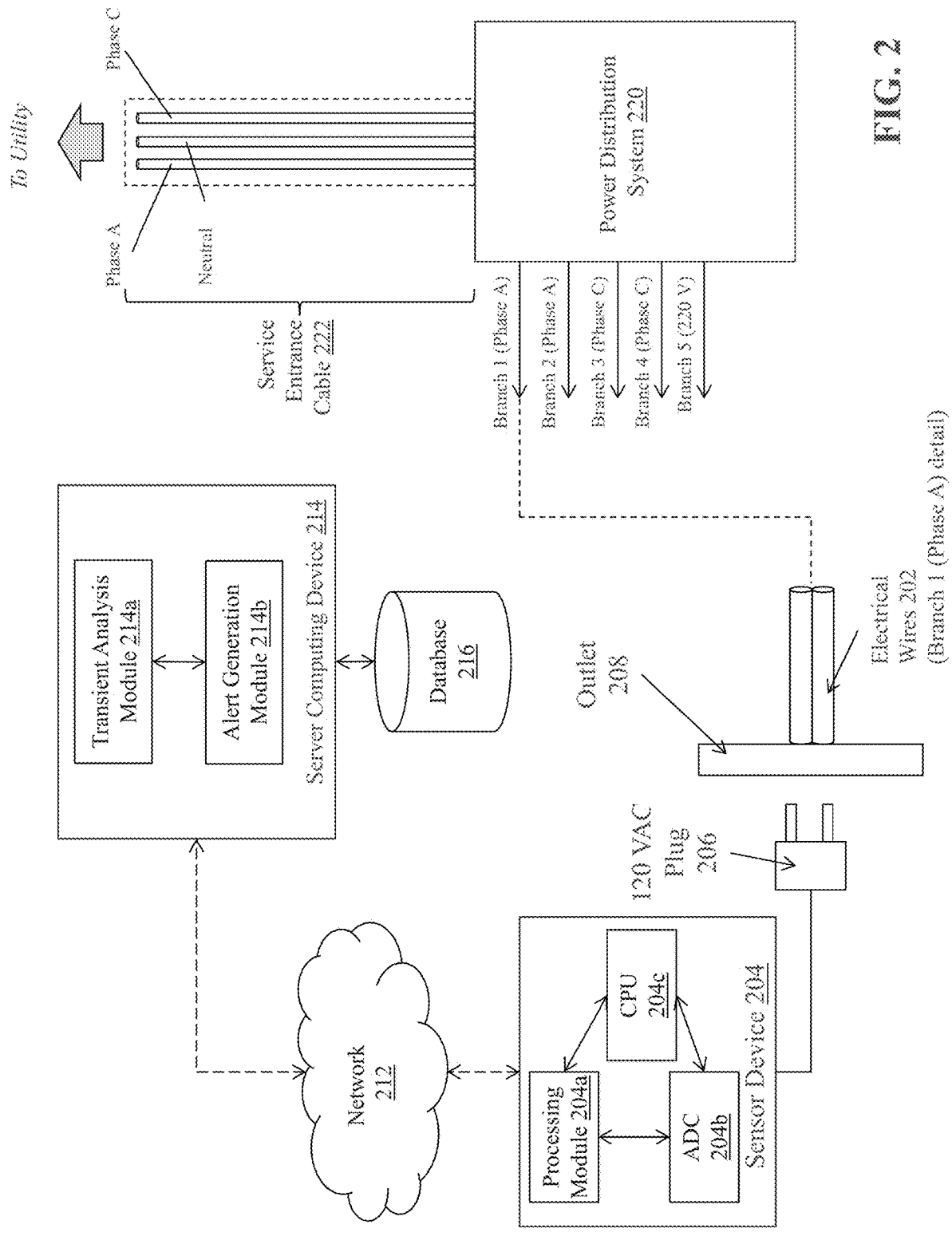
FIG. 2 is a block diagram of a system for detecting electrical discharges that precede electrical fires in electrical wiring.

FIG. 2 is a block diagram of a system 200 for detecting electrical discharges that precede electrical fires in electrical wiring. The system 200 includes electrical wires 202 that comprise a circuit in a power distribution system 220 (e.g., an electrical system in a residential or commercial building) that transfers power received from a service entrance cable 222 to branch circuits (such as the wires 202) which feed the power to appliances and outlets (e.g., outlet 208) in the building. Electrical discharges create a very fast impulse of current that travel throughout the electrical power distribution system via transmission line effects. The high frequency signal created by the electrical discharge travels through the home much like the high frequency signals use in power line communications.

Generally, the wires that provide power to circuits, outlets, devices, and appliances in buildings are the medium over which fire precursor signals travel from origin to sensor. Precursors are impulsive discharges and result in electromagnetic signals that travel along the power distribution wires in a building. Every location in the wiring (both fixed house wiring and mobile cords to devices and appliances) has a transfer function to every outlet in the house, and the precursor signals arrive at the sensor modified by this transfer function. The methods and systems described herein leverage methods similar to those developed in power line carrier communication techniques to measure and identify very broad frequency content which travels through a home's electrical network.

Figure 3:
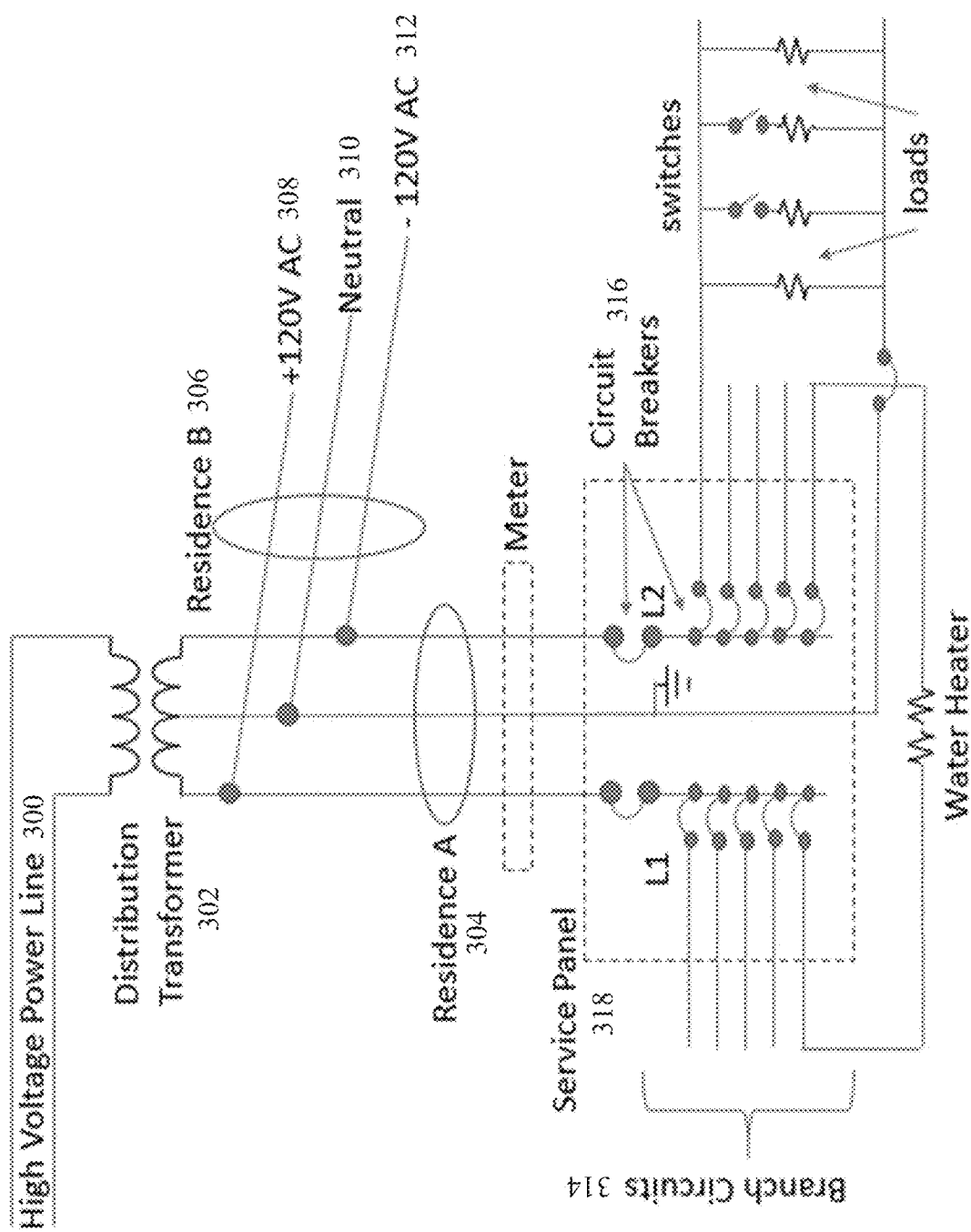
FIG. 3 is a diagram of an exemplary electrical transmission network.

FIG. 3 is a diagram of an exemplary electrical network servicing one or more residences. As shown in FIG. 3, electricity from a high voltage power line 300 passes through an electrical transformer 302 and is delivered to one or more residences (e.g., Residence A 304, Residence B 306) through a +120V AC line (L1) 308, a neutral line 310, and a −120V AC line (L2) 312. The lines L1 and L2 are coupled to a plurality of branch circuits 314 via circuit breakers 316 in a service panel 318 inside the residence. It should be appreciated that communication is possible from any circuit on L1 to any circuit on L2.

Communicating using power lines has been considered and used since the turn of the 20th century. In the last twenty years, various companies have released products that provide 100 Mbps to 1 Gbps local area network communication over in-building electrical distribution systems. This work resulted in the standardization of power line communication in IEEE 1901 and the widespread availability of "ethernet over powerline" adapters for consumer use, and broadband communication over in-building power lines is a mature technology.

There are two major issues associated with communicating over power lines (i.e., the channel): the transmission and attenuation characteristics of a transmitter and receiver on different circuits of the building and the channel noise environment. The powerline channel is challenging because there are many discontinuities due to branches (e.g., each outlet on a circuit) as well as loads with frequency and time dependent impedances (e.g., due to different device power draw, construction, and on vs. off characteristics). The devices that are responsible for the time variance are also responsible for both narrow and broad band noise injection due to switching power supplies and other non-linear equipment elements. Exemplary techniques relating to currently available powerline communication is described in C. Cano, A. Pittolo, D. Malone, L. Lampe, A. M. Tonello, A. G. Dabak, "State of the art in power line communications: From the applications to the medium," IEEE J. Sel. Areas Commun., vol. 34, pp. 1935-1952, July 2016 (available at https://arxiv.org/pdf/1602.09019.pdf), which is incorporated herein by reference.

Figure 4A:
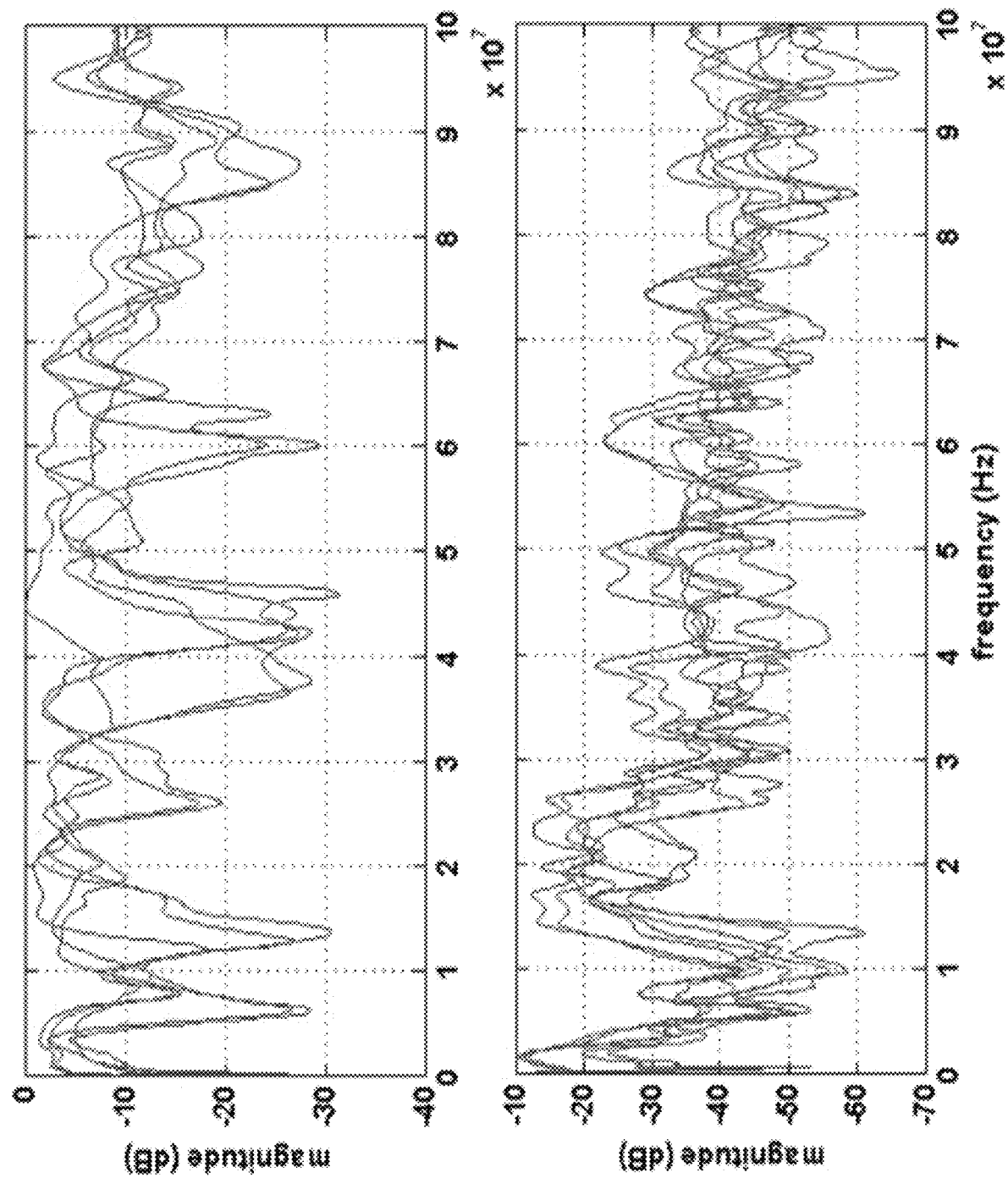
FIG. 4A is a diagram of field-collected measurements of an exemplary communication channel for indoor, residential power-line networks.

Power line channel transmission characteristics have been the subject of significant field measurement and modeling activities that culminated in the IEEE 1901 standard ratification in 2010 (as described in "IEEE Standard for Broadband Over Power Line Networks: Medium Access Control and Physical Layer Specifications, IEEE Standard 1901-2010," September 2010. FIG. 4A shows field-collected measurements of an exemplary communication channel for indoor, residential power-line networks. The top chart in FIG. 4A represents multiple pairs of transmitters and receivers on the same circuit, and the bottom chart in FIG. 4A shows multiple transmitter and receiver pairs where the units are on different circuits (described in M. Tlich, A. Zeddam, F. Moulin, F. Gauthier, "Indoor power-line communications channel characterization up to 100 MHz—Part I: One-parameter deterministic model," IEEE Trans. Power Del., vol. 23, no. 3, pp. 1392-1401, July 2008). Measurement results taken in Spain show similar characteristics confirming that changes in mains configuration and wiring style result in similar overall characteristics (see C. Cano, et al., supra). The more interesting and difficult case is the chart in FIG. 4B which shows the transfer characteristics for three different circuits and a comparison 20 m long cable measured in a lab setting (described in E. Liu, Y. Gao, O. Bilal, and T. Korhonen, "Broadband characterization of indoor powerline channel," Proc. Int. Symp. Power Line Commun., Zaragoza, Spain, 31 March-2 Apr. 2004).

Figure 4B:
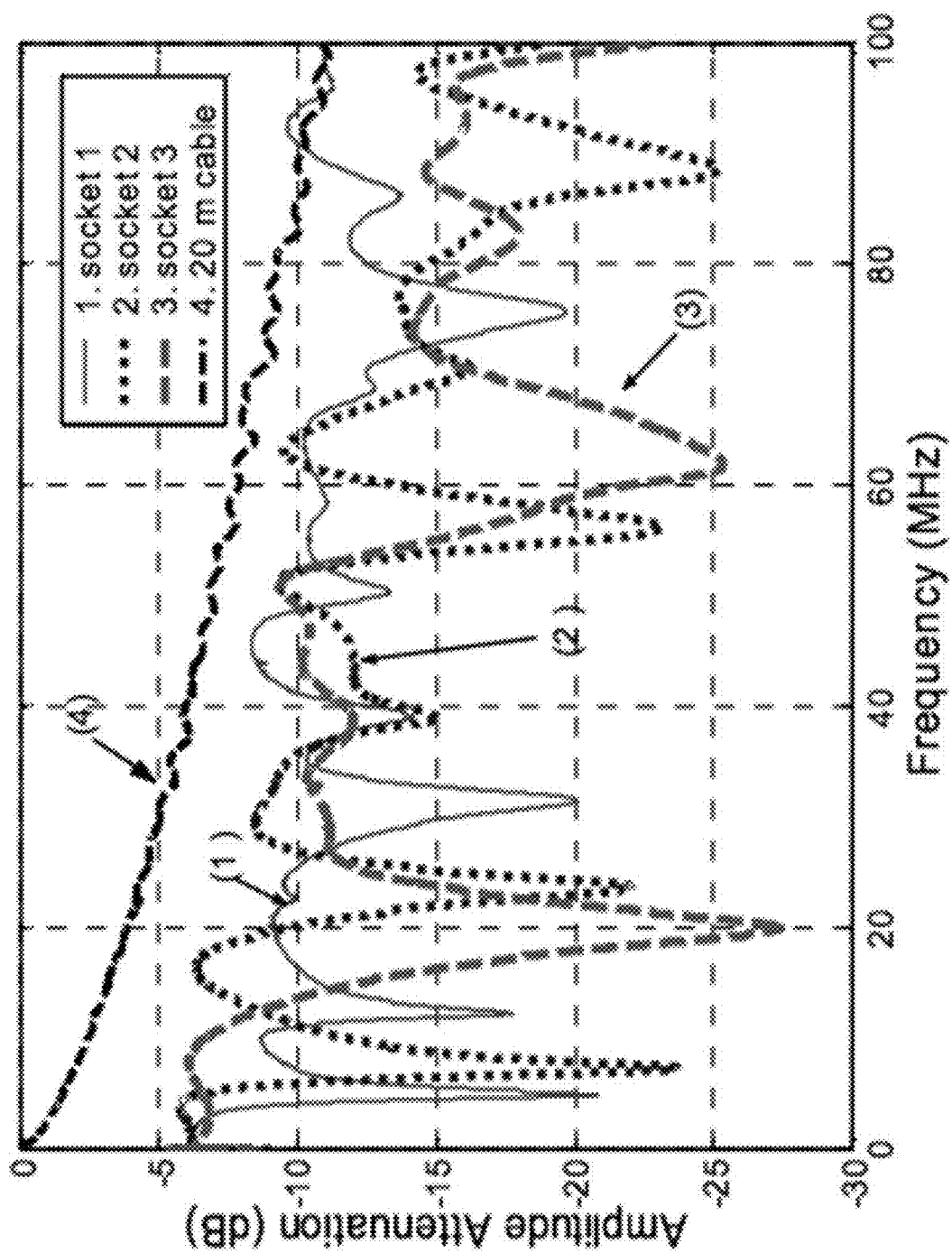
FIG. 4B is a diagram of transfer characteristics for three different circuits and a comparison 20 m long cable measured in a lab setting.

The charts of FIGS. 4A and 4B show variable frequency dependence for a particular channel but relatively flat attenuation on average. The sites used for gathering these data were varied in size from apartments to large homes and in age of construction. The channel characteristics are similar in many ways to stationary wireless communication channels. Wireless channels experience fading (i.e., frequency, position, and time dependent attenuation) due reflections of signals off objects in the environment (i.e., multipath induced fading). The same effect is at play here because discontinuities, mismatched impedances, and branches in the wiring result in signal reflections. In the time domain, these reflections manifest themselves as amplitude and time shifted copies of the original signal arriving at the receiver. In the frequency domain, the frequency components of these copies either constructively or destructively interfere causing peaks and notches in the transfer characteristic as observed in the charts.

Power line communication systems use the same techniques for signal encoding and noise resilience that are employed in broadband, wireless local area networks (e.g., IEEE 802.11n), chiefly orthogonal frequency division multiplexing (OFDM). OFDM is a good solution because it is a technique for spreading information across a wide band of the spectrum while also reducing the impact of signal dispersion and fading.

The power line environment is challenging for communication, but market success of Ethernet over power line products demonstrate that it is possible for broadband signals to traverse the complicated electrical network. Narrow band communication is very challenging due to extreme frequency selectivity that is dependent on individual, time varying channel conditions. Circuit to circuit signal attenuations are significant but are typically less than 50 dB making it possible for signals sourced almost anywhere in the electrical wiring to be detected at a receiver elsewhere in the house wiring (i.e., at an electrical socket).

Turning back to FIG. 2, the system 200 further includes a sensor device 204 coupled via a 120 VAC plug 206 to an electrical outlet 208 of the branch circuit wires 202. The sensor device comprises electronic components (e.g., processing module 204a, ADC 204b, CPU 204c) which couple the sensor device to the electrical infrastructure in a way that allows the electrical discharge signals to be amplified while in some embodiments, also filtering out unwanted 60 Hz signal and electrical noise generated by appliances running on the electrical system. The processing module 204a includes components such as capacitors, resistors, and amplifiers that sense electrical activity occurring on the electrical wires 202 of the branch circuit and capture the sensed electricity as waveform data. In some embodiments, the processing module 204a includes a filter that can limit a frequency response of the sensor device to a range in which electrical discharges have a high signal-to-noise ratio. The filtering can be implemented using hardware components or in firmware installed on the processing module 204a. It should be noted that the electrical activity occurring on electrical wires 202 of the branch circuit includes signals transmitted to and from the power distribution system 220. In this way, a single sensor is capable of seeing electrical discharge signals throughout the full electrical distribution system 220, including the other branch circuits. Although FIG. 2 depicts a single sensor device 204, it should be appreciated that the system 200 can comprise two or more sensor devices positioned to sense electrical activity in a power distribution system. Multiple sensors sending data to a server computing device can provide increased sensitivity and work together to provide information on the location of where electrical discharges are occurring.

In some embodiments, location can be determined using time-of-arrival techniques, where the time difference of arrival of a transient signal to each sensor device provides a relative distance to the location of the electrical discharges on the wire. Generally, the sensor device 204 is configured to see the shape of pulses. The pulse shapes the sensor device sees are the source pulse shape plus reflections of that shape from every branch, termination, or impedance change in the electrical system wiring. The time between reflections is the product of differences in distance divided by group velocity. The magnitude and polarity of reflections is determined by the complex impedance of the load or junction. The timing of various reflections tell the location of the source in the circuit; the shape changes of those reflections tell about the impedance of the loads and junctions that produced the reflections. For example, if two sensor devices are installed on the same circuit at different locations, time differences of arrival at the two devices can determine locations in the circuit—even for pulses whose reflections cannot be seen above the noise.

In one embodiment, the sensor device 204 can capture up to 27 million waveform samples per second and allocate the samples into 512 bins. The sensor device 204 determines a maximum amplitude in each of the bins and generates waveform data using the binned values. The sensor device 204 also performs functions to obtain derivative values of the waveform signals, in order to reduce the bandwidth and processing requirements of the sensor hardware. For example, the sensor device 204 can discard adjacent waveform samples to get the first derivative, and then repeat the process to get the second derivative. In one embodiment, the sensor device 204 adds several adjacent samples and subtracts several adjacent samples to obtain a wavelet that is then analyzed against previously-captured wavelets to determine whether any changes in the signal have occurred.

The sensor device 204 is communicably coupled to a server computing device 214 via a communication network 212. In one embodiment, the sensor device 204 is equipped with communication components (e.g., antenna, network interface circuitry) that enable the sensor device 204 to communicate with the server computing device 214 via a wireless connection.

The communication network 212 enables the other components of the system 200 to communicate with each other in order to perform the process of detecting electrical discharges in electrical wiring as described herein. The network 212 may be a local network, such as WiFi or a LAN, or a wide area network, such as the Internet and/or a cellular network. In some embodiments, the network 212 is comprised of several discrete networks and/or sub-networks (e.g., cellular to Internet) that enable the components of the system 200 to communicate with each other.

The server computing device 214 is a combination of hardware, including one or more special-purpose processors and one or more physical memory modules, and specialized software modules—such as transient analysis module 214a—that are executed by a processor of the server computing device 214, to receive data from other components of the system 200, transmit data to other components of the system 200, and perform functions for detecting electrical discharges in electrical wiring as described herein. In some embodiments, the module 214a is a specialized set of computer software instructions programmed onto a dedicated processor in the server computing device 214 and can include specifically-designated memory locations and/or registers for executing the specialized computer software instructions. Further explanation of the specific processing performed by the module 214a will be provided below. It should be appreciated that, in some embodiments, the sensor device 204 can be configured to operate as a standalone device, in that the processing described herein with respect to the server computing device 106 can be performed by the sensor device 204 (i.e., a processor and memory can be embedded in the sensor device that conducts the data collection, analysis, and alerting processes described herein).

The database 216 comprises transient and/or persistent memory for data storage that is used in conjunction with the process of detecting electrical discharges in electrical wiring as described herein. Generally, the database 216 is configured to receive, generate, and store specific segments of data for use by the server computing device 214. In some embodiments, all or a portion of the database 216 can be integrated within the server computing device 214, or be located on a separate computing device or devices. For example, the database 216 can comprise a database such as MySQL™ available from Oracle Corp. of Redwood City, Calif. In another example, the database 216 can comprise a cloud-based storage medium, such as Amazon Web Services (AWS)™, that uses DynamoDB™. In other embodiments, the database can be located in memory, e.g., on the server computing device 214 and/or sensor module 204.

Figure 5:
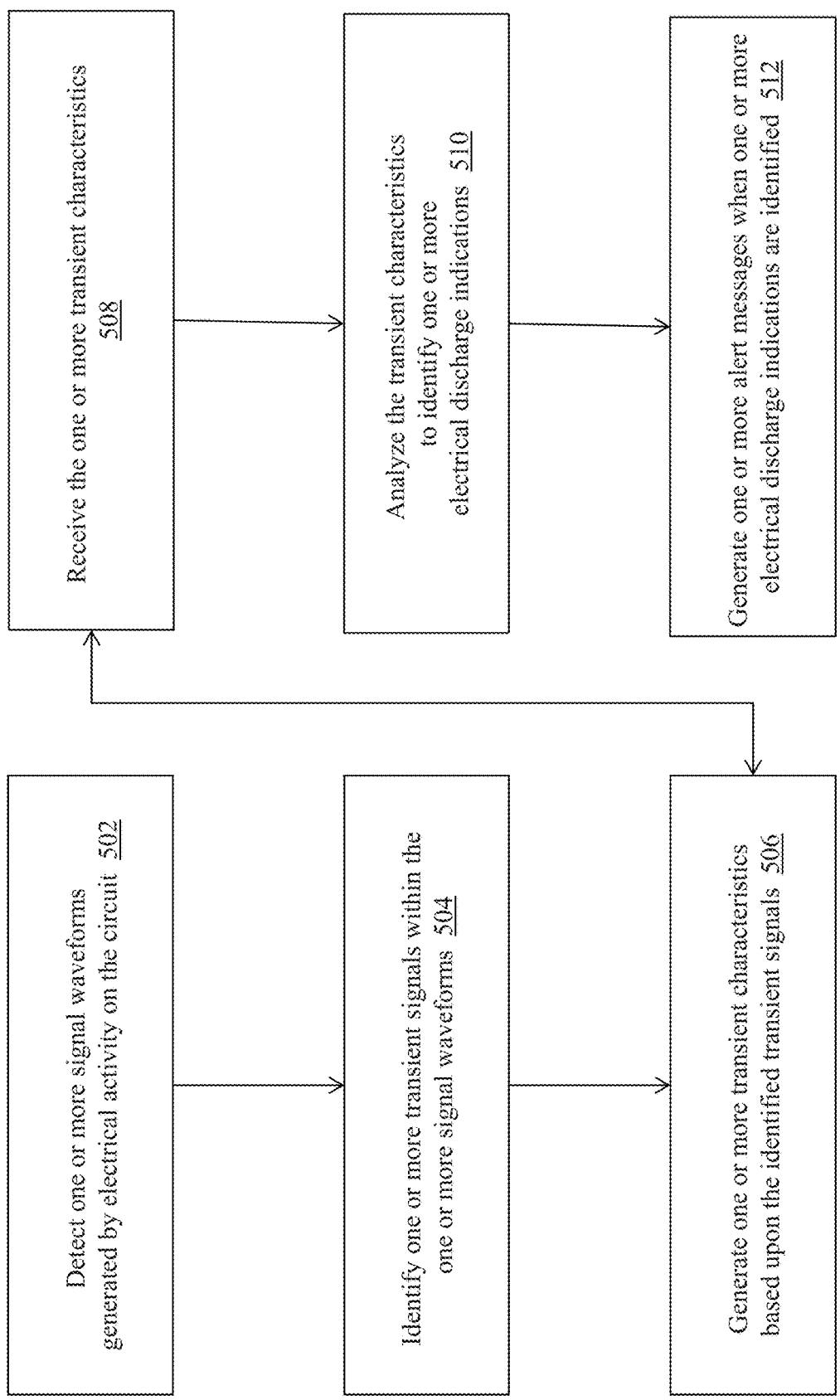
FIG. 5 is a flow diagram of a computerized method of detecting electrical discharges that precede electrical fires in electrical wiring.

FIG. 5 is a flow diagram of a computerized method 500 of detecting early-stage arc faults in electrical wiring, using the system 200 of FIG. 2. One or more sensor devices (e.g., sensor device 204) coupled to a branch circuit (e.g., Branch 1 circuit comprising wires 202) detect (502) one or more signal waveforms generated by electrical activity on the branch circuit. For example, because an electrical discharge is an impulse change in current, the signal generated by the electrical discharge transmits down the electrical wires 202 reflecting around any junction. These signals have a delay in returning, which is typically based upon the length of the wire. The signals also exhibit a phase shift, which enables the system 200 to identify transient signals in the waveform which represent activity that relates to an electrical discharge (even a very small electrical discharge) on the electrical wires 202 as described herein.

The sensor device 204 identifies (504) one or more transient signals within the one or more signal waveforms that are detected. The sensor device 204 generates (506) transient characteristics based upon the identified transient signals and transmits the transient characteristics to server computing device 214. The transient analysis module 214a receives (508) the sets of transient characteristics from each sensor device 204, and analyzes (510) the transient characteristics to identify one or more electrical discharge indications. The alert generation module 214b generates (512) one or more alert signals when one or more electrical discharge indications are identified.

It should be appreciated that, in some embodiments, the sensor device 204 can detect the one or more signal waveforms (step 502) and transmit the one or more signal waveforms to the transient analysis module 214a for further processing, including identifying transient signals (step 504), generating transient characteristics (step 506), analyzing the transient characteristics (step 510), and generating alert signals (step 512). It should further be appreciated that, in some embodiments, the sensor device 204 can perform all of the steps of FIG. 5 internally. In some embodiments, the sensor device 204 compresses the one or more signal waveforms prior to transmitting the signal waveforms to the transient analysis module 214a—in order to conserve network bandwidth, improve processing capacity and performance, and the like.

In some embodiments, the alert generation module 214b transmits the one or more alert signals to a remote computing device (e.g., a mobile phone, tablet, smart watch, and the like). The remote computing device can, e.g., display a message or indicator (such as a warning icon) on a screen associated with the remote computing device based upon receipt of the one or more alert signals. For example, the alert signal can comprise a packet-based message including a corpus of text that indicates a dangerous condition or hazard as detected by the system 200. In some embodiments, the alert generation module 214b transmits the one or more alert signals to one or more of the sensor devices 204. The sensor devices 204 can activate one or more components (e.g., embedded components in the sensor device) upon receipt of the one or more alert signals. For example, upon receiving an alert signal from the alert generation module 214b, the sensor device(s) 204 can activate an LED element that lights up and/or flashes on the exterior of the sensor device 204 to indicate that a dangerous condition or hazard has been detected by the system 200. Additional detail about the steps of FIG. 5 is provided below with respect to FIGS. 6A to 6C.

Figure 6A:
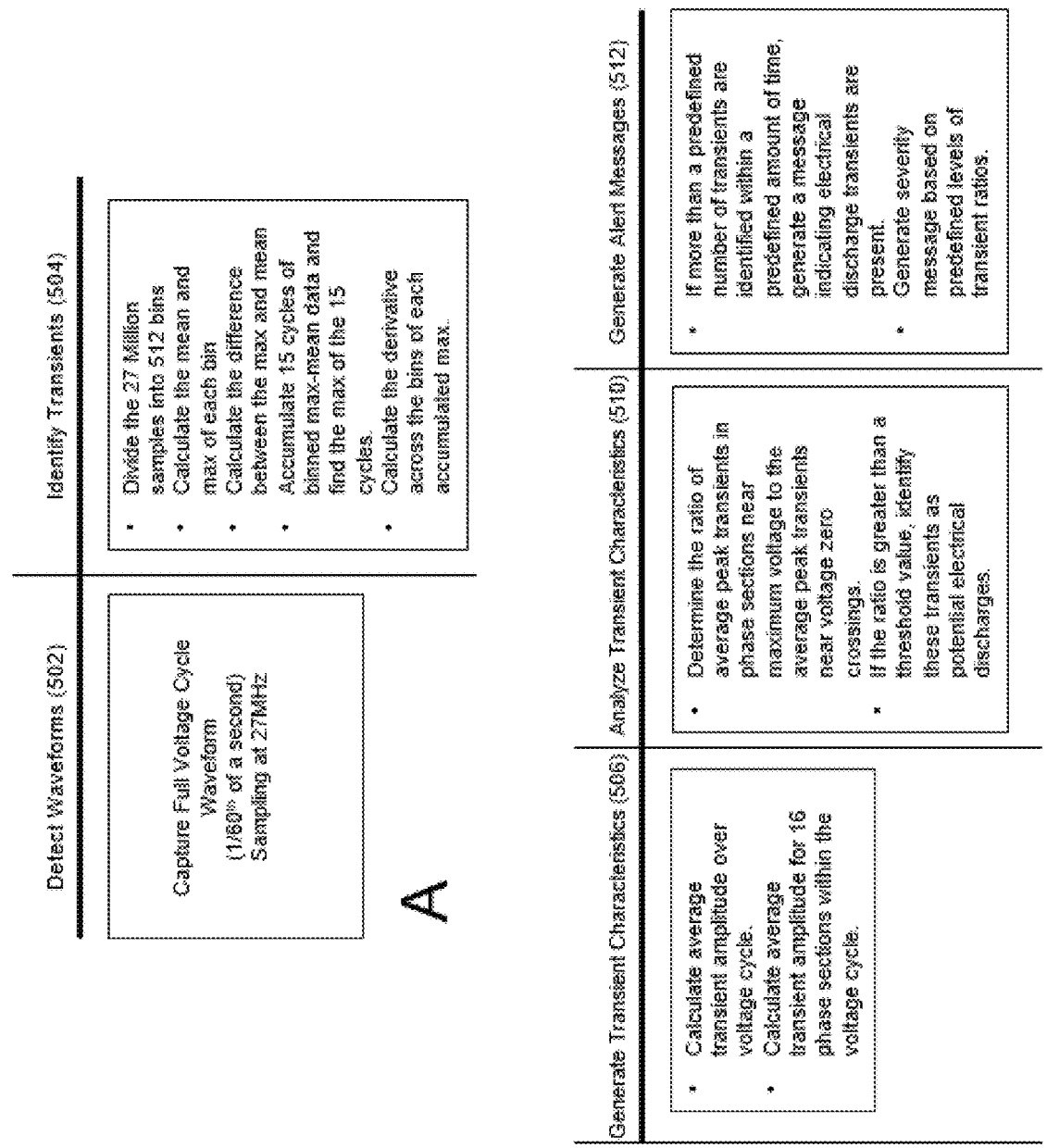
FIG. 6A is a detailed flow diagram of a computerized method of detecting electrical discharges that precede electrical fires in electrical wiring.
Figure 6B:
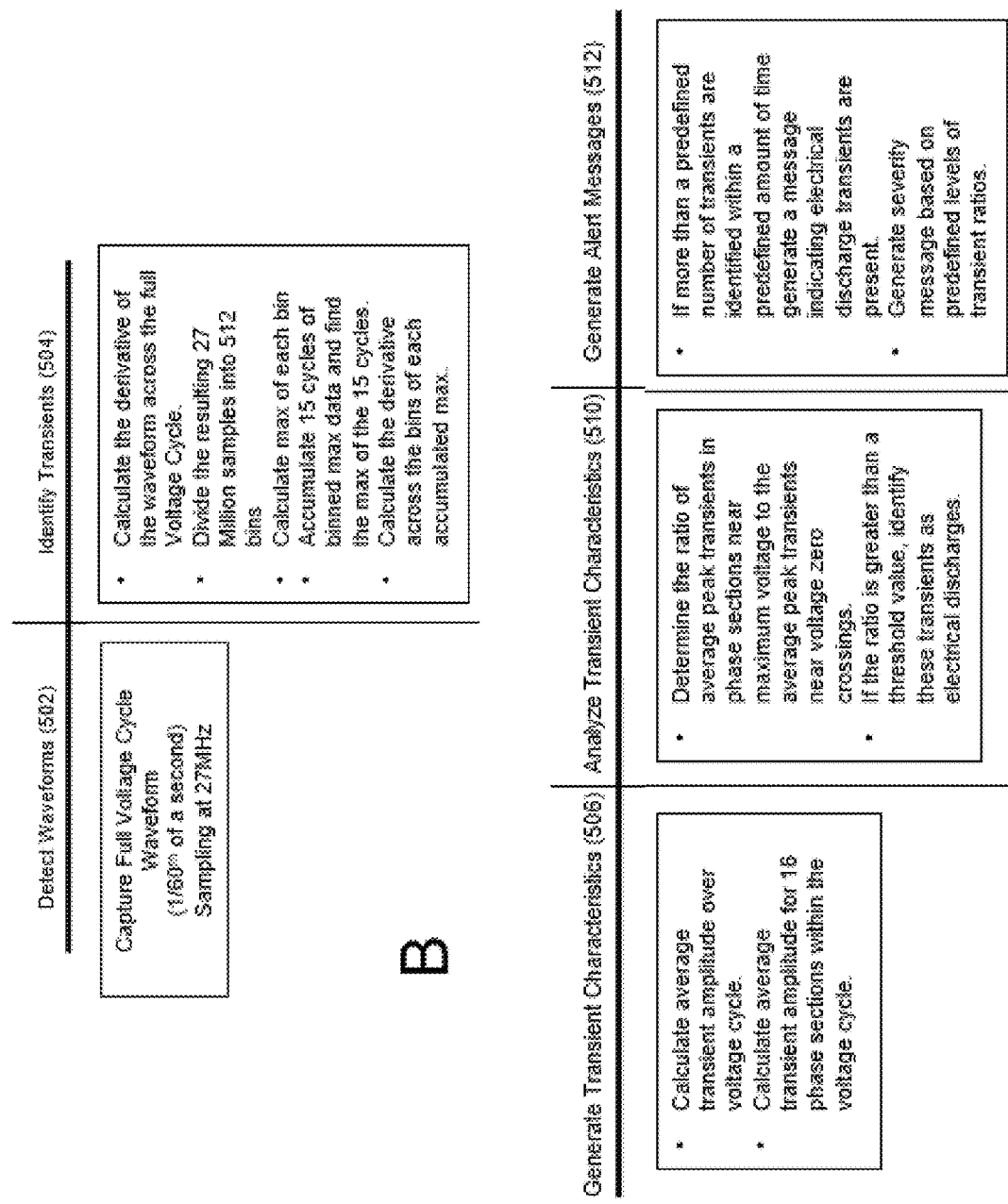
FIG. 6B is a detailed flow diagram of a computerized method of detecting electrical discharges that precede electrical fires in electrical wiring.
Figure 6C:
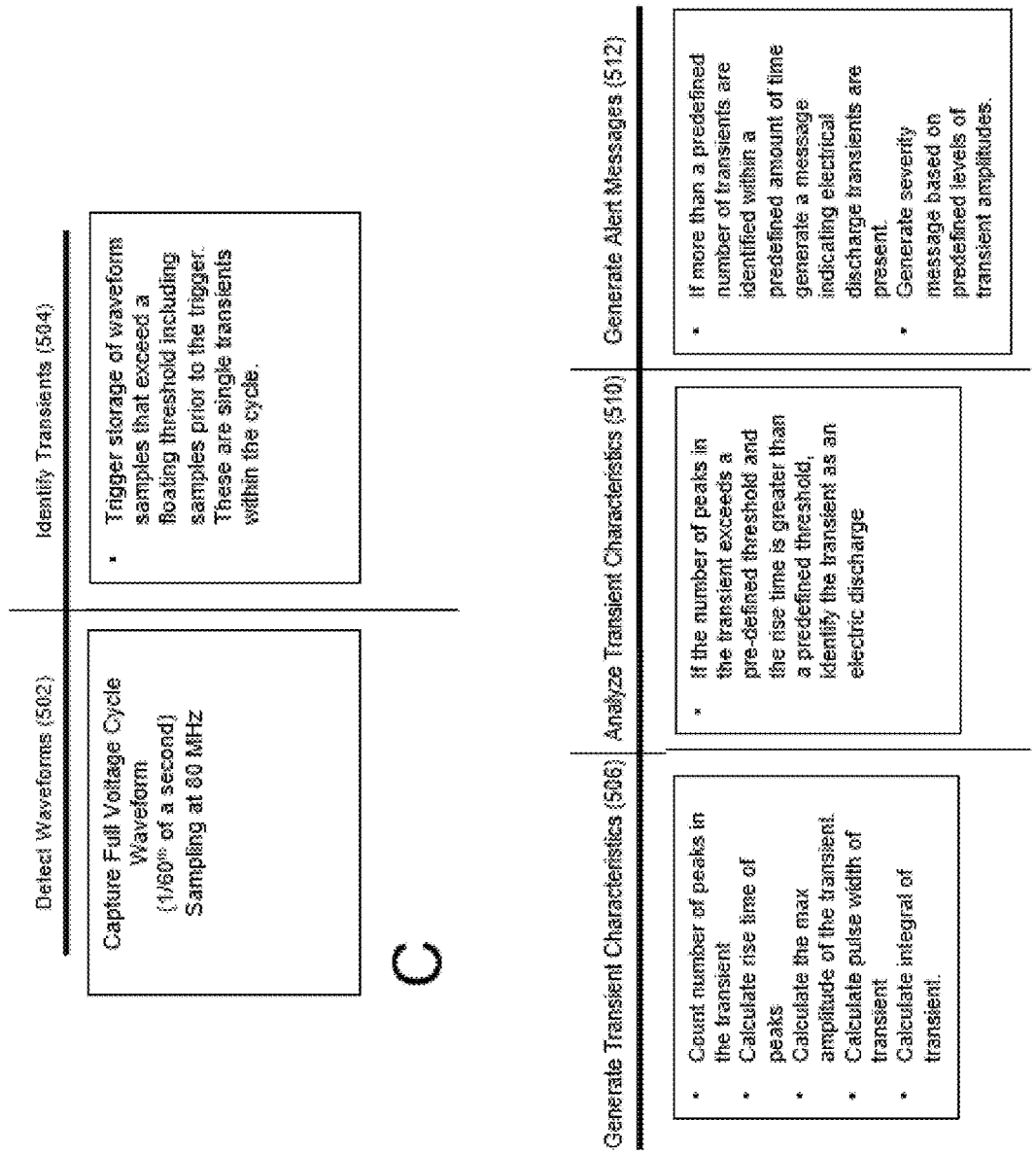
FIG. 6C is a detailed flow diagram of a computerized method of detecting electrical discharges that precede electrical fires in electrical wiring.

FIGS. 6A to 6C comprise a detailed flow diagram of computerized methods of detecting electrical discharges that precede electrical fires in electrical wiring, using the system 200 of FIG. 2 and according to the framework described above with respect to FIG. 5. FIGS. 6A to 6C include three different methods that may be used by the system 200 to detect electrical discharges—Method A (FIG. 6A), Method B (FIG. 6B), and Method C (FIG. 6C). It should be appreciated that these methods are exemplary, and other methods may be contemplated for use with the system described herein. Also, it should be appreciated that the Methods A, B, and C may be used independently or in conjunction with each other. In one embodiment, the sensor device 204 may include multiple logical and/or physical processors (e.g., CPU 204c) that each processes the waveform data according to one of the Methods A, B, or C.

For example, in Methods A and B, the high-speed analog-to-digital converter (ADC) 204b of sensor device 204 detects waveforms (502) by capturing a full voltage cycle waveform ($\frac{1}{60}^{th}$ of a second), sampling at 27 MHz—while in Method C, the ADC 204b captures a full voltage cycle waveform ($\frac{1}{60}^{th}$ of a second), sampling at 80 MHz upon detecting that the waveform has reached or exceeded a threshold (so as to conserve bandwidth and memory resources).

The CPU 204c of sensor device 204 can identify transients (504) in the waveform data in several different ways. For example, in Method A, the CPU 204c performs a binning process on the sampled waveform data by dividing the 27 million samples into 512 bins. The CPU 204c calculates the difference between the maximum and the minimum of each bin and calculates the difference between the maximum and the mean of each bin. Next, the CPU 204c accumulates 15 cycles of binned maximum-mean data and determines the maximum of the 15 cycles. Then, the CPU 204c calculates the derivative across the bins of each accumulated maximum.

In Method B, the CPU 204c calculates the derivative of the waveform across the full voltage cycle. The CPU 204c divides the resulting 27 million samples into 512 bins and calculates the maximum of each bin. Next, the CPU 204c accumulates 15 cycles of binned maximum data and determines the maximum of the 15 cycles. Then, the CPU 204c calculates the derivative across the bins of each accumulated maximum.

In Method C, the CPU 204c triggers storage of waveform samples that exceed a floating threshold including samples prior to the trigger—these are single transients within the cycle.

Continuing with FIGS. 6A to 6C, the CPU 204c of sensor device 204 can generate transient characteristics (506) in different ways. For example, in Methods A and B, the CPU 204c calculates the average transient amplitude over the full voltage cycle, and calculates the average transient amplitude for 16 phase sections within the voltage cycle. In Method C, the CPU 204c counts the number of peaks in the transient, calculates the rise time of the peaks, calculates the maximum amplitude of the transient, calculates the pulse width of the transient, and calculates the integral of the transient.

When the sensor device 204 determines that a change has occurred in the voltage waveform data based upon the binning process described above, the sensor device 204 transmits the transient characteristic data to the server computing device 214 via network 212. The transient analysis module 214a receives (504) the transient characteristic data from the sensor device 204 and analyzes (506) the waveform data to identify one or more electrical discharge indications in the signal waveform. In one example, the signal analysis module 214a reconstructs the signal waveform using the received data and compares the distribution of transients (including where the transients occur in phase) to an expected distribution of transients. For example, the signal analysis module 214a can determine where the transients occur in phase as well as how repeatable the transients are—e.g., do the transients exhibit a regular pattern in the waveform (which may indicate operation of a device or appliance on the circuit) or do the transients exhibit an irregular pattern (which may indicate electrical discharge and/or arc fault activity).

In some embodiments, the CPU 204c of sensor device 204 transmits the determined transient characteristics to the transient analysis module 214a of server computing device 214, and the module 214a receives the transient characteristics. It should be appreciated that, in some embodiments, the sensor device 204 can be configured as a standalone module that does not require a connection to a server computing device 214—in these embodiments, the sensor device 204 can also perform the steps of analyzing the transient characteristics (510) and generating alert signals (512), and further in some embodiments, the step of transmitting alert signals to a remote computing device (as described previously). In some embodiments, the alert signals can be generated locally within the sensor device 204 and used to trigger other components of the sensor device 204—such as a speaker or other audio component embedded in the sensor device 204, or a light or other visual component (e.g., LED) embedded in the sensor device 204—to alert nearby persons that potentially dangerous electrical activity is occurring.

The transient analysis module 214a can analyze the transient characteristics (510) received from the sensor device 204 in different ways. For example, in Methods A and B, the module 214a determines the ratio of average peak transients in phase sections near maximum voltage to the average peak transients near voltage zero crossings. If the ratio is greater than a threshold value, the module 214a identifies these transients as potential electrical discharges. In Method C, the module 214a evaluates whether the number of peaks in the transient exceeds a predefined threshold and whether the rise time is greater than a predefined threshold. If so, the module 214a identifies the transient as a potential electrical discharge.

Figure 7A:
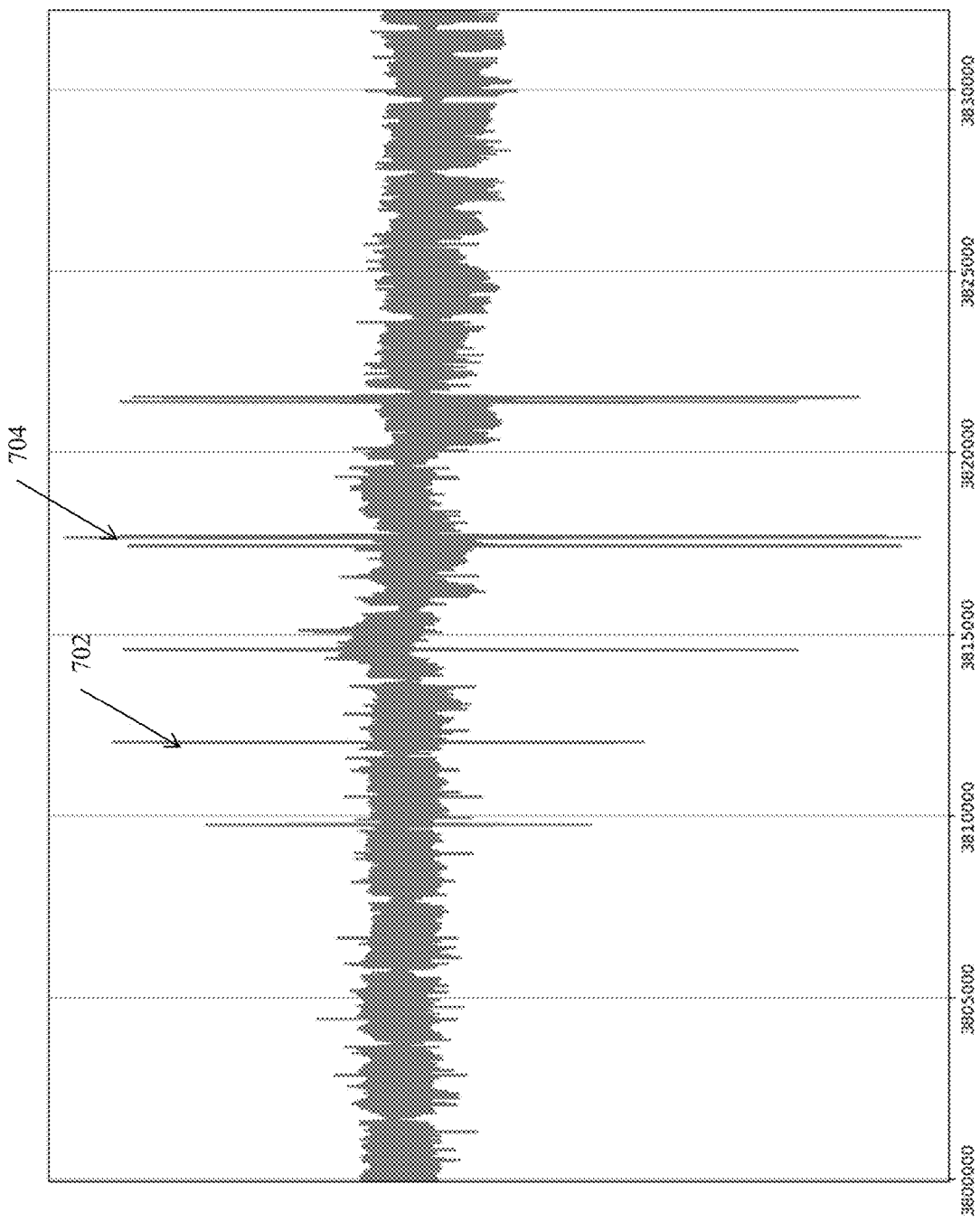
FIGS. 7A-7C are diagrams of exemplary waveform data generated by the sensor device that depict transients indicative of electrical discharge activity.

FIGS. 7A-7C and 8A-8C are diagrams of waveform data captured by CPU 204c of the sensor device 204 that depict transient signals. FIG. 7A is an exemplary diagram of a waveform for two milliseconds of sampled voltage data, captured at 16 million samples per second. As shown in FIG. 7A, most of the waveform data is general electrical background noise generated by items such as appliances and electromagnetic signals in the air. However, the waveform data also exhibits several larger spikes (e.g., 702, 704)—which are transients that may indicate electrical discharge activity in the electrical circuit.

Figure 7B:
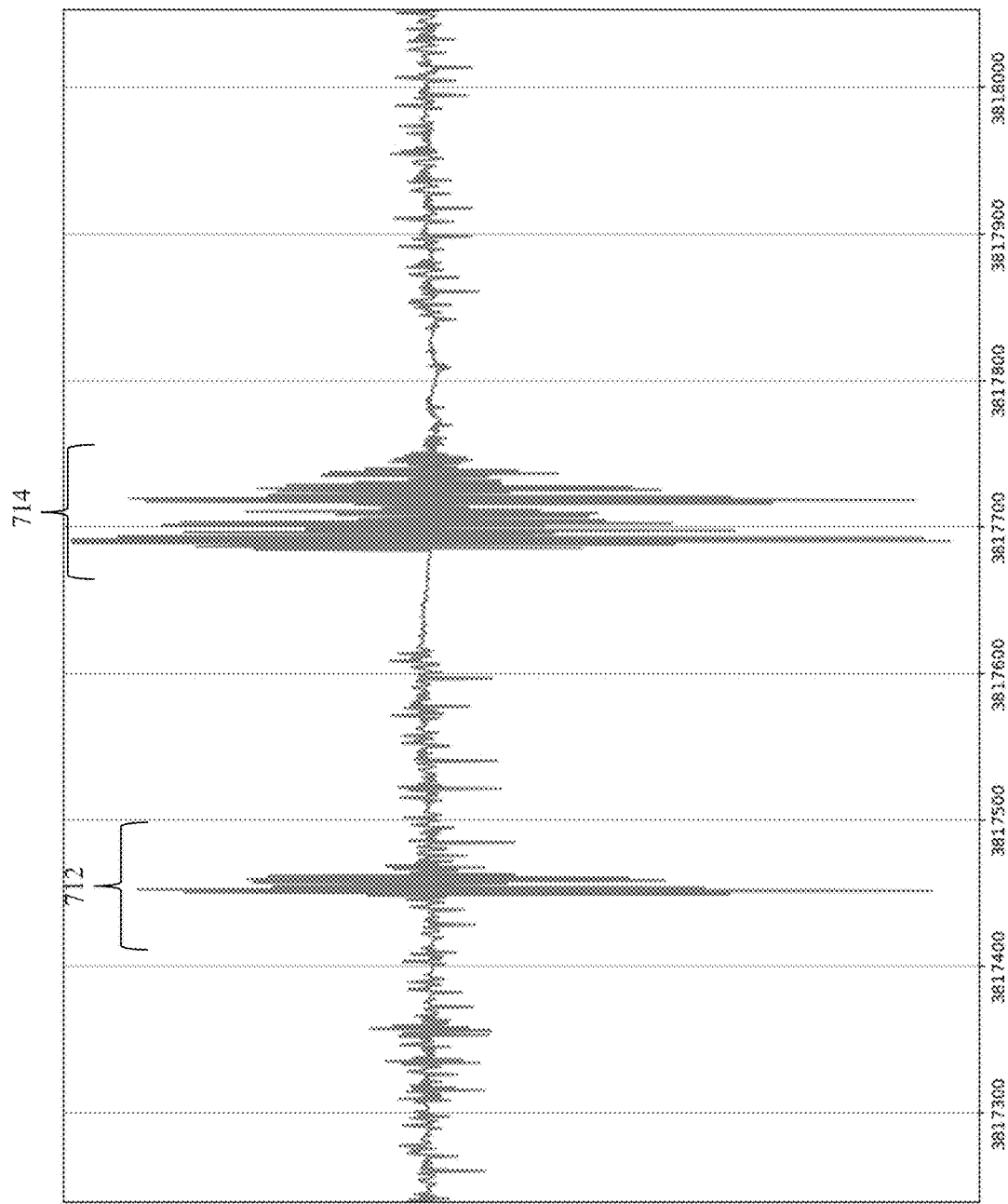
Figure 7C:
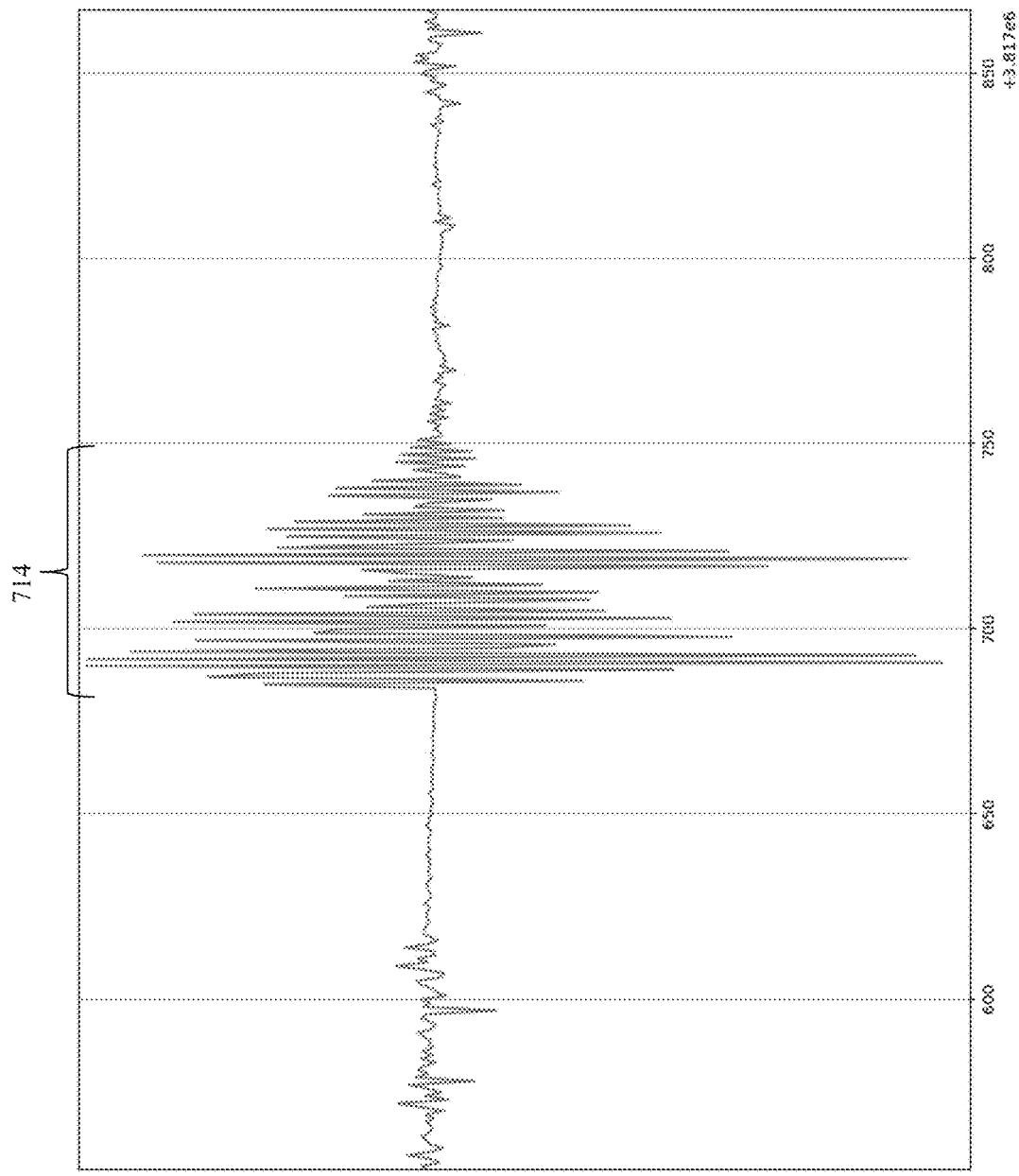

FIG. 7B is an exemplary diagram that shows a portion of the waveform from FIG. 7A, enlarged to show additional detail. As seen in FIG. 7B, the shape of the individual transients (e.g., 712, 714) appears. Taking an even closer look, FIG. 7C is an exemplary diagram that shows a portion of the waveform (i.e., two μs) from FIG. 7B, enlarged to show additional detail. As shown in FIG. 7C, the transient 514 exhibits a ring-down structure, which indicates the amount of time it takes for attenuation of the signal. In addition, the transient 714 has very fast changes in voltage and a fast rise time. As explained above for Method C, the CPU 204c of sensor device 204 can use this type of sampled waveform data to generate transient characteristics (506) for transmission to the transient analysis module 214a.

Figure 8A:
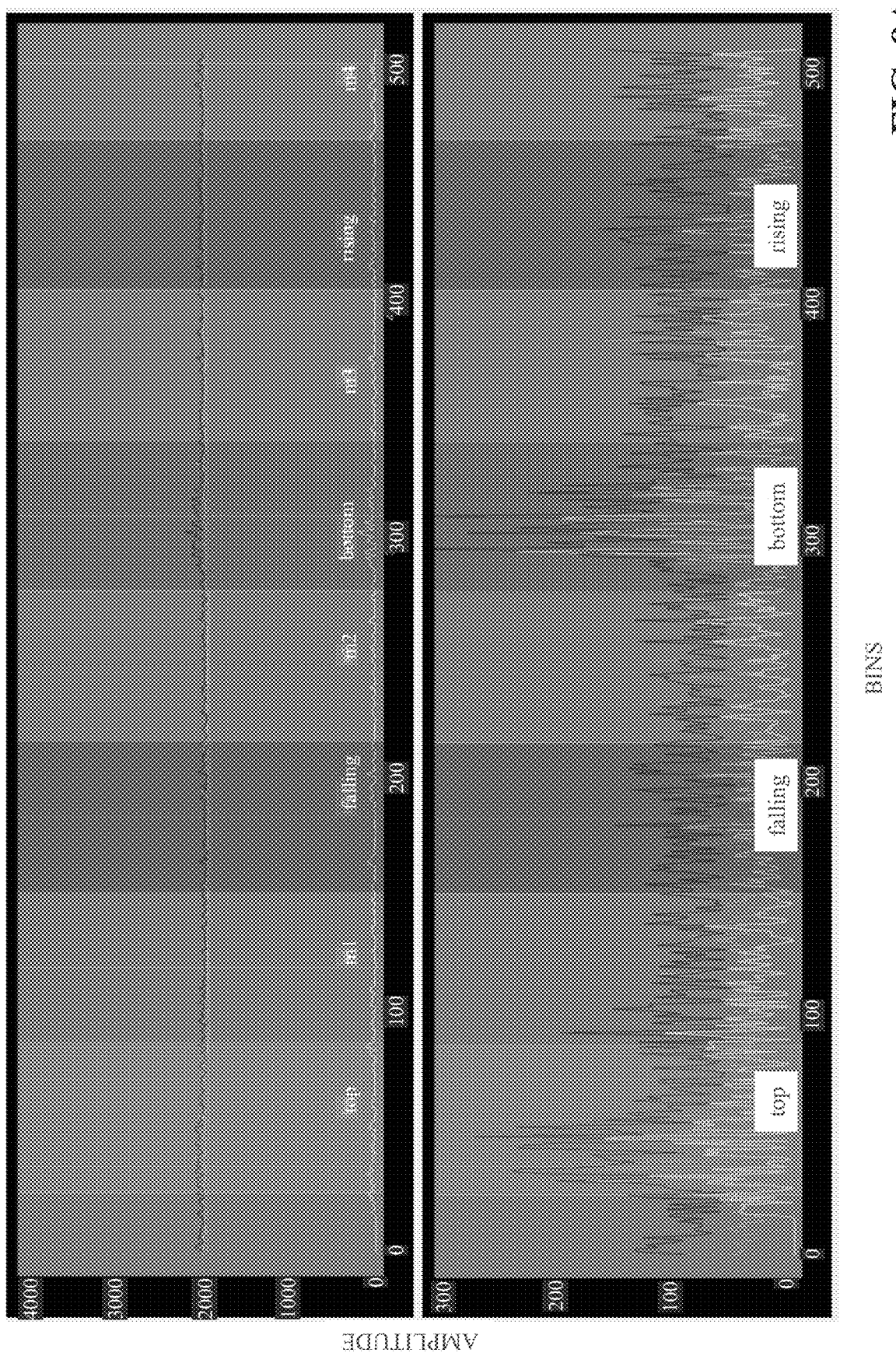
FIGS. 8A-8C are diagrams of exemplary waveform data generated by the sensor device for identifying transient characteristics.
Figure 8B:
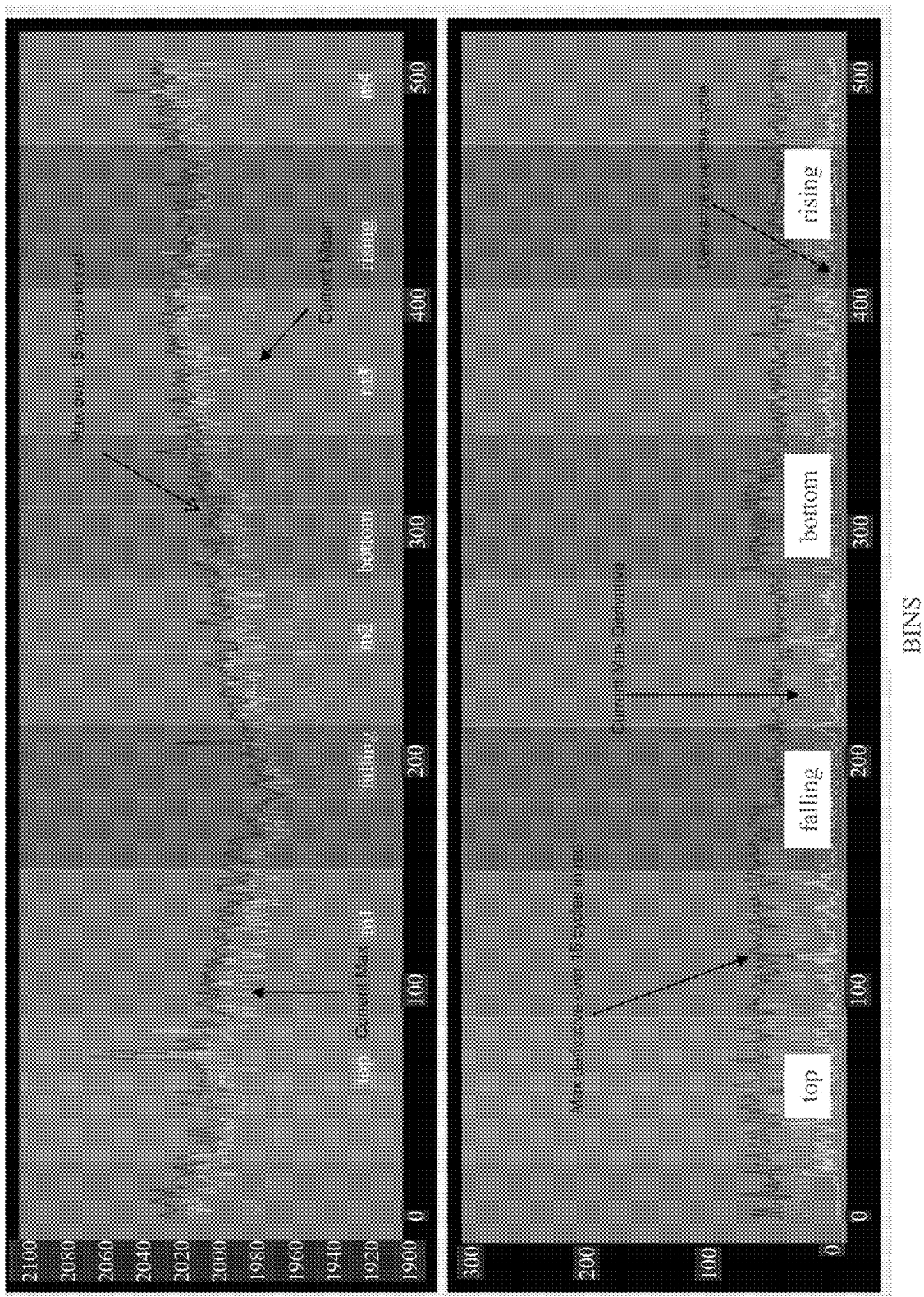
Figure 8C:
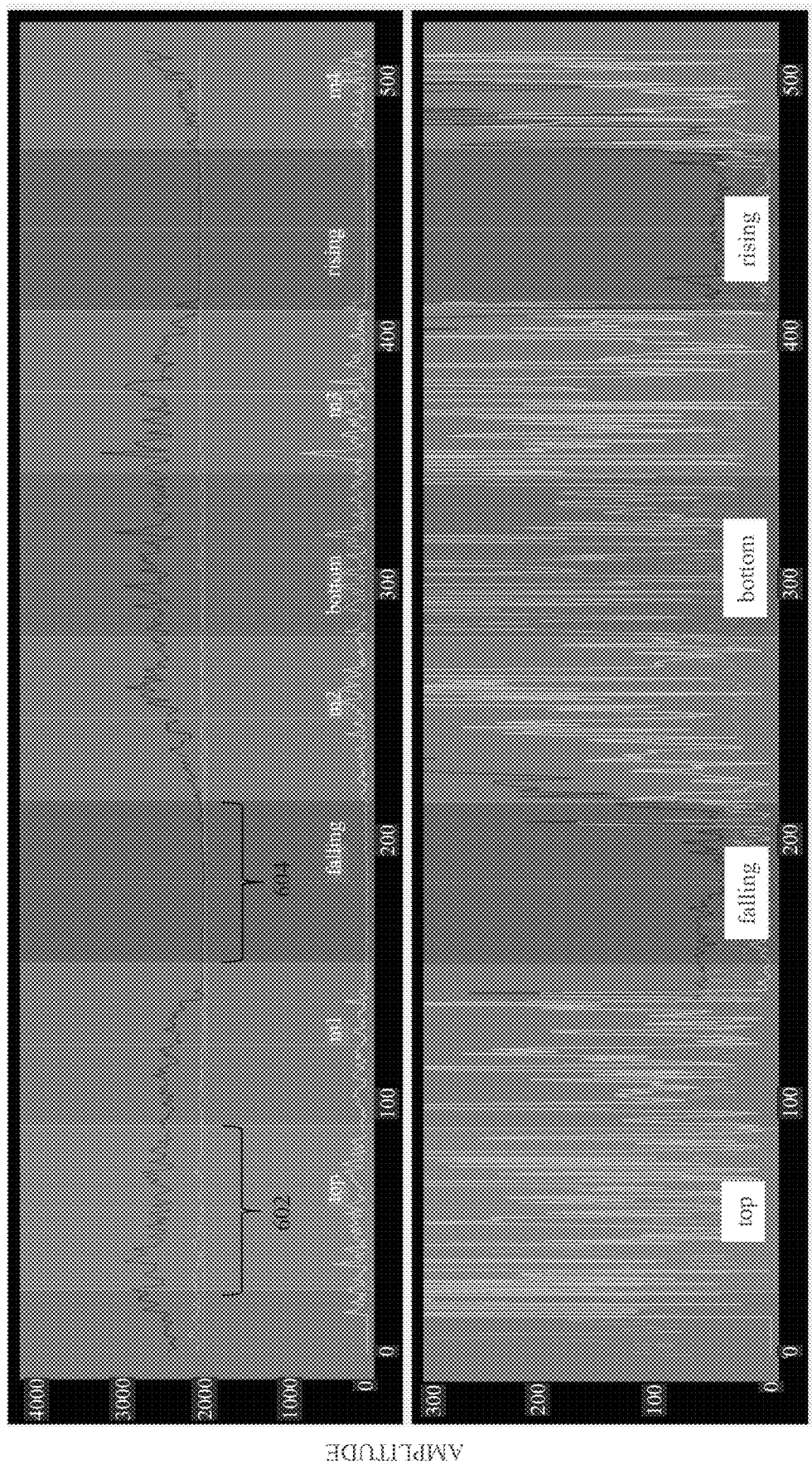
Figure 9:
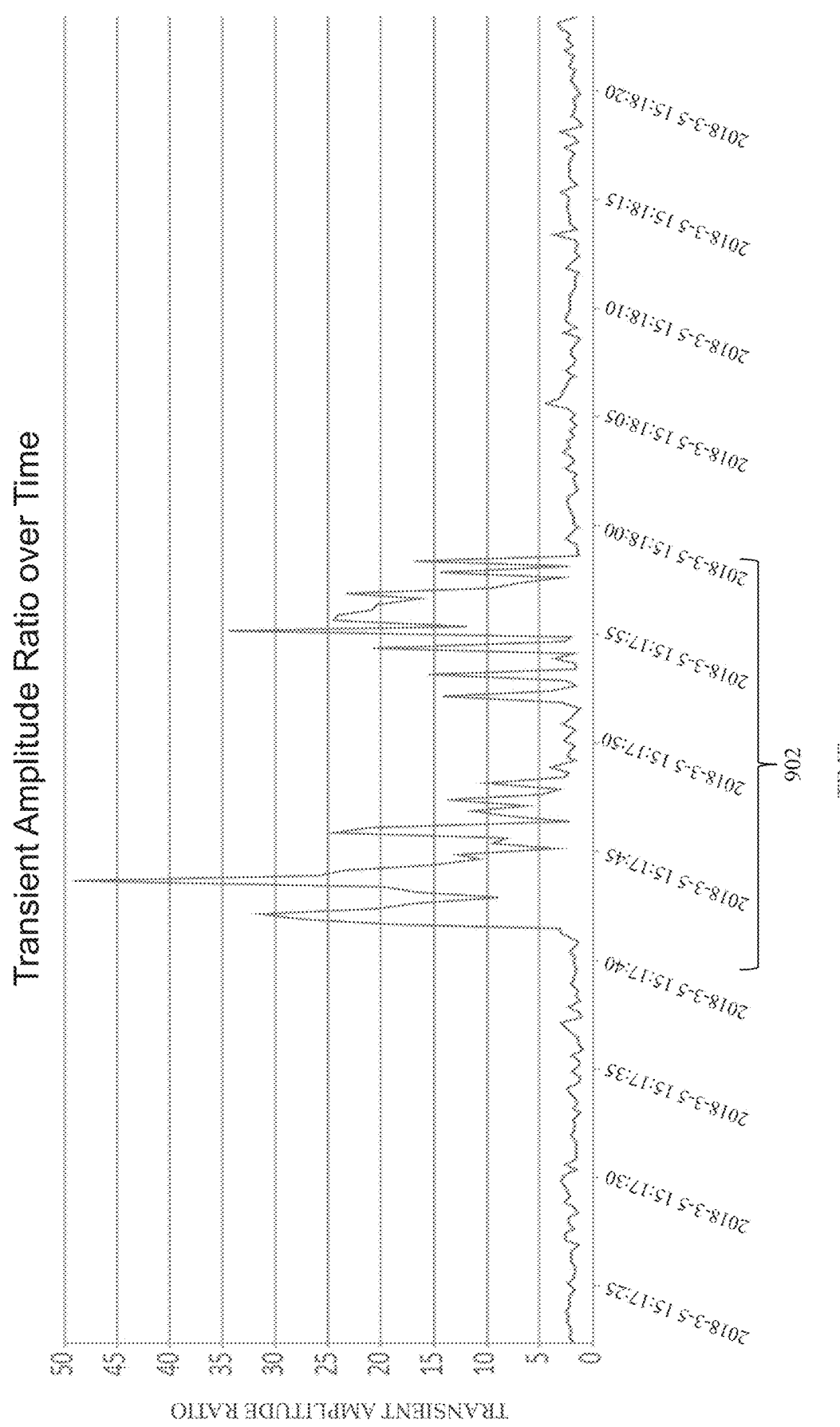
FIG. 9 is a diagram of a transient amplitude ratio over time.

FIGS. 8A-8C are exemplary diagrams that show how the CPU 204c of sensor device 204 can divide the sampled waveform signal into 512 bins (i.e., as described above with respect to Methods A and B). An exemplary full voltage cycle waveform is shown in FIG. 8A, with the bin number assigned across the x-axis and the amplitude represented on the y-axis. FIG. 8B is another exemplary voltage cycle waveform, with annotations showing how the CPU 204c of sensor device can identify transients as described above with respect to Methods A and B. As shown in FIG. 8B, the CPU 204c can determine the current max, the current mean, and the max over 15 cycles—as well as the max derivative over 15 cycles, the current max derivative, and the derivative over the full voltage cycle. FIG. 8C is an exemplary voltage cycle waveform, with an annotation depicting a potential electrical discharge identified by the transient analysis module 214a. As described above with respect to Methods A and B, the transient analysis module 214a can determine the ratio of average peak transients in phase sections near maximum voltage (e.g., section 802) to the average peak transients near voltage zero crossings (e.g., section 804). The transient analysis module 214a can generate a representation of the ratio (see FIG. 9). As shown in FIG. 9, the time period from 15:17:40 to 15:18:00 (indicated by 902) is when electrical discharges were being created on the electrical wiring.

Figure 10:
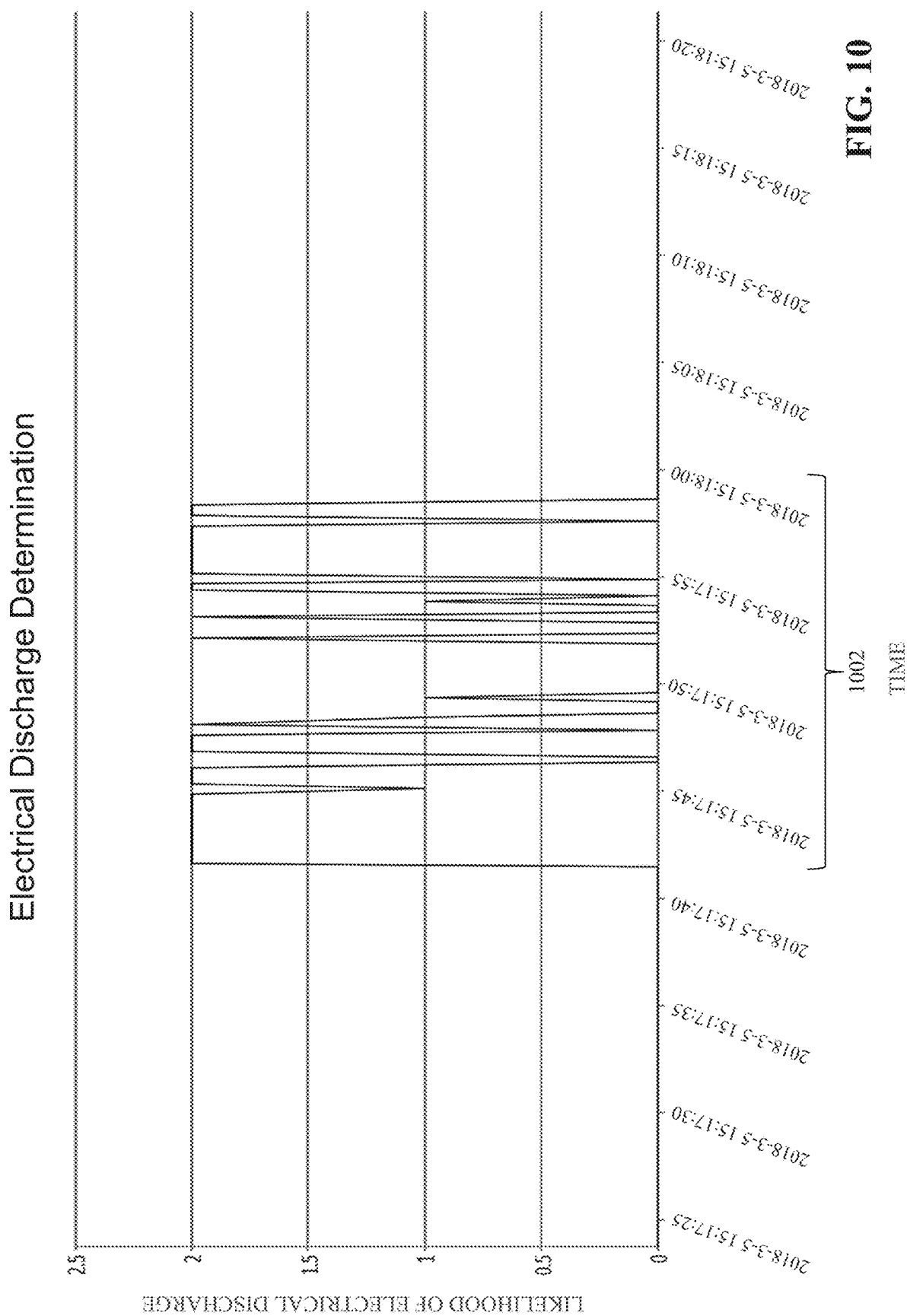
FIG. 10 is a diagram of a likelihood of electrical discharge activity occurring over time.

In some embodiments, the transient analysis module 214a can convert the ratio data from FIG. 9 into a metric that indicates the likelihood of electrical discharges occurring based upon the ratio. FIG. 10 is an exemplary diagram showing the likelihood of electrical discharges occurring during a specified time period, based upon the ratio data from FIG. 9. As shown in FIG. 10, the likelihood of electrical discharges moves from 0 to 2 at 15:17:40 and fluctuates between 0 and 2 until 15:18:00. In this example, a value of 2 indicates a high likelihood of electrical discharges occurring.

Upon identifying electrical discharge indicators in the transient characteristic data, the alert generation module 214b of server computing device 214 generates an alert signal (512) relating to the detected electrical discharge indicators. In some embodiments, the alert generation module 214b automatically identifies one or more remote devices that are monitoring (or are otherwise associated with) the building or location where the sensor device 204 is connected to the branch circuit and automatically transmits) an alert signal to these remote devices. The remote devices can include computer-based devices, such as mobile phones, tablets, desktop PCs, smart appliances, IoT devices, smart watches, and the like. The remote devices can also include horns, sirens, lights, and other audiovisual indicator devices.

In some embodiments, the database 216 includes information related to identification of the remote devices (e.g., IP address, phone number, email address), and the alert generation module 214b uses the identification information to prepare an alert signal for each remote device. In some embodiments, the alert generation module 214b uses any standard communication protocol or technique, such as packet-based delivery (e.g., text messaging, XML, email), circuit-based delivery (e.g., paging, voice messaging), and the like. For example, the alert signal can take the form of a packet-based communication (e.g., a message) with a header and body that comprises certain data elements. The alert signal can include information relating to the type of arc fault detected by the system 200, the approximate location of the electrical discharge activity (e.g., using the time-of-arrival techniques described above), an identification of the sensor device 204 and its position in the building, and other relevant information (e.g., identification of appliances or other electrical devices connected to the same branch circuit, etc.).

Figure 11:
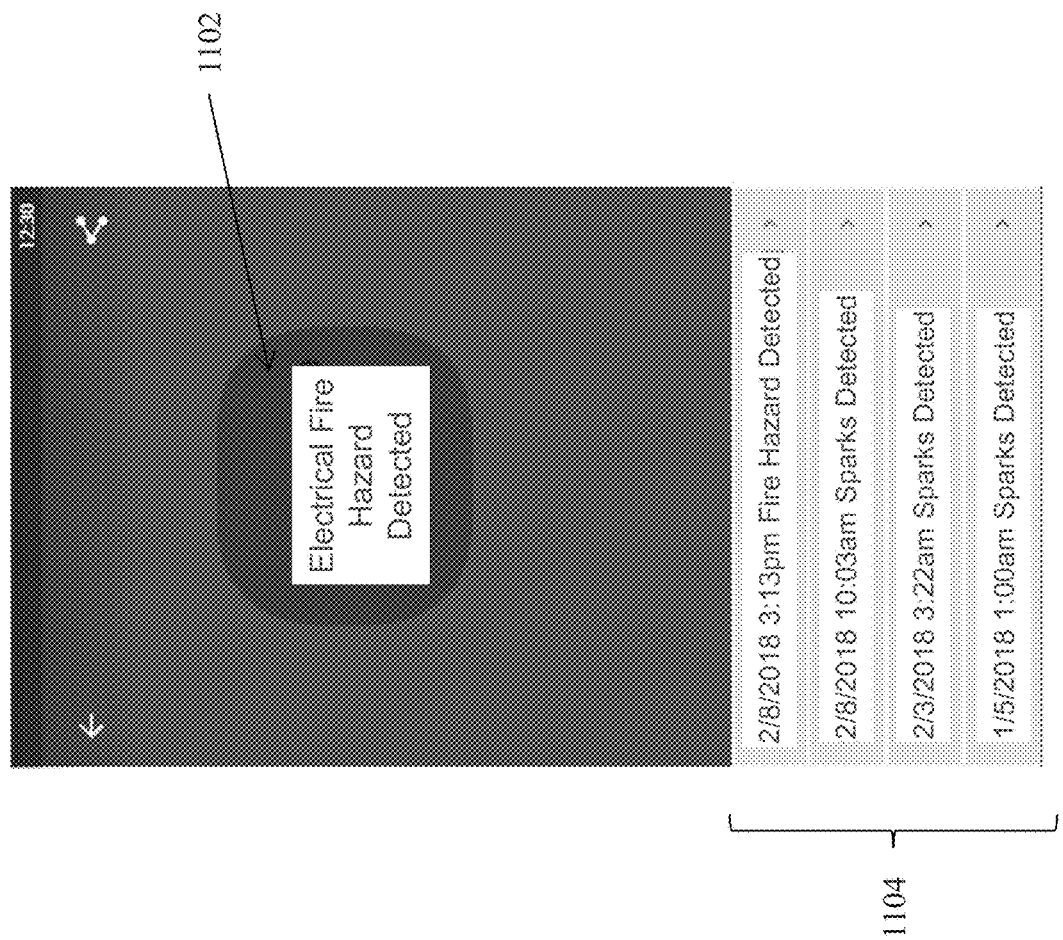
FIG. 11 is a diagram of an exemplary user interface of a remote computing device for displaying an alert signal notification.

FIG. 11 is an exemplary diagram of a user interface of a remote computing device (e.g., a mobile phone) for displaying a message to a user based upon receipt of an alert signal. As shown in FIG. 11, an app installed on the remote computing device can be coupled to the server computing device 214 (e.g., via the Internet) and can be configured to automatically listen for alert signals pushed from the alert generation module 214b. When an alert signal arrives at the remote computing device, the app can automatically display a warning indicator 1102 (e.g., a red, flashing graphic or icon) that notifies the user of an electrical fire hazard. The user interface can also include a log of prior electrical discharge activity detected (e.g., other events in the user's home).

In this way, the system and method described herein provide significant advantages over currently-available arc fault detection technology, in that the present system can detect small transients occurring in a branch circuit, that may be indicative of electrical discharge activity in the circuit, much earlier and with much more accuracy than traditional arc fault detectors. The system and method described herein also leverage a network-based processing architecture to capture signal data for a particular branch circuit over time, which can both enable immediate detection of changes in the electrical activity profile for the branch circuit and provide useful information to upstream entities such as utility companies and appliance manufacturers about the types of anomalies that may be occurring in a power system.

Also, it should be appreciated that multiple different sensor devices can be installed in various buildings across a common electrical grid operated by a utility provider (e.g., many different homes may have a sensor device attached to the building's electrical system to monitor for electrical discharges as described above). Each of these distributed sensor devices can communicate with one or more centralized server computing devices that send data to, and receive data from, the sensor devices. In this configuration, the server computing device can collect electrical discharge detection data from the sensor devices and aggregate the data for analysis. In one example, the server computing device can implement machine learning techniques and algorithms that use electrical discharge and/or transient data from a plurality of sensor devices installed in different homes and buildings, along with feedback from end users, to improve upon its transient detection and characterization algorithms.

In some embodiments, analyzing transient characteristics to identify one or more electrical discharge indications is enhanced by the application of machine learning techniques. Techniques such as boosted trees (as described in xgboost-.readthedocs.io/en/latest/tutorials/model.html and Friedman, Jerome H., "Gradient Function Approximation: A Gradient Boosting Machine," *The Annals of Statistics*, Vol. 29, No. 5 (October 2001), pp. 1189-1232, incorporated herein by reference) allow for the automated selection of various characteristics based on truth data sets from houses or buildings with known electrical discharge signals or truth data sets generated in a lab. Machine learning allows for development of a more detailed computational model and relationships between transient characteristics and electrical discharge indications than a human could manually derive. In some embodiments, time series features such as autocorrelation lags and kurtosis from these transient characteristics are further computed over a tumbling window and provide these features to the machine learning model to provide further context and improve accuracy. As truth data sets for both electrical discharge indications or false positives expands, the machine learning models can be improved, and further developed firmware can be deployed to the sensor in a continuous cycle of improvement.

In addition, the server computing device can distribute updated software methods for identifying transients and transient characteristics (i.e., in the form of firmware or similar upgrades) to the sensor devices for execution—thereby automatically synchronizing the sensor network with the latest algorithms for protecting the home. Also, multiple sensor devices placed in multiple homes can correlate data about commonly-detected voltage waveforms and transients to pinpoint the potential location of electrical grid problems and communicate to grid operators or utility providers to take action.

Figure 12:
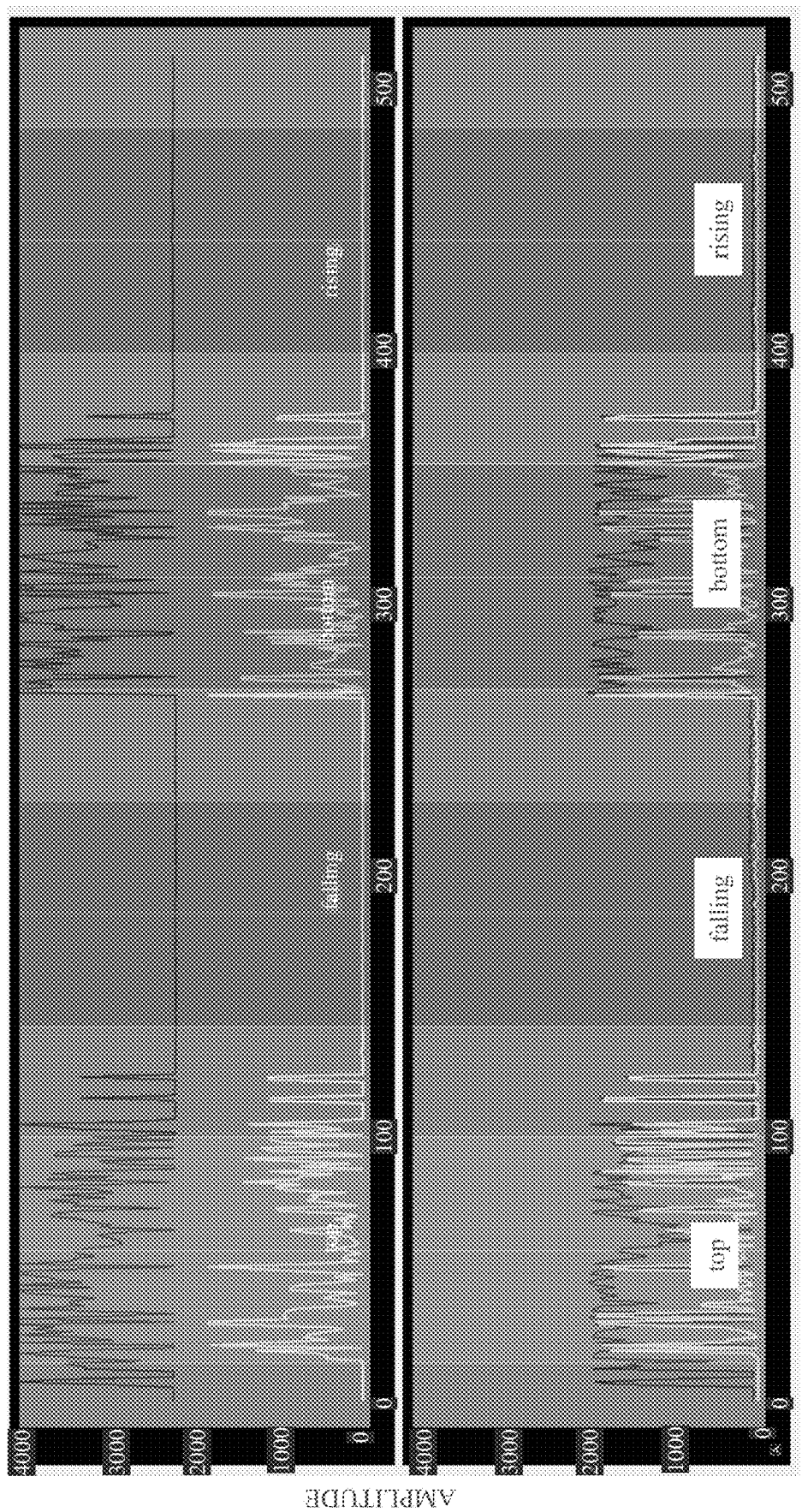
FIG. 12 is a diagram of exemplary waveform data for safety signals generated by a testing device.

Another aspect of the systems and methods described herein can include the incorporation of a device that generates signals that look like dangerous electrical discharges, but instead are introduced to the electrical wiring via a separate electronic device (which in some embodiments, is embedded in the sensor device 204). These signals (also called safety signals) can be used to test the operation of the sensor device 204, so that any malfunctions or other problems with the sensor device 204 can be identified. FIG. 12 is a diagram of an exemplary waveform generated from detection of the safety signals. As shown in FIG. 12, these transients are similar to the types of transients that would be created if a dangerous electrical discharge was occurring on the wiring. It should be noted that these transients are small enough to be detected by the sensor device 204, but not large enough to trip an AFCI.

Another important aspect of the systems and methods described herein is the development of an apparatus to test the effectiveness of the sensor device in detecting fire precursors that occur at any location in a home. One possible way to accomplish this would be to take a damaged cord that is producing fire precursor pulses to many homes and measure how well pulse signals are detected from other outlets in the home. The drawback of this approach is that it would take a significant amount of time to send a trained technician that can safely produce the signals and the study would only measure the signals over a short period of time—while someone was monitoring the system within the home. No reasonable individual would welcome a damaged (and hazardous) electrical cord in their house for an extended period of time.

Figure 13:
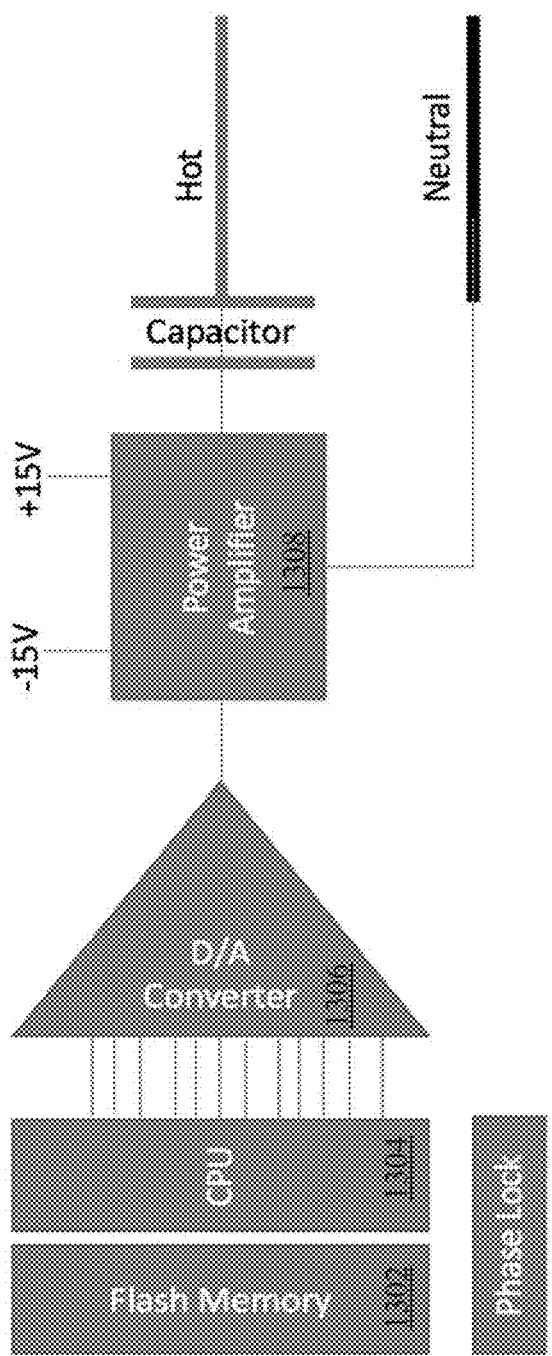
FIG. 13 is a block diagram of a proxy device that can be used in conjunction with the system of FIG. 2.

An alternate and more scalable approach is the use of a proxy device which can replay fire signals that are produced and recorded in the laboratory by real fire precursors. This proxy device allows for economical deployment of hundreds of units to varying types of homes across the country, along with an ability to track signal detection performance over long periods of time. FIG. 13 is a block diagram of a proxy device 1300 that can be used in conjunction with the system 200 of FIG. 2.

As shown in FIG. 13, the proxy device 1300 comprises a flash memory module 1302, a CPU 1304, a digital-to-analog signal converter (DAC) 1306, and a power amplifier 1308. The device 1300 utilizes the DAC and the power amplifier (coupled to the electrical system via the power capacitor) to simulate the fire precursor signals. The DAC 1306 can produce signals at 120 MHz for short periods of time. The CPU is phase locked with the zero crossing from the power mains to generate pulses that occur at appropriate locations in the phase. Pulse information is read by the CPU from the flash memory and recorded pulses are reproduced through the D/A converter and Power Amplifier.

The proxy device 1300, when deployed in a plurality of homes, helps to answer the following questions:

1) How well do the fire precursor arcing signals travel in a home's electrical system?

2) How well do the methods and systems described herein identify electrical fire signals and distinguish these signals from those created by other appliances in the home?

To determine how well fire precursor pulse signals travel in the home electrical system, the proxy device 1300 and sensor device 204 were deployed in a test home, along with a test fixture that when plugged into an electrical outlet at the home, produces scintillation pulses for detection. The test fixture included a power cord plugged into a standard wall outlet with Hot, Neutral and Ground conductors. The power cord was spliced to include resistors through which any currents creating by scintillations or electrical discharges must pass. The end of the power cord was connected to a plug through which various test apparatuses can be connected. The test fixture included a plastic NEMA enclosure through which a damaged extension cord was passed. The damaged electrical cord can be exposed to various substances which cause electrical discharges to occur. For example, the substance could be graphite powder, water or a solution of water, soap and salt. A differential analog to digital converter measures the voltage across a resistor of known resistance to calculate the current flow through the resistor. Resistors of various sizes were selected to provide appropriate amount of gain depending on the expected peak current generated by exposing the damaged cord to various substances. The test home is a large single-family home of approximately 4,000 square feet. The home has typical types of electronics equipment including flat screen televisions, audio equipment and computers. The electronics equipment is typically protected by surge suppressor power strips.

Figure 14A:
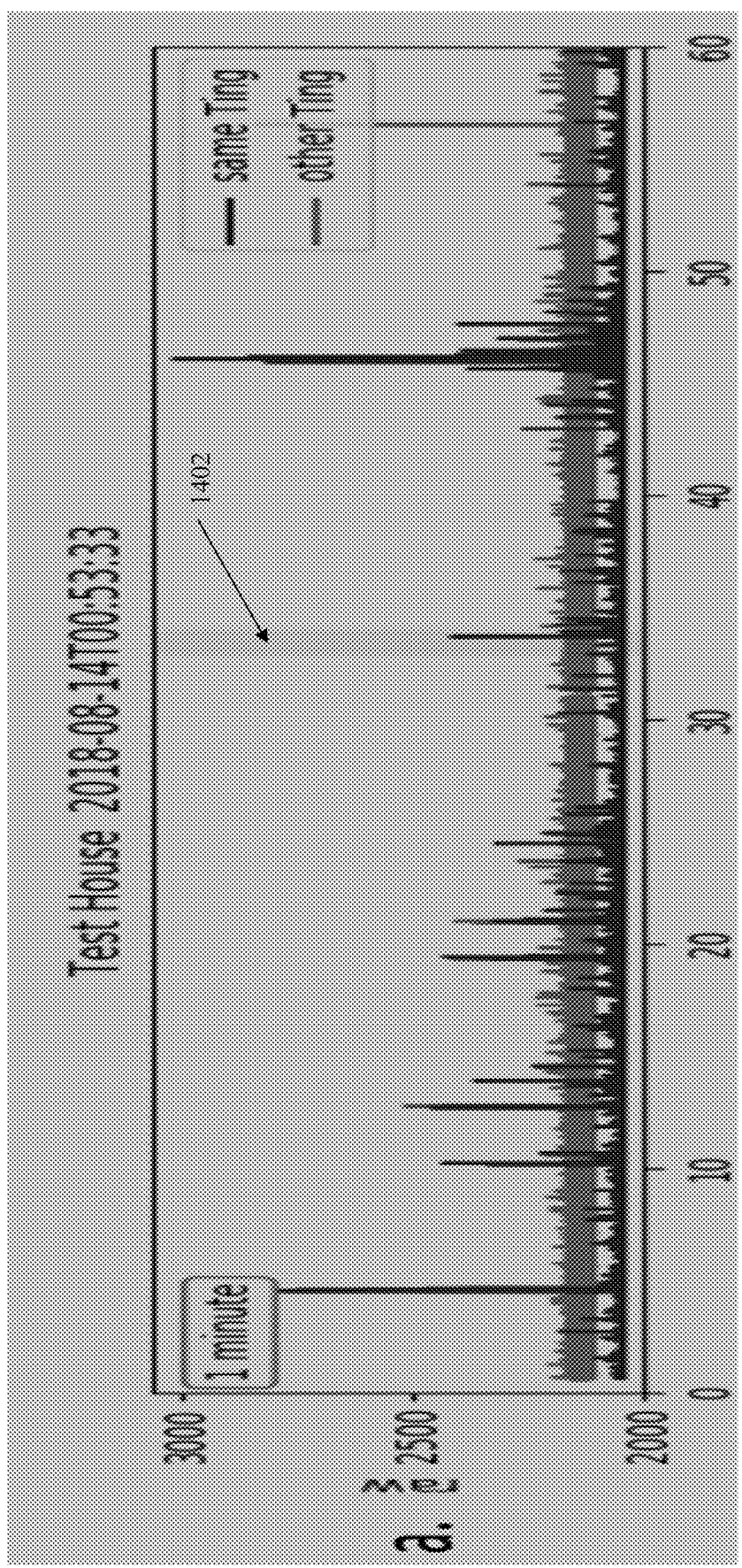
FIGS. 14A-14E are diagrams showing fire precursor arcing signals collected by a sensor device installed in a test home.
Figure 14B:
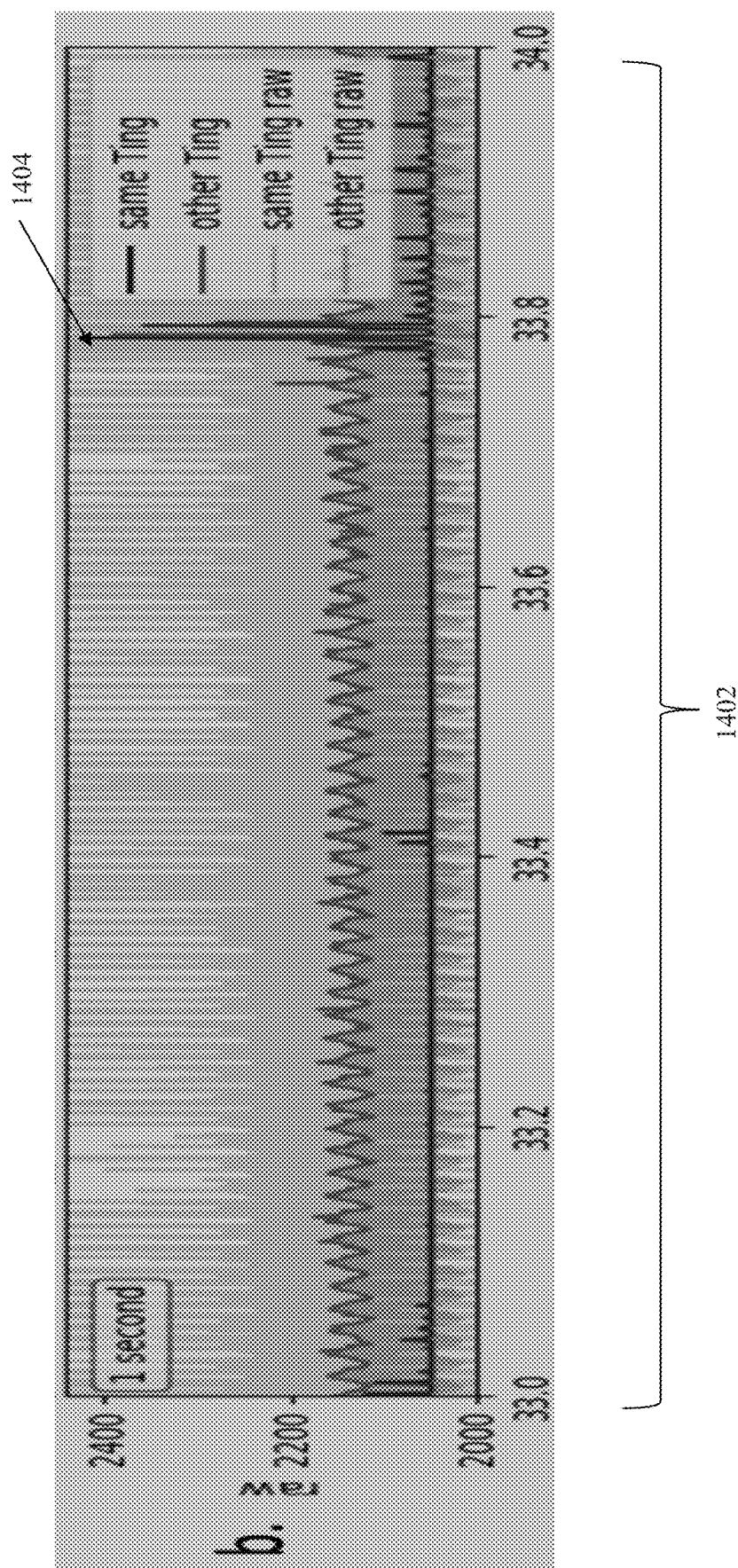

FIGS. 14A-14E are diagrams showing fire precursor arcing signals collected from the test home. The graph in FIG. 14A shows 60 seconds of a measurement of peak analog to digital converter output from two sensors. The sensor device labeled "Same Ting" is on the same 120V leg/phase, and is on the same branch circuit as the test fixture. The sensor device labeled "Other Ting" is on the opposite 120V leg/phase of the power network on a different branch circuit. Larger amplitude signals indicate times when the test fixture is creating fire precursor pulses. For example, in FIG. 14A the Same Ting line and Other Ting line jump up to approximately 2400 raw digital units in the area highlighted in the area 1402—indicating that both sensor devices detected a fire precursor pulse. The graph in FIG. 14B shows the highlighted period 1402 from FIG. 14A as zoomed into one second of time.

Figure 14C:
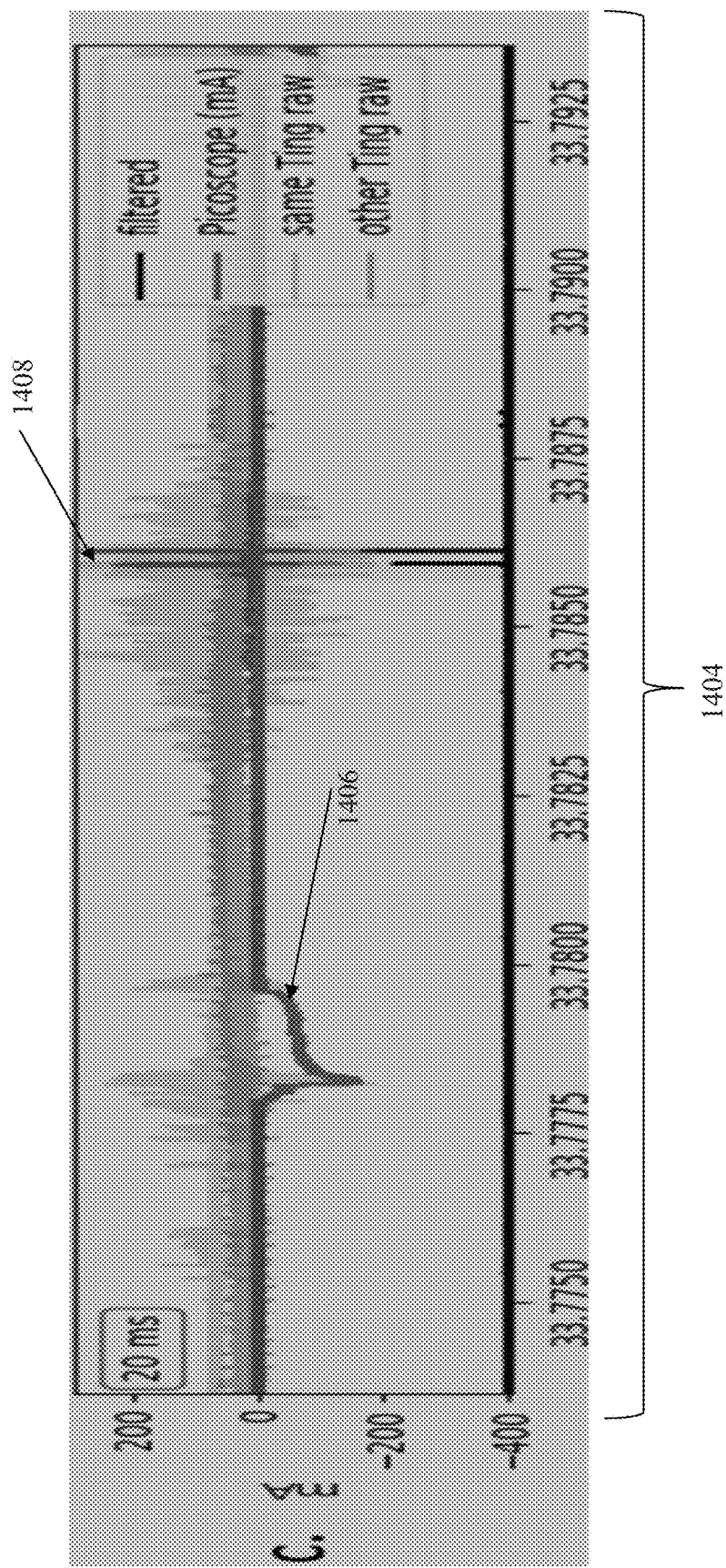

For the graph in FIG. 14C, data from FIG. 14B is further zoomed in to 20 milliseconds of time—which is denoted by the area 1404 in FIG. 14B. In FIG. 14C, the measurement of current 1406 through a 10-ohm resistor on the hot line of the test fixture is shown. This is the current that flows when breakdown on the insulator occurs and is observed as an electrical discharge and is evidenced in the form of heat and light.

Figure 14D:
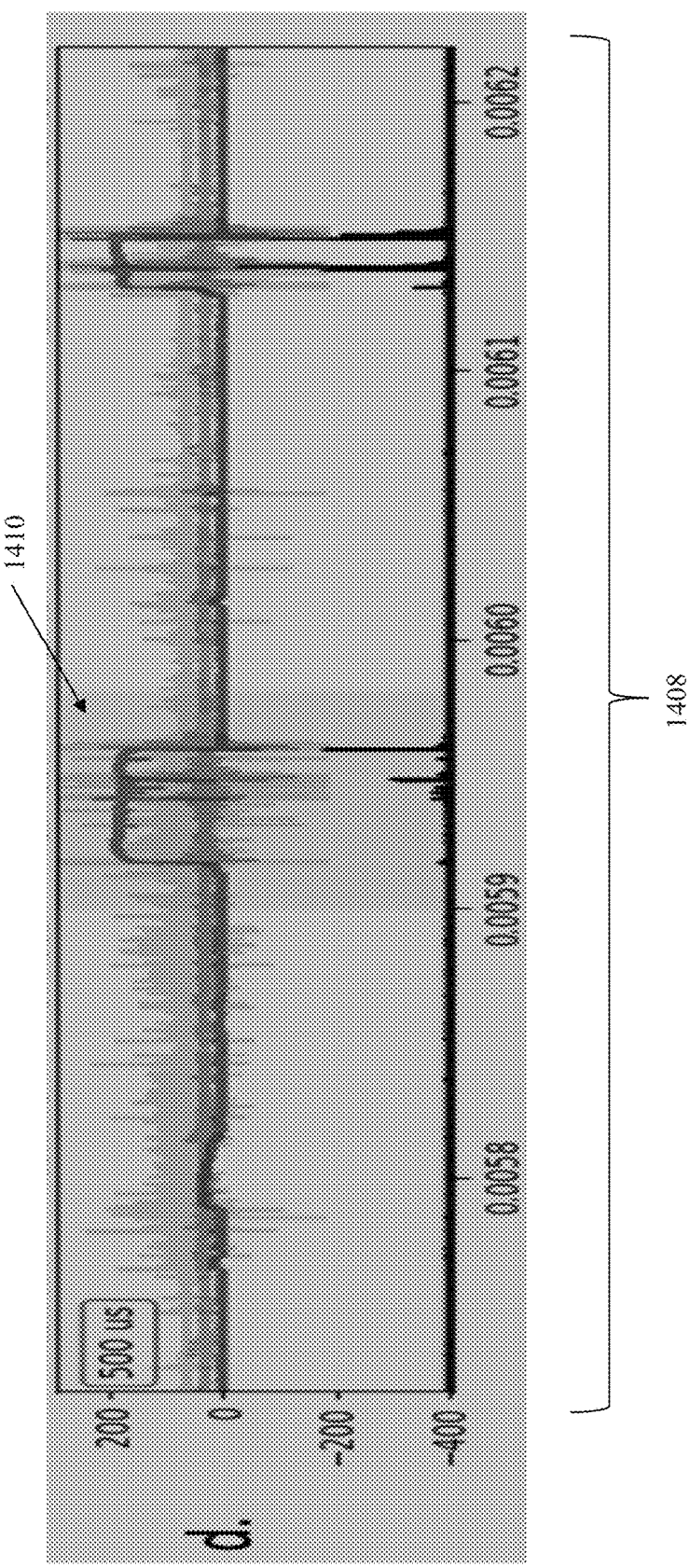
Figure 14E:
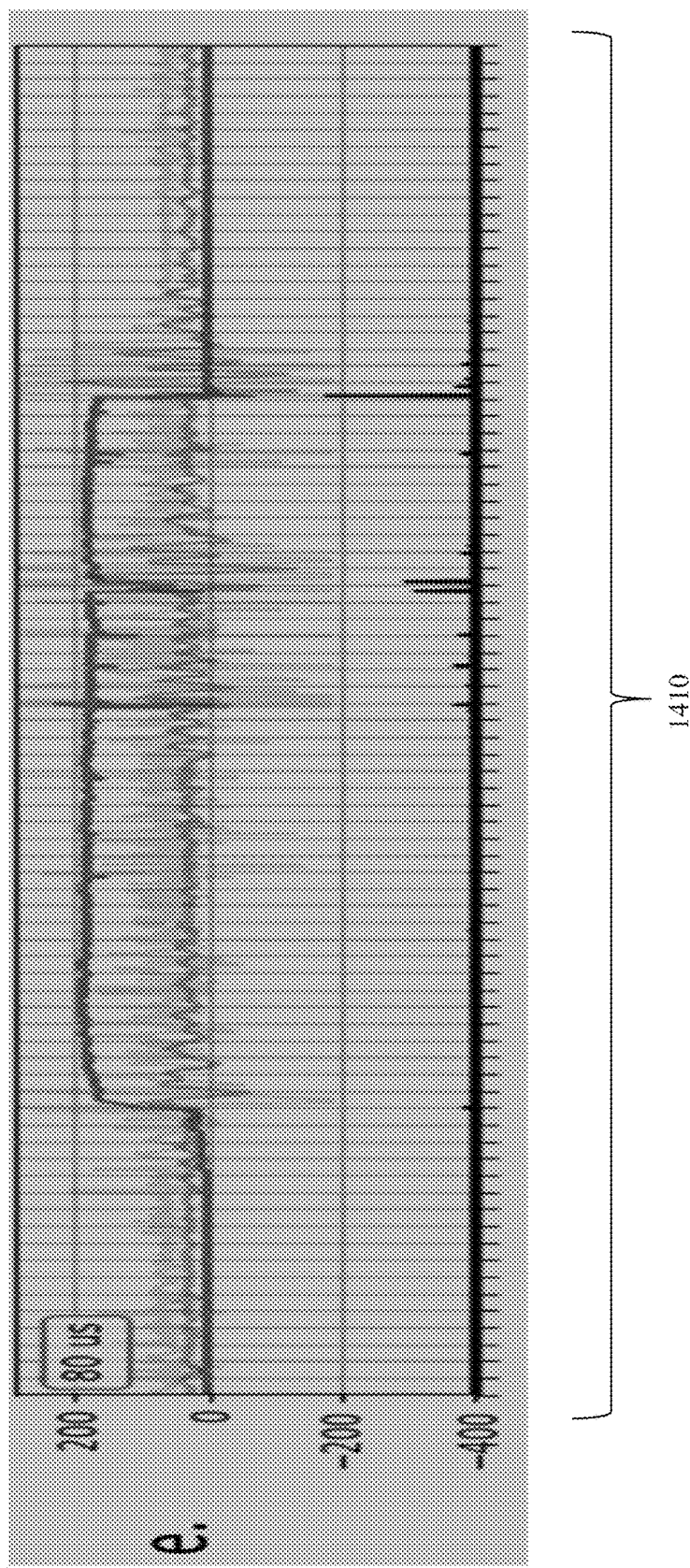

FIGS. 14D and 14E show further zoomed-in periods of the current flow through the 10-ohm resistor and the resultant waveforms as seen by the sensor devices. The graph in FIG. 14D shows the highlighted period 1408 from FIG. 14C as zoomed into 500 microseconds of time, while the graph in FIG. 14E shows the highlighted period 1410 from FIG. 14D as zoomed into 80 microseconds.

Figure 15:
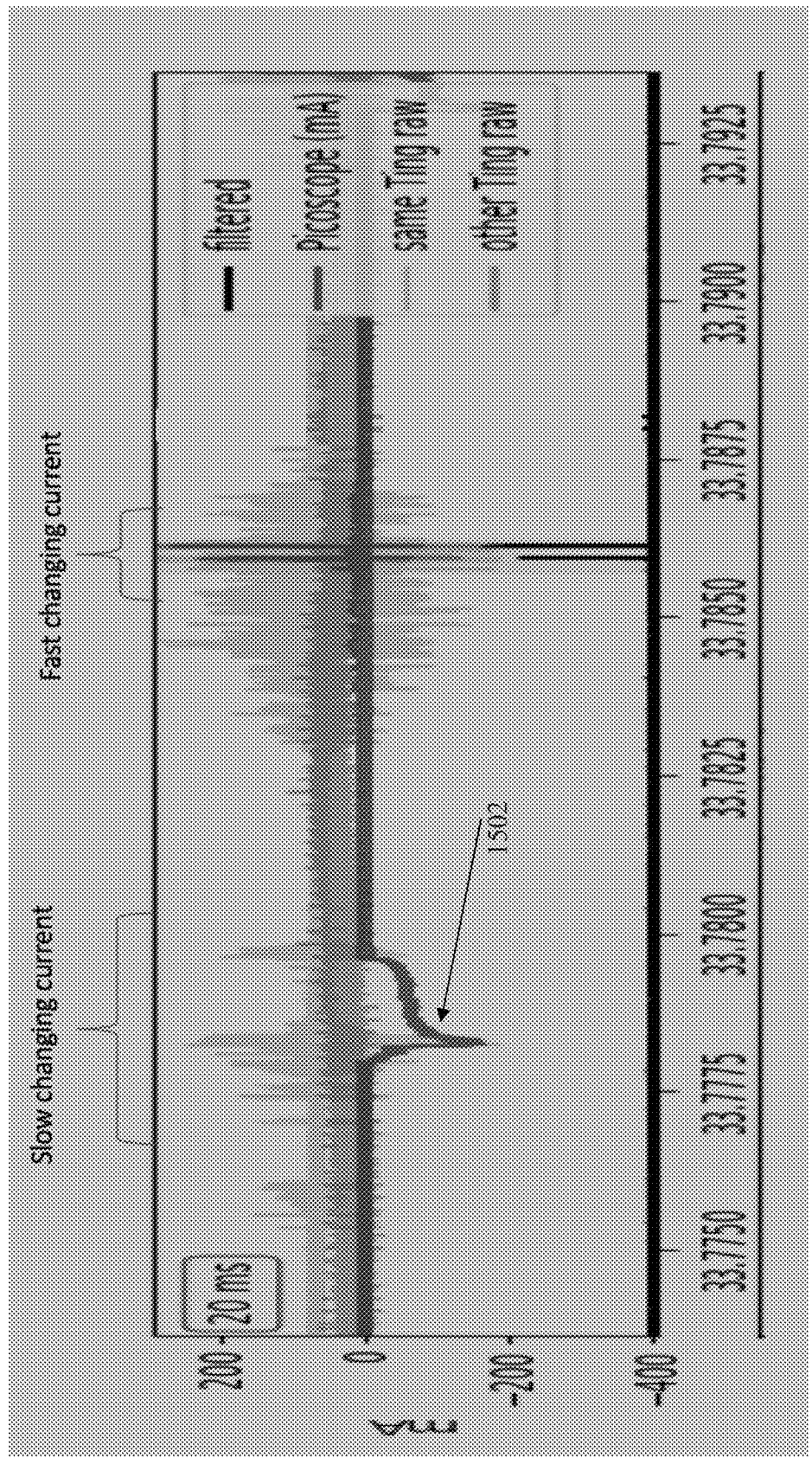
FIG. 15 is a diagram showing more detail of the arcing signals of FIG. 14C.

FIG. 15 shows a more detailed version of FIG. 14C, highlighting two times where electrical breakdown occurred and which the sensor devices measured current through the 10-ohm resistor. In this example, one appreciates that electrical breakdown can produce currents that change slowly over a time period of many microseconds, to currents that start and stop very fast, on the order of nanoseconds to tens of nanoseconds. As can be seen in FIG. 15, the slowly changing currents produce a visible signal 1502 in the sensor device on the same circuit ("Same Ting"), but not in the sensor device on a different leg ("Other Ting"), while the fast-changing currents are visible in the signals from both sensor devices.

Figure 16:
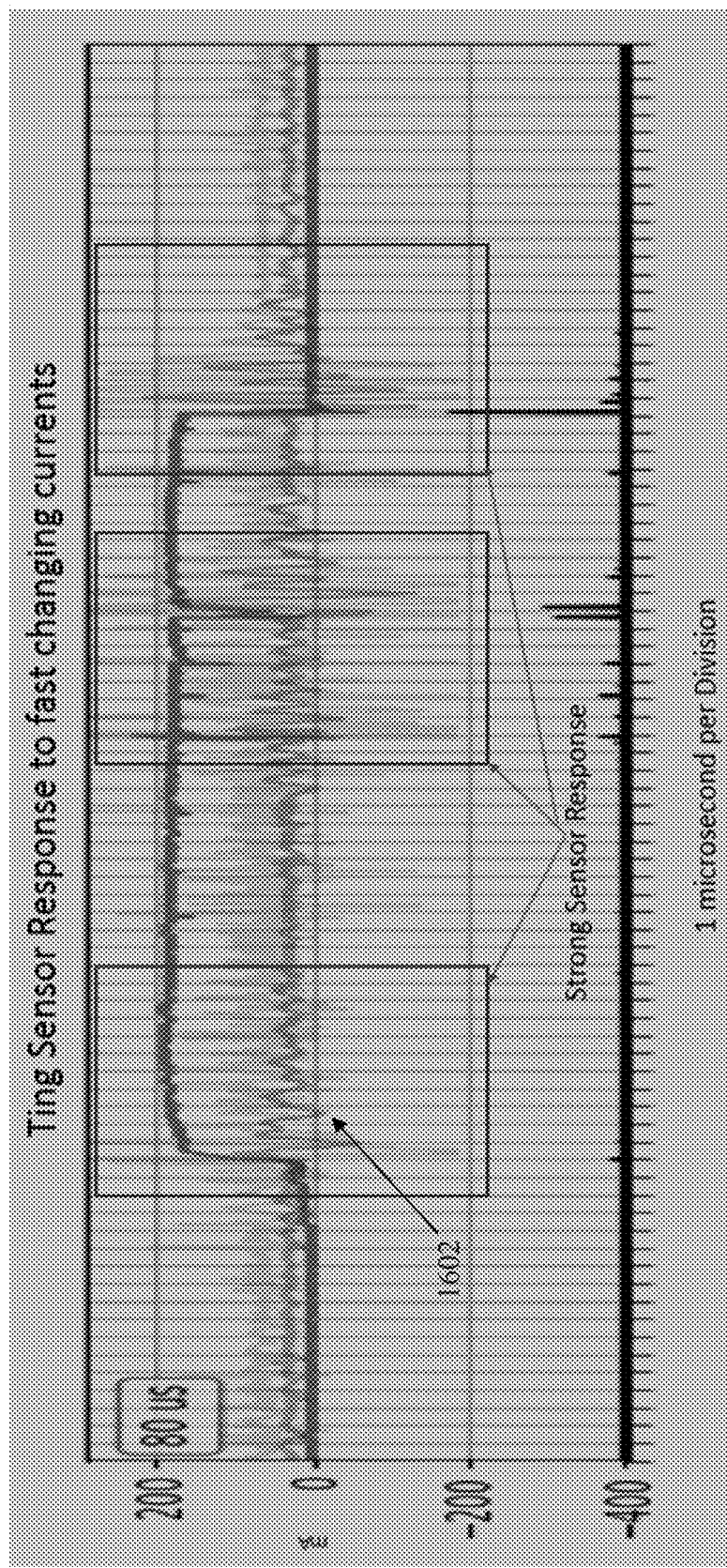
FIG. 16 is a diagram showing more detail of an individual pulse from an electrical discharge.

FIG. 16 shows a more detailed look at one of the individual pulses from an electrical discharge with some information on the current change rates as the current starts flowing, then experiences several interruptions to the current flow until finally being extinguished. Note that at each fast change in the current, both sensor devices see a sharp rise in signal followed by a characteristic ring-down. This demonstrates that the characteristic of the electrical discharge that makes the biggest impact on how well signals travel through the electrical network is the very fast rise time and fall time of the currents. Note that as the discharge starts, the characteristic ring down signal 1602 appears, but as the current continues at the same level, the sensor device on the opposite phase does not have a strong response. This is an important finding for the development of the proxy device, as it means that as long as the proxy device can simulate the fire precursor fast pulse currents rise and fall times, then it can re-create the most relevant part of the signal and does not need to re-create the longer continuing currents.

It should be appreciated that the proxy device 1300, which functions as an arbitrary waveform generator, reproduces laboratory waveforms imperfectly. It can only generate voltage steps at certain digital clock edges and it can only generate steps of certain discrete amplitudes. The system performs lossy compression on the data, preserving only the largest peaks and preserving their shapes. The impedance of the proxy device 1300 is not the same as the impedance of a damaged portion of insulator, so reflections from the proxy device differ from reflections from a damaged cable. As a result, it is important to confirm that the proxy device is sufficient to produce signals at the sensor device 204 similar to the signals produced by real scintillations in damaged insulation.

To test this, insulation on a wire was damaged in the laboratory, the currents produced by scintillations in the damaged insulation were measured, and voltages produced by those scintillations at a sensor device on a different circuit in the laboratory were simultaneously measured. The proxy device 1300 was then programmed to replay the scintillations that were measured, the damaged insulation was replaced with the proxy device, and again currents produced at the proxy device and voltages produced at a sensor device on a different circuit were simultaneously measured.

Figure 17:
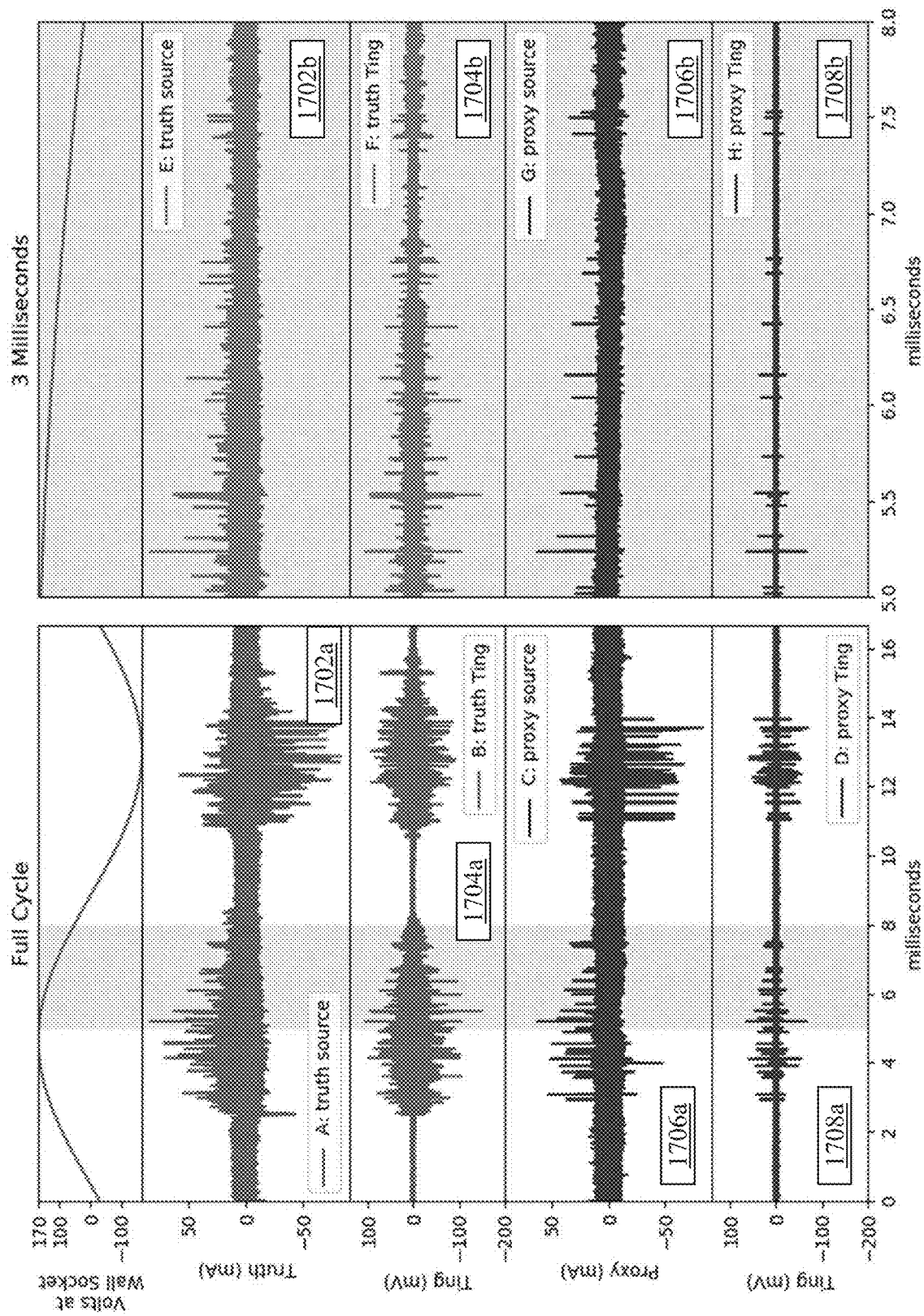
FIG. 17 is a diagram with a number of graphs showing system test results.

FIG. 17 shows the results of the testing described above. Graph 1702a shows the current initially measured in the laboratory from damaged insulation. Graph 1704a shows the voltage a sensor device measured at another circuit, produced by the current pulses shown in graph 1702a. Graph 1706a shows the current produced by the proxy device, and graph 1708a shows the voltage measured by a sensor device on another circuit. Graphs 1702b, 1704b, 1706b, and 1708b show the same measurements of graphs 1702a, 1704a, 1706a and 1708a, respectively, at a higher time resolution. The sensor voltages produced by the proxy device are not identical to those initially measured, but they are similar enough to use.

A second characteristic of fire precursor pulse signals that determine if they travel through the house is the amplitude of the pulse. Larger amplitude pulses produce a larger response in the sensor device 204. The relationship between the amplitude of the current and the size of the sensor device response can be seen in graphs 1702b and 1704b. Larger current amplitudes in graph 1702b are observed as larger sensor responses in 1704b. Similarly, larger amplitude currents produced by the proxy device, result in larger responses at the sensor device (see graphs 1706*b* and 1708*b*). Currents on the order of 25 mA are sufficient to produce a response in the sensor device 204 with sufficient signal to noise ratio to be detected.

Figure 18:
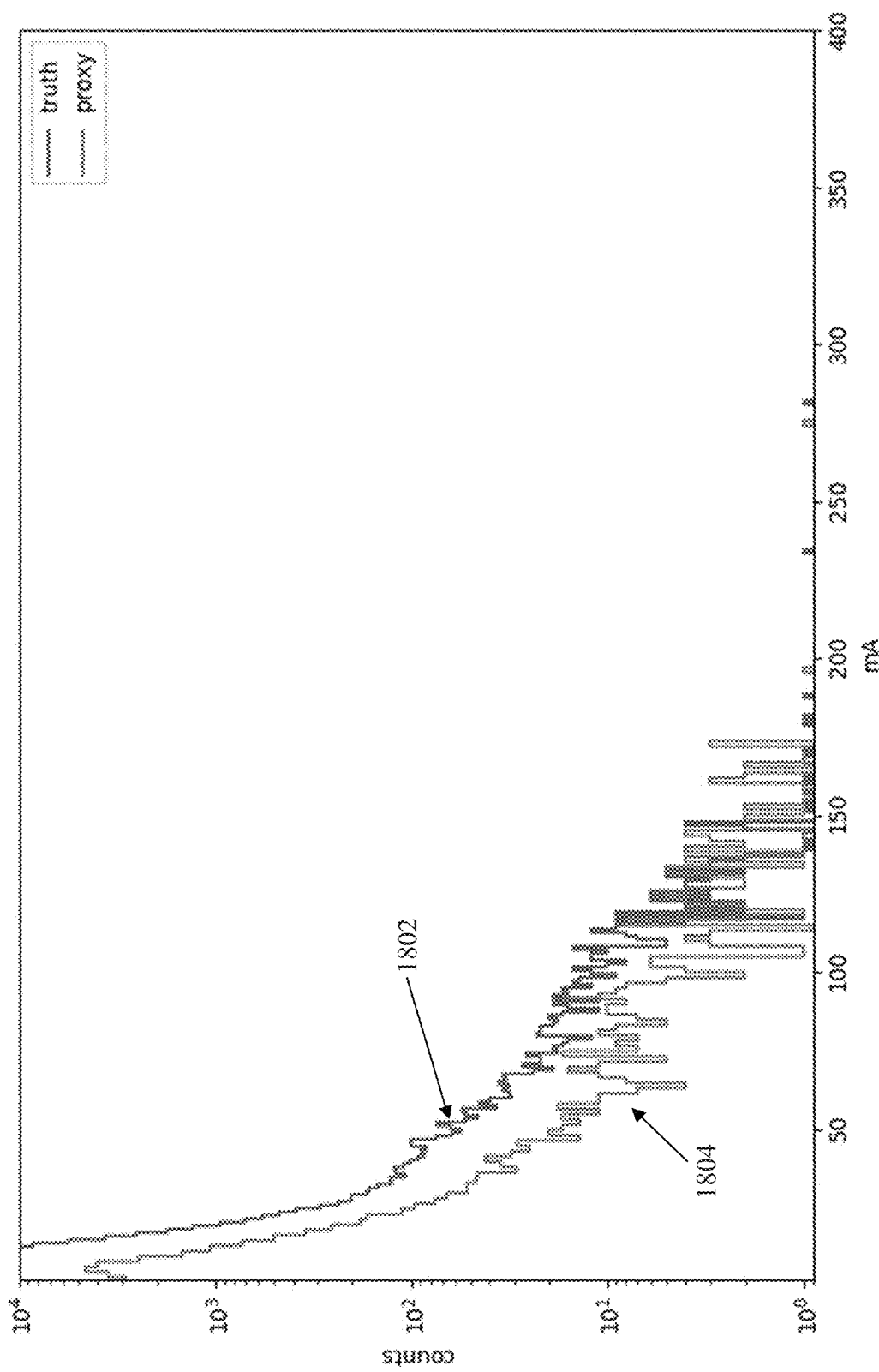
FIG. 18 is a histogram showing amplitude of pulses from laboratory data compared with amplitude of pulses recreated by a proxy device.

Fire precursors can generate thousands of pulses over a single power cycle a large percentage of which are not large enough in amplitude to travel through the electrical infrastructure and be seen by a sensor device on the opposite leg. The proxy device 1300 is capable of producing a limited number of pulses per cycle. The proxy device is programmed to focus on generating the largest and fastest pulses which are expected to be detected throughout the house. In some embodiments, the proxy device 1300 can communicate with a server computing device (e.g., server computing device 214) to notify the server of times which it is operating and which mode it is operating. In this case, it is easy to correlate the times where the proxy device indicates it is running to sensor device output to verify that the sensor device detects the signal. In this example, the proxy device 1300 was programmed to create fast pulses with amplitudes that ranged from 0 milliamps to 300 milliamps. FIG. 18 shows a histogram of the amplitude of pulses found in a five second set of data that was acquired in the lab, labeled "truth" (dark gray, 1802). Additionally, a histogram of the amplitude of pulses re-created by the proxy device is shown in light gray (1804). Generally, the counts of proxy pulses is less than from the truth data source. As described above, this is because of the limits of the proxy device memory to hold enough data to reproduce every pulse, so the focus is on reproducing the largest pulses.

Note that pulse current amplitudes in the proxy test data set are small in comparison to the peak amperes which trigger arc fault circuit interrupters. An AFCI will trip at about 50 amps for a parallel arc and 5 amps for a series arc (as described in J. Wafer, "The Evolution of Arc Fault Circuit Interruption", The 51$^{st}$ IEEE HOLM conference on Electrical Contacts, 2005). By detecting pulse currents with these small amplitudes, the sensor device described herein is able to alert a homeowner well in advance of the level at which the arcing becomes dangerous and fire hazard is imminent. This timeframe between when scintillations are detected and the arc grows large enough to be dangerous can be on the order of hours to years (as described in Twibell, J. D., *Electricity and Fire, pp.* 61-104 in Fire Investigation, N. N. Daéid, ed., CRC Press, Boca Raton, Fla. (2004)).

Having demonstrated that fire precursors create signals on the power network that travel throughout and can be detected by a single sensor device, the second question for detection efficiency relates to how well the sensor device can distinguish between fire precursor signals and man-made or other interfering signals which can be sensed on a power line. Fire precursor signals exhibit certain characteristics of parallel arcs which are exploited for identification (note that series arcs have other characteristics that can be exploited for identification—such as low signal at zero crossings with a large amplitude impulse just outside the area of the zero crossing, and glowing connections have yet different characteristics that can be exploited for identification):

1) The fire precursor pulse signals are on average larger near voltage peaks and weakest, approaching zero near the voltage zero crossings.

2) Pulse signals are randomly distributed in time across multiple cycles and are randomly distributed across the phase.

Figure 19:
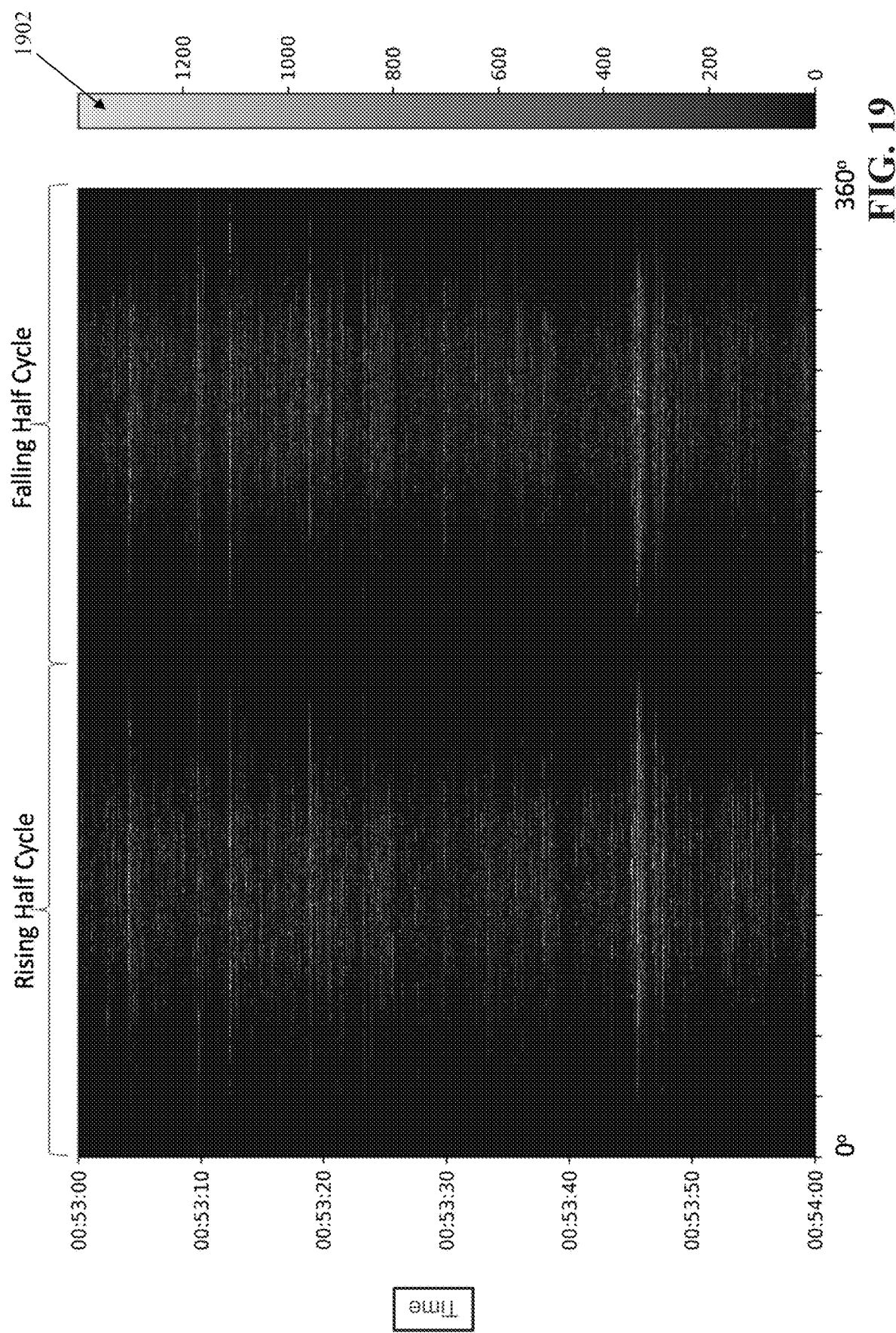
FIG. 19 is a plot showing how fire precursor signals appear over time.

FIG. 19 shows a plot of how fire precursor signals look over time. Time on the plot is increasing from top to bottom. Each row of the plot is representative of a single power cycle with the rising half cycle indicated on the left and the falling half cycle indicated on the right. The scale 1902 indicates the amplitude of HF signals detected at various places in the power cycle phase. For parallel arcs, the HF amplitude increases at the peaks of the power cycle and goes to zero at the zero voltage crossings.

Figure 20:
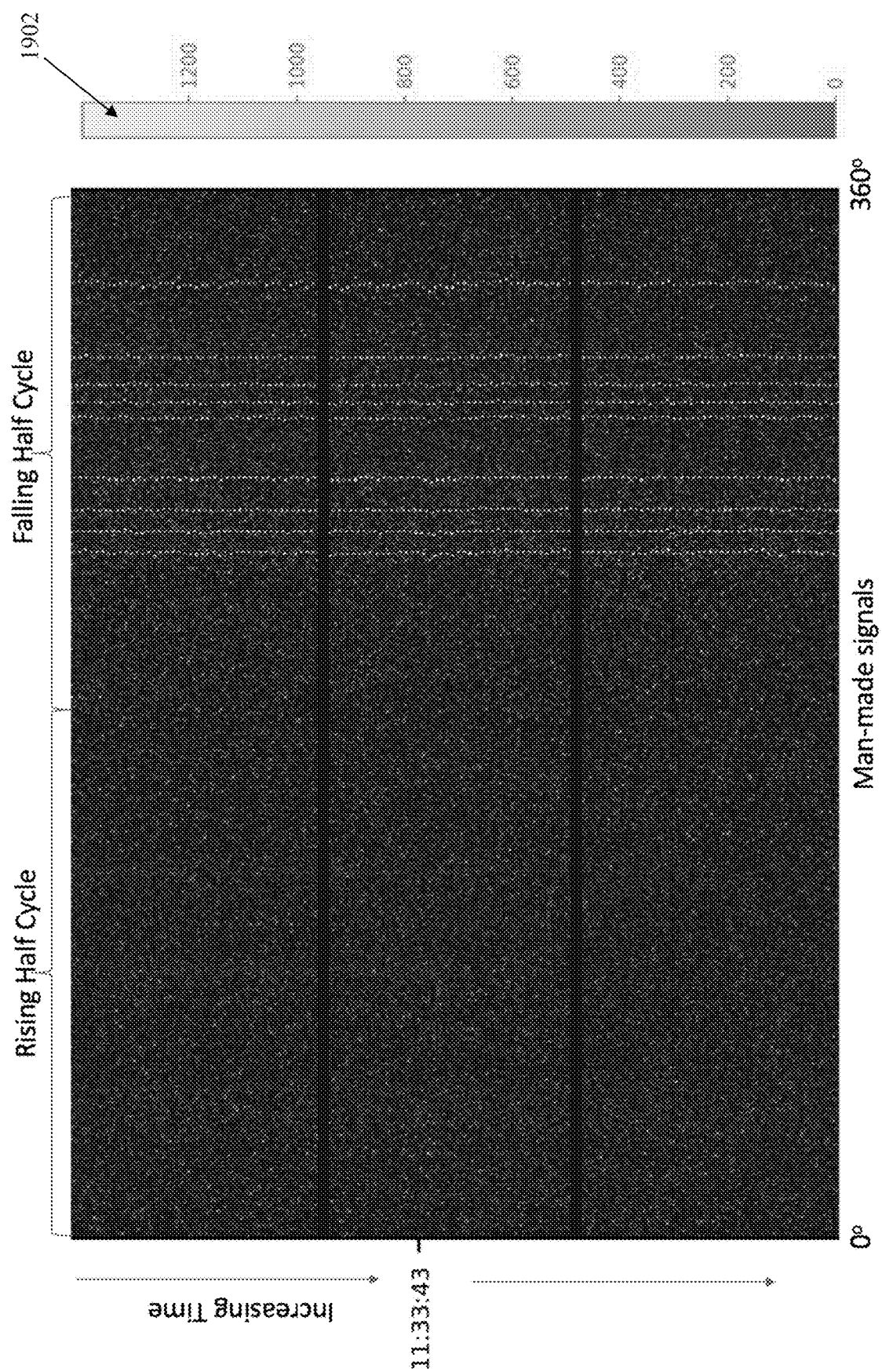
FIG. 20 is a plot for a device running on the electrical network that is generating HF electrical activity.

For comparison, FIG. 20 shows the plot of FIG. 19 for a device running on the electrical network that is generating HF electrical activity. A typical feature of devices running on an electrical network is that HF electrical activity is in repeatable places in the phase over longer periods of time. This is indicated by the vertical lines in the falling half cycle. The sensor algorithms described herein exploit the differences between man-made devices which generate predictable and repeating signals from fire precursor signals which are more variable in time and amplitude.

Figure 21:
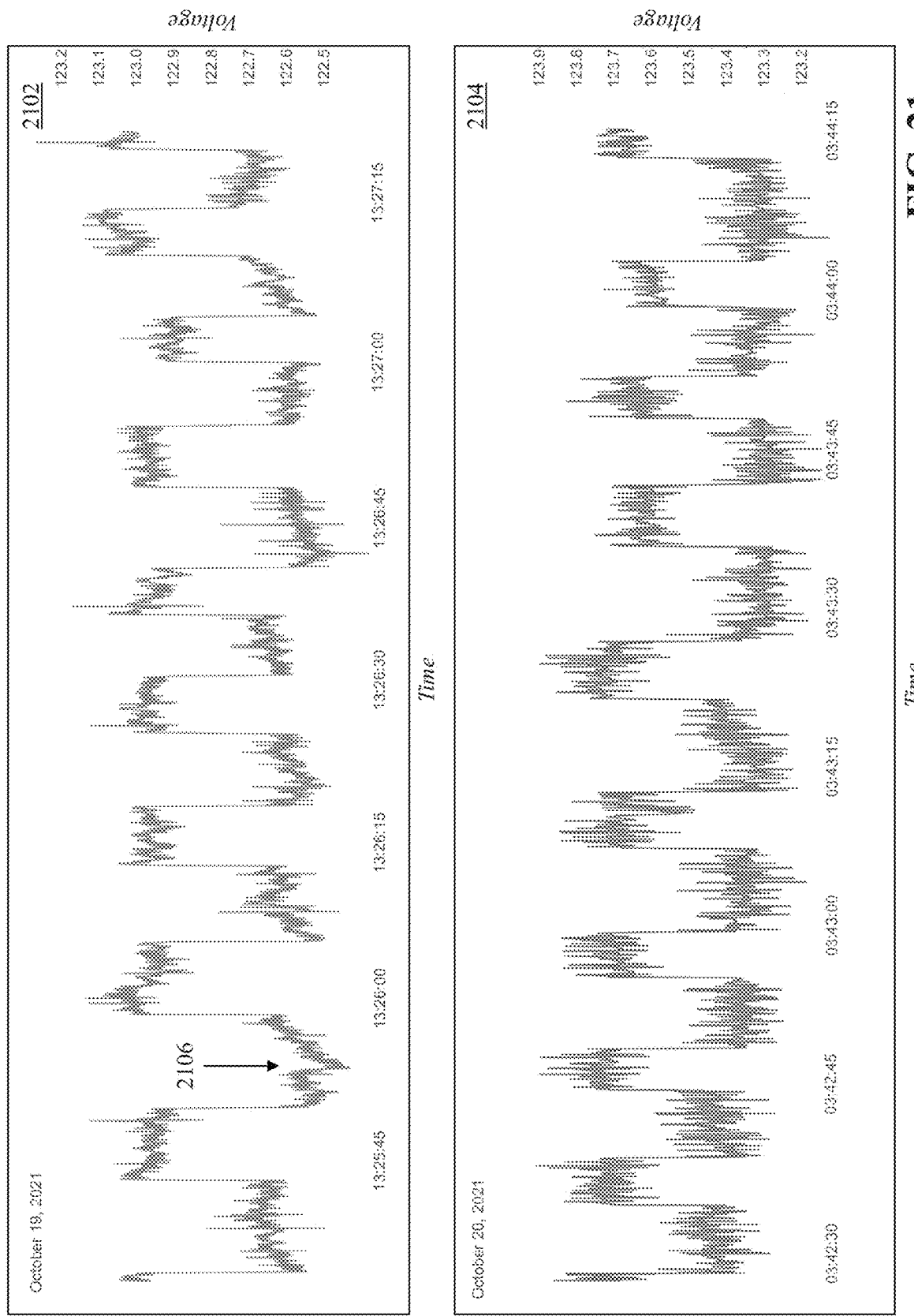
FIG. 21 is a diagram of graphs of root mean square (RMS) Voltage changes over time associated with an appliance turning on and off.
Figure 22:
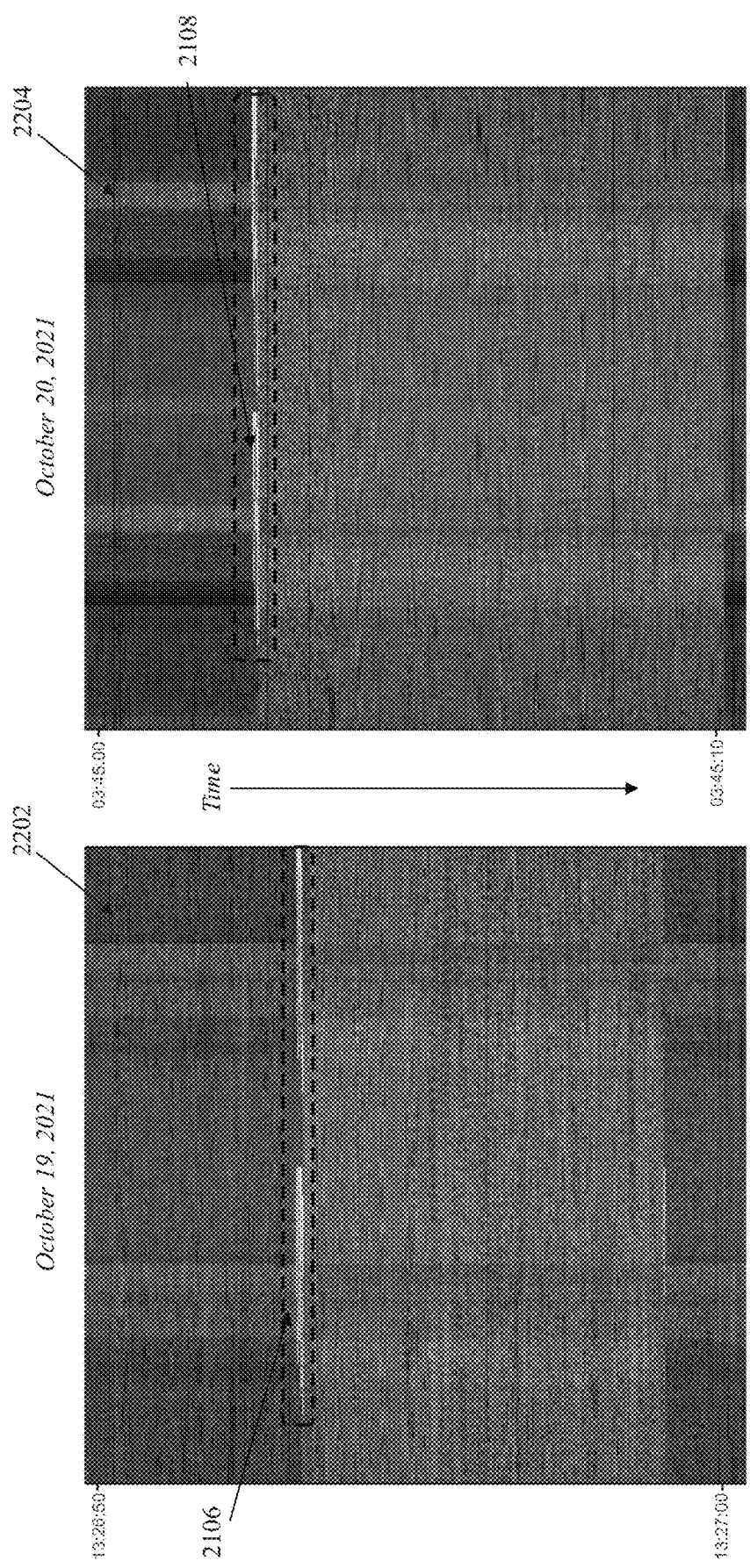
FIG. 22 is an exemplary visualization for an electrical discharge activity pattern, where the pattern is generated from the voltage changes of FIG. 21 as detected by system 200.

Building upon the ability to identify individual arcing events as described above, another important aspect of the fire precursor detection and mitigation techniques described herein is the ability to group the identified individual arcing events into patterns of electrical discharge activity and recognize the patterns as potential fire precursors based upon either comparing the pattern to one or more known hazardous electrical discharge patterns (such as a comparison of transient characteristics of the waveforms) and determining a match or by identifying other conditions (e.g., weather, time of day, continuous occurrence, power quality events, etc.) that align with the detected pattern, in order to understand a cause of the electrical discharge activity and proactively mitigate the risk of destructive fires. FIG. 21 is a diagram of graphs of root mean square (RMS) Voltage changes over time associated with an appliance (e.g., an oven) turning on and off. As shown in FIG. 21, the top graph 2102 and the bottom graph 2104 are captured from different days (top=Oct. 19, 2021; bottom=Oct. 20, 2021) showing the voltage pattern from the oven turning on and off. As can be appreciated, when the oven turns on, the voltage drops (see, e.g., reference 2106). The electrical discharge activity associated with the turning on of the oven is shown in the visualization of FIG. 22 (described below). When the oven turns on, this creates an electrical activity pattern 2104 which is the same on Oct. 20, 2021 as the electrical activity pattern 2102 on Oct. 19, 2021. The RMS Voltage over time shows the same type of activity which allows system 200 to relate the turning on of the oven to the arcing pattern.

As described in this specification, an electrical discharge activity pattern can be visualized as a two-dimensional image where each cycle (representing one power cycle) is visualized by a horizontal row of pixels representing the transient characteristics. A row of pixels begins with the upward zero crossing of the power cycle, and the vertical axis represents how the electrical discharge activity patterns change from cycle to cycle. FIG. 22 is an exemplary visualization for an electrical discharge activity pattern, where the pattern is generated from the voltage changes of FIG. 21 as detected by system 200 due to faulty wiring of the electric oven. As shown in FIG. 22, image 2202 comprises an electrical discharge activity pattern generated from the voltage changes detected between 13:26:22 to 13:27:22 on Oct. 19, 2021. Image 2204 comprises the electrical discharge activity pattern generated from the voltage changes detected between 03:44:32 and 03:45:32 on Oct. 20, 2021. As can be appreciated, the electrical discharge activity patterns between images 2202 and 2204 are nearly identical.

When the oven turns on, each of the activity patterns exhibits an arcing discharge indication—the bright areas 2206 and 2208, respectively.

Figure 23:
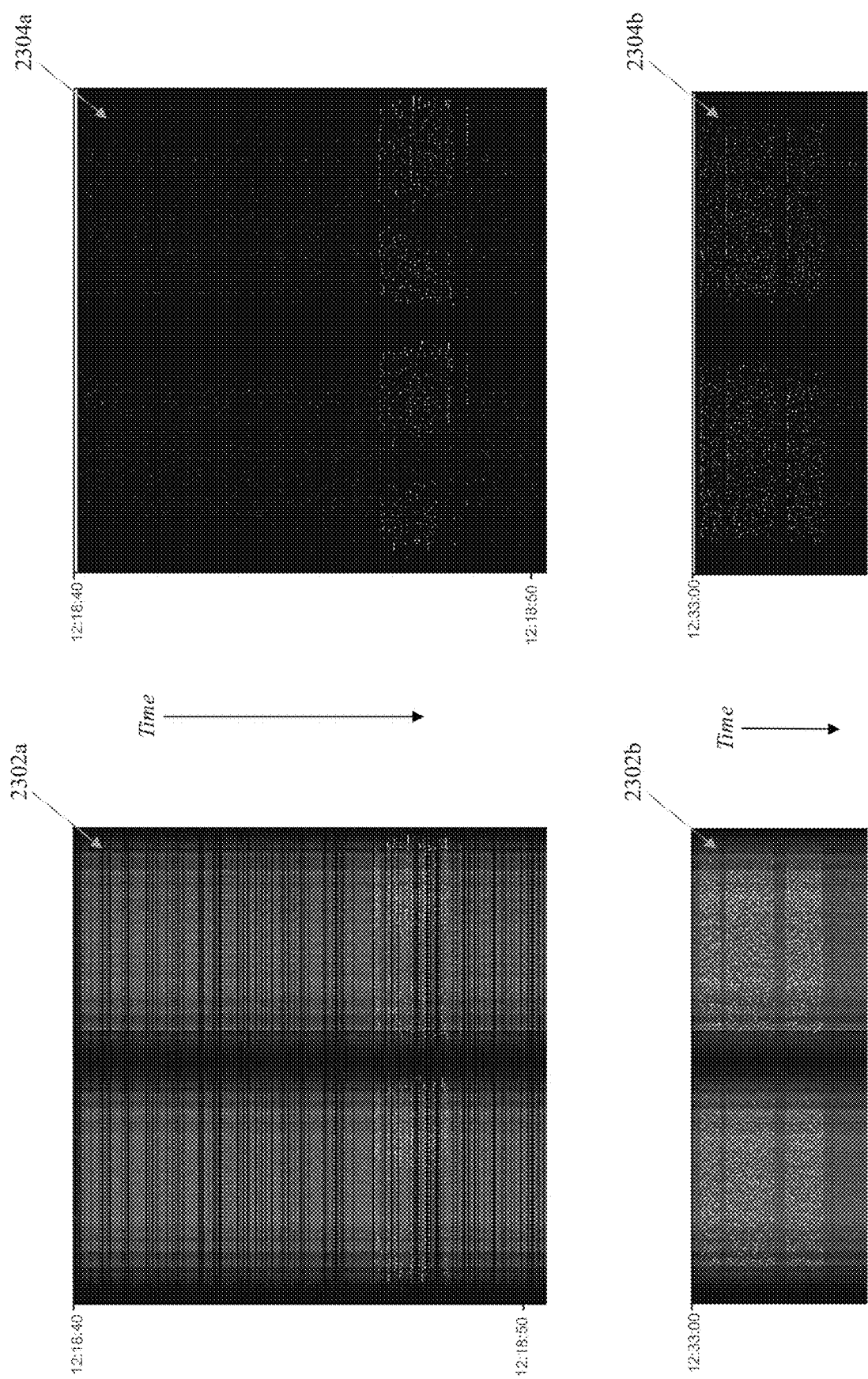
FIG. 23 is another exemplary visualization for an electrical discharge activity pattern generated by system, including an unfiltered view and a filtered view.

FIG. 23 is another exemplary visualization for an electrical discharge activity pattern generated by system 200, including an unfiltered view and a filtered view. As shown in FIG. 23, the left-hand images 2302*a* and 2302*b* represent an unfiltered view of an electrical discharge activity pattern occurring in an electrical system of a home. The electrical discharge activity pattern is generated due to any of a number of deficiencies with the electrical system (such as those examples described previously). Image 2302*a* comprises an electrical discharge activity pattern detected in a one-minute window (e.g., 12:18:40 to 12:19:40). Image 2302*b* comprises an electrical discharge activity pattern detected in another, later one-minute window (e.g., 12:33:00 to 12:34:00). Similarly, the right-hand images 2304*a* and 2304*b* in FIG. 23 represent the same electrical discharge activity pattern as represented in images 2302*a* and 2302*b* with a filter applied to remove repeating background activity. As can be appreciated, the electrical discharge activity patterns between corresponding images 2302*a* and 2304*a*, and images 2302*b* and 2304*b*, are very similar.

Figure 24A:
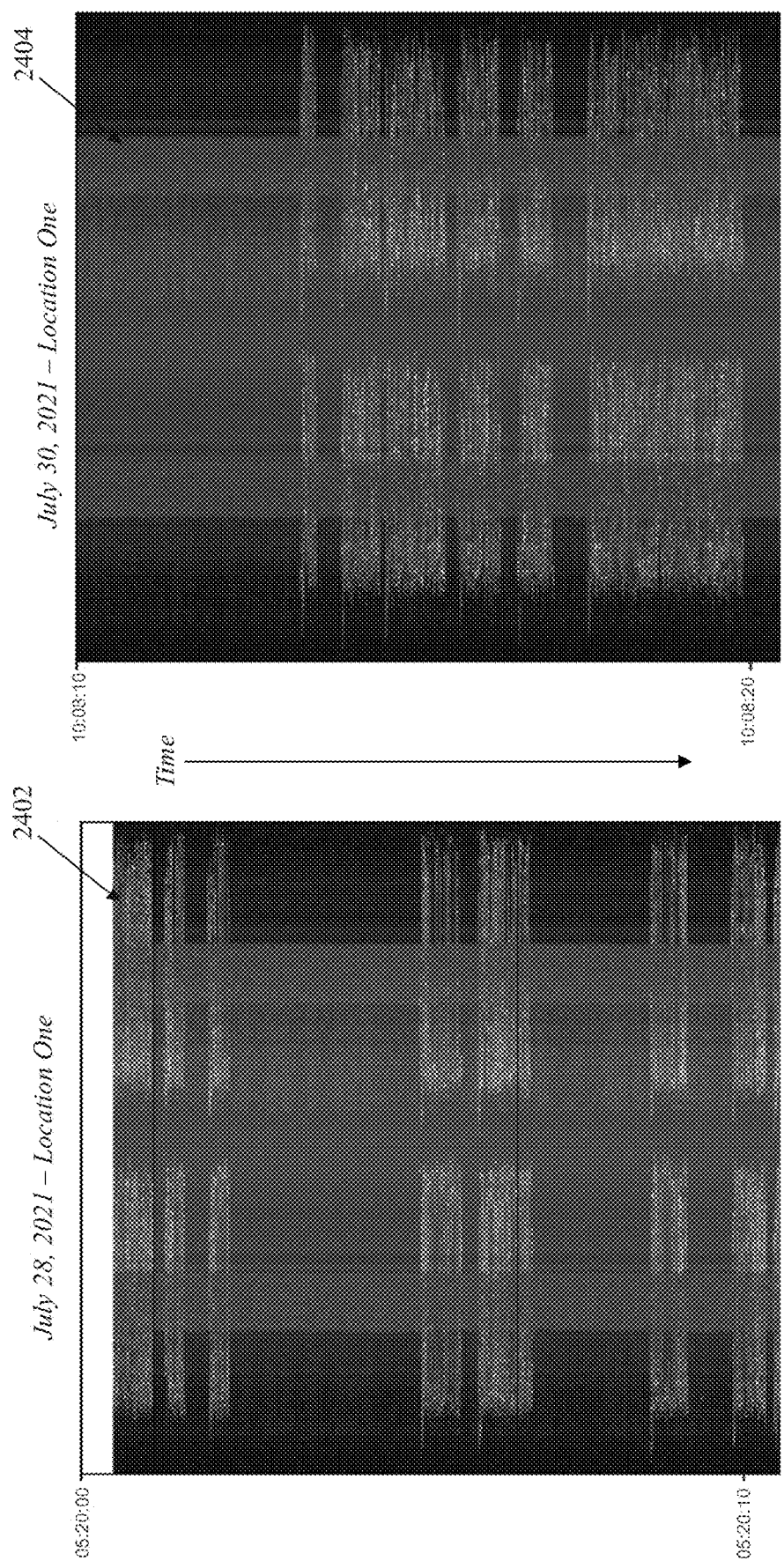
FIG. 24A is another exemplary visualization for an electrical discharge activity pattern, where the pattern is generated due to arcing at an electrical panel bus bar in a particular home and the pattern occurs at two different time periods.

FIG. 24A is another exemplary visualization for an electrical discharge activity pattern, where the pattern is generated due to arcing at an electrical panel bus bar in a particular home (Location One) and the pattern occurs at two different time periods. As shown in FIG. 24A, image 2402 comprises an electrical discharge activity pattern detected between 05:20:00 and 05:20:10 on Jul. 28, 2021. Image 2304 comprises the electrical discharge activity pattern detected between 10:08:10 and 10:08:20 on Jul. 30, 2021 at the same home. As can be appreciated, the electrical discharge activity patterns between images 2402 and 2404 are highly similar.

Figure 24B:
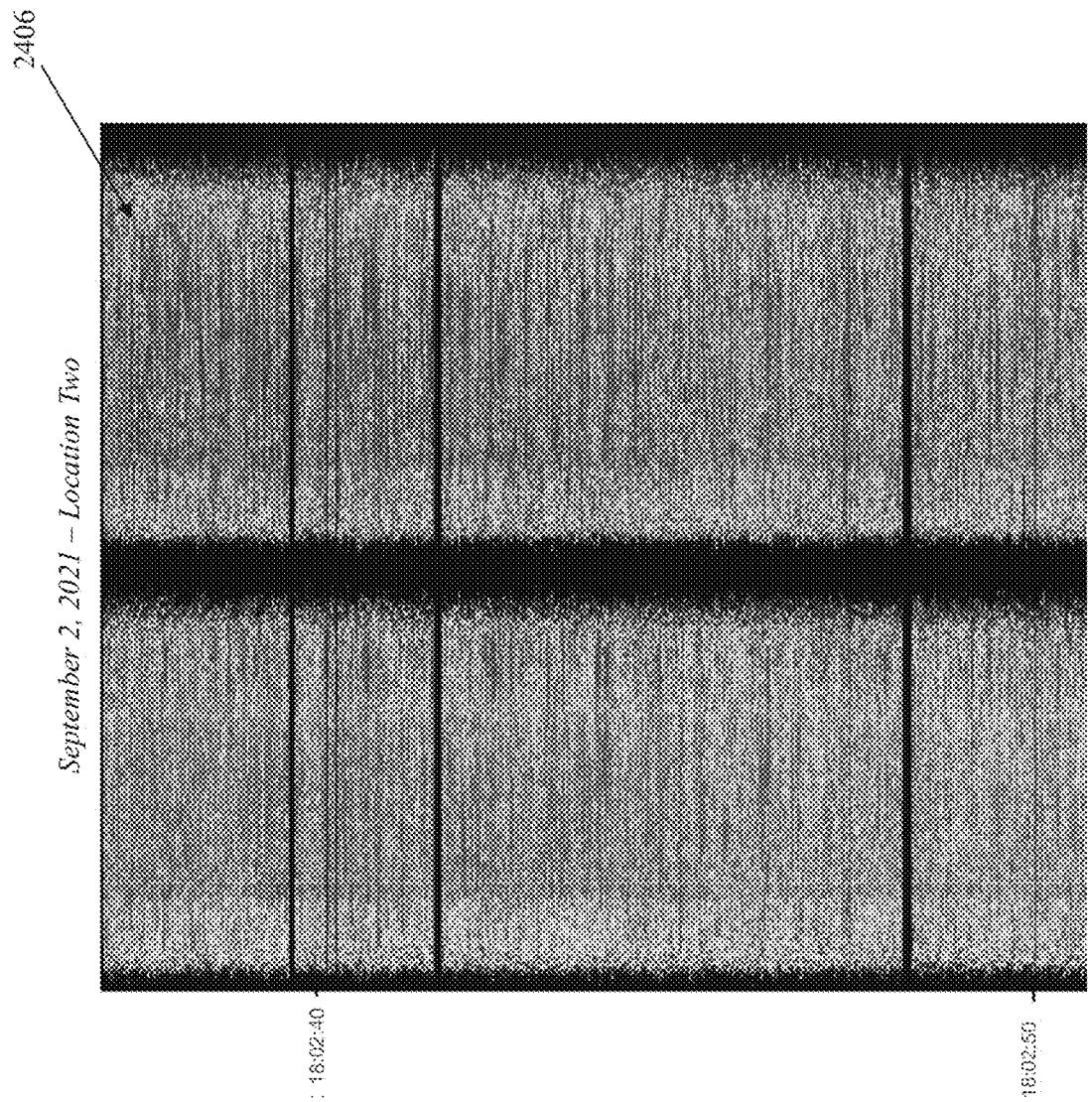
FIG. 24B is another exemplary visualization for an electrical discharge activity pattern, where the pattern is generated due to arcing at an electrical panel bus bar in a different home than in FIG. 24A.

FIG. 24B is another exemplary visualization for an electrical discharge activity pattern, where the pattern is generated due to arcing at an electrical panel bus bar in a different home (Location Two) than in FIG. 24A. As shown in FIG. 24B, image 2406 comprises an electrical discharge activity pattern detected at the home between 18:02:37 and 18:02:50 on Sep. 2, 2021. Although brighter (likely due to the sensor devices being closer to the electrical panel), the pattern depicted in the image 2406 of FIG. 24B is very similar to the pattern depicted in the images 2402, 2404 of FIG. 24A. Advantageously, this similarity enables system 200 to store electrical discharge activity patterns detected at a first location, e.g., in a library of patterns, and compare the patterns stored in the library to electrical discharge activity patterns detected at a second location—in order to quickly determine that a similar cause may be responsible for the discharge activity at the first location and the second location. Further details regarding the use of a library of electrical discharge activity patterns is provided below.

Figure 25:
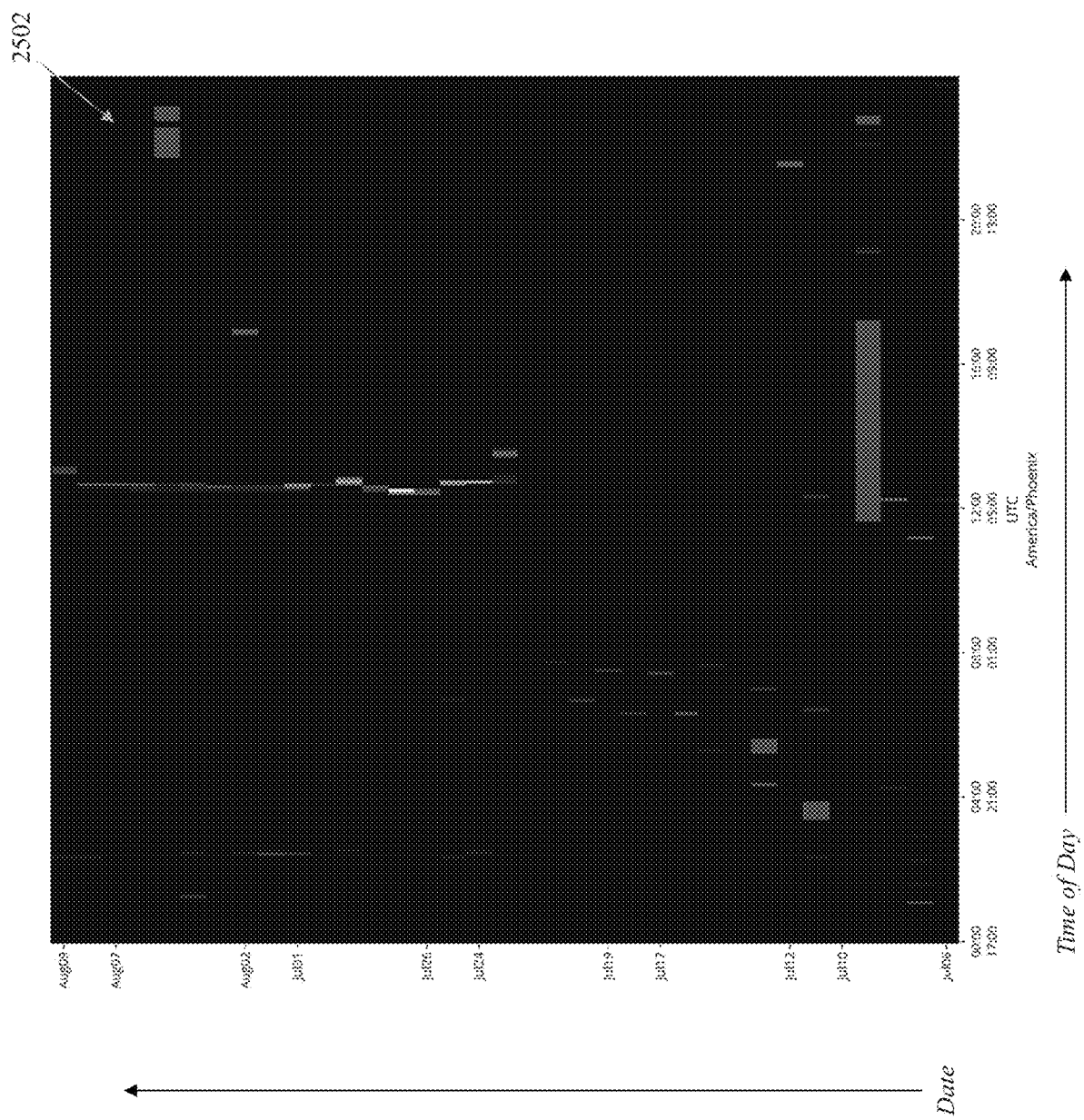
FIG. 25 is an exemplary heat map of electrical discharge activity patterns occurring over time, using the electrical discharge activity pattern of FIG. 22.

When one or more electrical discharge activity patterns are detected and recognized as hazardous, other associated events (e.g., specific devices turning on or off, grid-related surge or sag power quality events, atmospheric conditions such as solar, temperature, wind, and/or precipitation, and electrical activity occurring at consistent times of day and/or for consistent durations during the day) can be identified as aligning with the occurrence of the discharge activity patterns to further refine the decision of whether a pattern of electrical discharge activity represents a fire risk and to focus on a potential cause of the discharge pattern. FIG. 25 is an exemplary heat map 2502 of electrical discharge activity patterns occurring over time, using the electrical discharge activity pattern of FIG. 22. As shown in FIG. 25, the heat map 2502 identifies dates and times of day when the same electrical discharge activity pattern is occurring (as indicated by the white or light-colored sections). As can be appreciated, the electrical discharge activity pattern occurs at the same time (e.g., around 1200 UTC) each day. In this example, because the same activity pattern is correlated with the same time each day, the system 200 can be configured to raise an alert to the customer and/or the resolution team (as will be described below).

Figure 26:
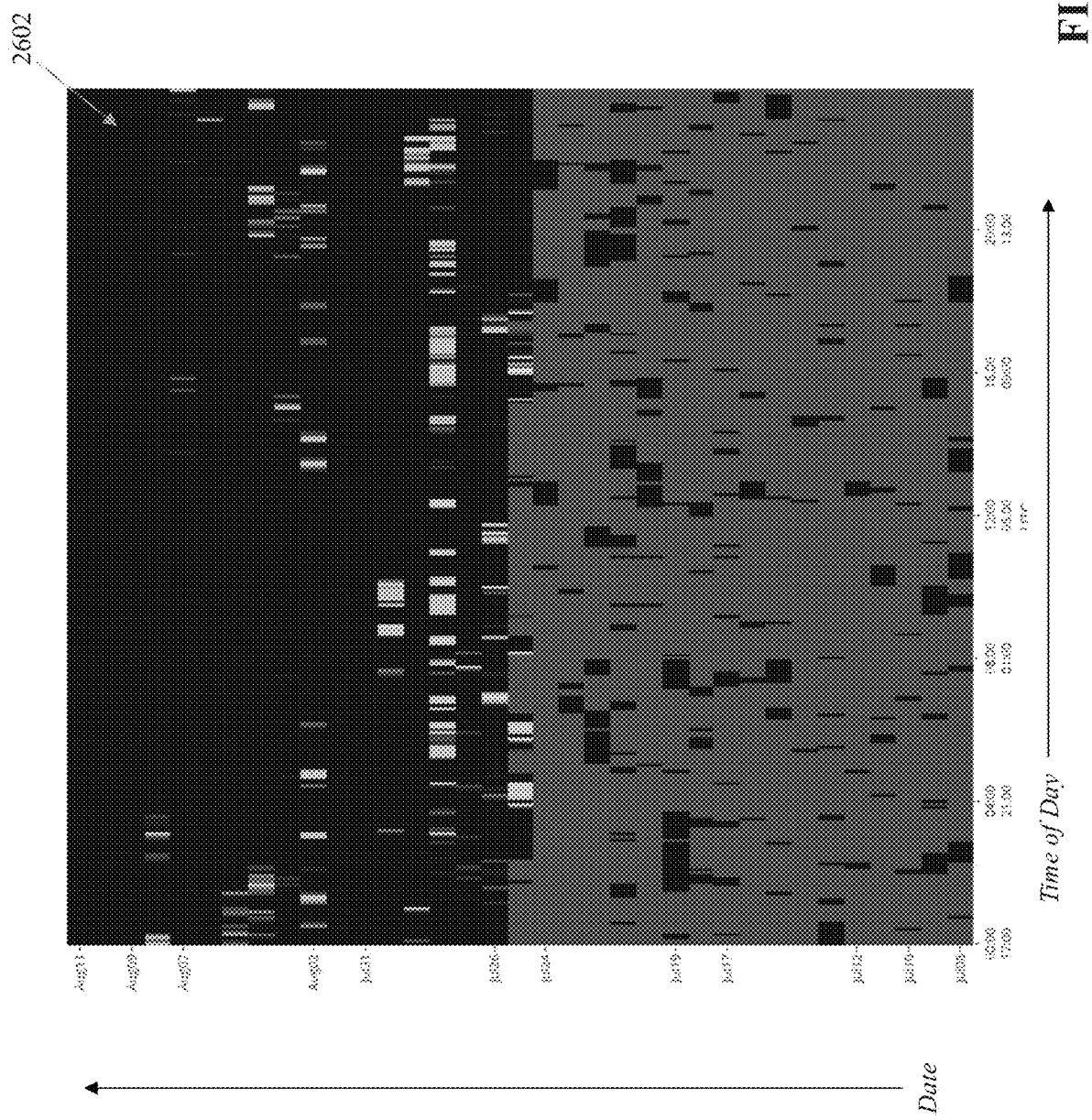
FIG. 26 is another exemplary heat map of electrical discharge activity patterns occurring over time, using the electrical discharge activity pattern of FIG. 24A.

Similarly, FIG. 26 is another exemplary heat map 2602 of electrical discharge activity patterns occurring over time, using the electrical discharge activity pattern of FIG. 24A. As shown in FIG. 26, the heat map 2602 identifies dates and times of day when the electrical discharge activity pattern is occurring (as indicated by the white or light-colored sections). As can be appreciated, the electrical discharge activity correlates to a period of continuous activity.

Figure 27:
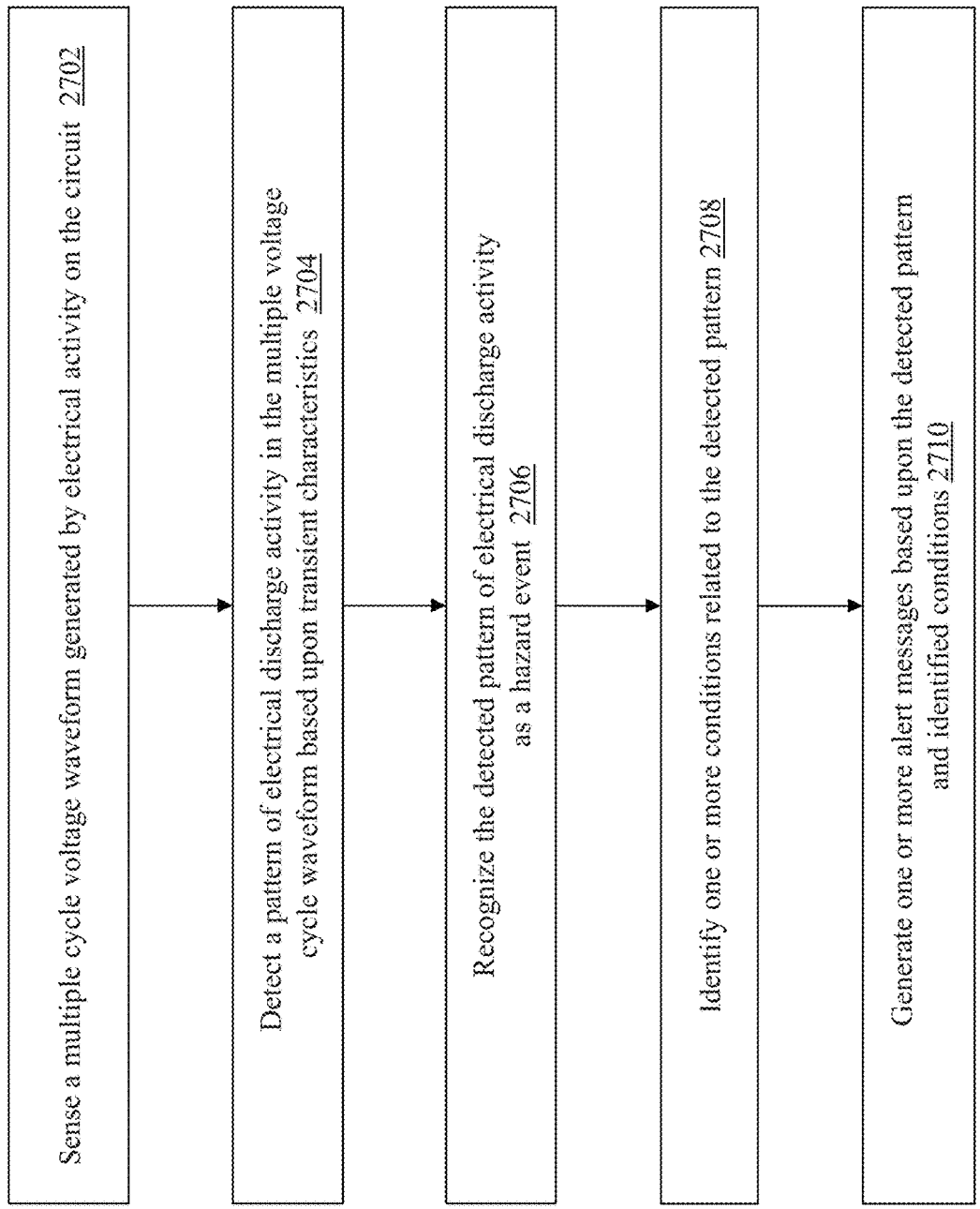
FIG. 27 is a flow diagram of a computerized method of detecting electrical discharges that occur in electrical wiring across multiple cycles of a voltage waveform.

FIG. 27 is a flow diagram of a computerized method 2700 of detecting electrical discharges that occur in electrical wiring across multiple cycles of a voltage waveform, using the system 200 of FIG. 2. One or more sensor devices (e.g., sensor device 204) coupled to a branch circuit (e.g., Branch 1 circuit comprising wires 202) sense (step 2702) a multiple voltage cycle waveform generated by electrical activity on the branch circuit. For example, because an electrical discharge is an impulse change in current, the signal generated by the electrical discharge transmits down the electrical wires 202 reflecting around any junction. These signals have a delay in returning, which is typically based upon the length of the wire. The signals also exhibit a phase shift, which enables the system 200 to detect transient signals in the waveform which represent activity that relates to an electrical discharge (even a very small electrical discharge) on the electrical wires 202 as described herein. In the context of the method of FIG. 27, sensing a multiple voltage cycle waveform advantageously enables the system 200 to analyze waveforms from multiple cycles and determine whether a pattern of electrical activity is occurring, as will be described in greater detail below. The sensor devices 204 transmit the multiple voltage cycle waveform (or at least a portion of the waveform that contains multiple cycles) to server computing device 214.

Transient analysis module 214*a* of server computing device 214 detects (step 2704) one or more patterns of electrical discharge activity in the multiple voltage cycle waveform based upon transient characteristics of the waveform across a plurality of cycles. As described above with respect to FIGS. 5, 6A-6C, 7A-7C, 8A-8C, 9, and 10, the transient analysis module 214*a* can analyze transient characteristics of the received waveform to identify electrical discharge activity. In some embodiments, module 214*a* can categorize each individual electrical discharge activity occurrence as a "series" or "parallel" discharge. As can be appreciated, series and parallel discharges have distinctive signatures within a voltage cycle and module 214*a* can be configured to detect the distinctive signature of a series and/or parallel discharge in the waveform.

Because in this example the waveform comprises multiple voltage cycles, transient analysis module 214*a* further determines whether a same type or signature of electrical discharge activity occurs in multiple consecutive or non-consecutive cycles of the waveform—which may indicate a consistent or recurring pattern of electrical discharge activity. For example, module 214*a* can compare transient characteristics for the waveform in two different cycles and determine whether the transient characteristics match. If a match is determined, module 214a can group the electrical discharge activity from each cycle into a pattern for further analysis. Grouping of the electrical discharge activity into one or more patterns is beneficial to isolating whether arcing is happening, e.g., at the same location in the home over time and/or in similar physical ways. For example, if water is seeping into electrical wiring, such activity will produce a similar pattern of electrical discharge activity occurring over time.

After the transient analysis module 214a has detected one or more patterns of electrical discharge activity, module 214a recognizes (step 2706) the detected pattern of electrical discharge activity as a hazard event. In some embodiments, module 214a recognizes that the pattern is a hazard event based upon analysis of the transient characteristics of the pattern. For example, when the pattern exhibits certain transient characteristics (e.g., a ratio of (i) average peak transients in one or more phase sections of the waveform cycle near a maximum voltage to (ii) average peak transients near a zero crossing of the waveform cycle, and an average of peak transients in one or more of the phase sections near a maximum voltage when the ratio is above a predetermined threshold) that meet or exceed predetermined ranges or threshold values, module 214a can recognize that the pattern is a hazard event and requires further investigation and analysis.

After recognition that the detected pattern is a hazard event, transient analysis module 214a identifies (step 2708) one or more conditions related to the pattern of electrical discharge activity. As can be appreciated, certain types of conditions or events may produce electrical discharge activity patterns on a home's electrical system, or influence already-existing electrical discharge activity patterns, to indicate a potential arcing event or risk of fire. These conditions can include atmospheric events in proximity to the location of the home, such as solar conditions, air temperature, wind direction/wind speed, and/or precipitation. For example, if module 214a determines that the same pattern of electrical discharge activity indications occurs each time it rains at a particular home, it could mean that rainwater is getting into the home's electrical system and causing the discharges. In this case, module 214a can identify that the occurrence of rain aligns with the electrical discharge activity pattern and determine a possibility that the rain is causing the pattern. As a result, system 200 can generate an alert message that prompts the homeowner to investigate whether any structural compromise has occurred with the home (e.g., missing roof shingles, cracked siding, leaking foundation, etc.) to impact the safety of the electrical system.

Conditions that generate or affect patterns of electrical discharge activity may also include grid-based or local infrastructure-based power quality events, such as surge events or sag events. Changes in power quality being received at the home, or occurring within the home, can cause electrical discharge indications to be detected by the system 200—in some cases, these discharge indications can have a particular pattern or signature that corresponds to the power quality event. For power quality events within the home, this could mean loose wiring in an electrical panel or on an individual circuit and can point an electrician to look for a certain type of arcing. This is normally associated with an arcing pattern that is series arcing because of a failed conductor. In the case where the arcing is associated with grid-based power quality events, it could be that the arcing is outside of the home and could be in wiring between the home and the transformer if only impacting nearby homes on the grid, or if impacting multiple homes that are far apart to not be on the same transformer, it could indicate arcing between a substation and the home.

Transient analysis module 214a can correlate the electrical discharge activity indications with power quality event information received from, e.g., a utility provider. For example, when the utility confirms that a power quality event occurred at a specific date and time, and module 214a detects a pattern of electrical discharge activity indications at the same time, module 214a can correlate the pattern to the power quality event. Therefore, module 214a can determine whether the electrical discharge activity indications suggest an arcing event (e.g., certain power quality events may exacerbate arcing events occurring in faulty wiring in a home) or are instead related solely to the power quality event based on, e.g., the transient characteristics of the waveform and the knowledge that a power quality event occurred.

Conditions that generate or affect patterns of electrical discharge activity may also include the activation or deactivation of electronic devices in the home. For example, when a certain device turns on/off, or begins drawing power (such as an HVAC system, appliance, electric blanket, power supply, etc.), there may be an associated change in voltage that is unique to the device. Transient analysis module 214a can associate patterns of electrical discharge activity with power changes caused by devices to determine whether the patterns are indicative of hazardous activity or not. In one example, a homeowner may track his or her device usage over time and provide that information to system 200 for correlation to electrical discharge activity. In another example, sensor device 204 and/or server computing device 214 can be configured to automatically detect changes in voltage on the circuit and/or home electrical system and associate those changes with known signatures of electronic devices.

Any of the above conditions that generate or affect patterns of electrical discharge activity can include a time of day and/or duration of the event to enable more efficient identification of hazardous electrical discharge activity captured by system 200. For example, transient analysis module 214a can monitor the electrical discharge activity and determine that the same electrical discharge activity pattern occurs every day at a prescribed time and for a consistent duration. In another example, module 214a can determine that an electrical discharge activity pattern continuously occurs. Over time, module 214a can correlate this pattern with one or more conditions to determine whether a single cause of the activity can be determined. In cases where the pattern occurs consistently but cannot be reasonably correlated to any conditions that suggest the activity does not comprise arcing in the electrical system, module 214a can determine that an arcing event is likely occurring and generate a notification message.

After identification of conditions related to the electrical discharge activity pattern, alert generation module 214b of server computing device 214 generates (step 2710) one or more alert messages based upon the detected patterns and identified conditions. Module 214b transmits the messages to a remote computing device (e.g., a mobile phone, tablet, smart watch, and the like). The remote computing device can, e.g., display a message or indicator (such as a warning icon) on a screen associated with the remote computing device based upon receipt of the one or more alert signals. For example, the alert signal can comprise a packet-based message including a corpus of text that indicates a dangerous condition or hazard as detected by the system 200. In some embodiments, the alert generation module 214b transmits the one or more alert signals to one or more of the sensor devices 204. The sensor devices 204 can activate one or more components (e.g., embedded components in the sensor device) upon receipt of the one or more alert signals. For example, upon receiving an alert signal from the alert generation module 214b, the sensor device(s) 204 can activate an LED element that lights up and/or flashes on the exterior of the sensor device 204 to indicate that a dangerous condition or hazard has been detected by the system 200. In some embodiments, alert generation module 214b generates alert messages upon determining a risk of fire associated with one or more of the classified patterns and transmits the alert messages to a remote computing device when the risk of fire is at or above a predetermined threshold.

Figure 28:
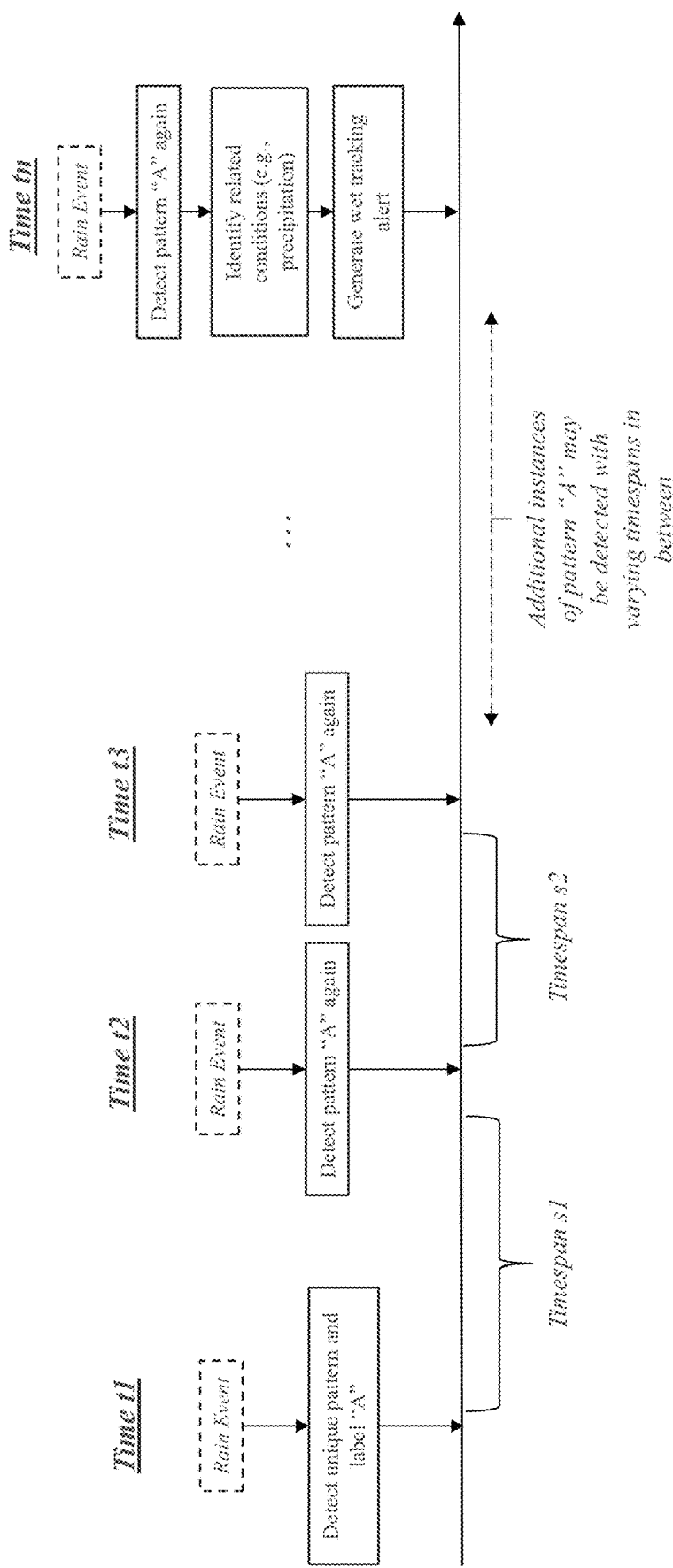
FIG. 28 is a diagram of an exemplary use case timeline for detecting electrical discharge patterns that occur in electrical wiring across multiple cycles of a voltage waveform and identifying related conditions.

FIG. 28 is a diagram of an exemplary use case timeline 2800 for detecting electrical discharge patterns that occur in electrical wiring across multiple cycles of a voltage waveform and identifying related conditions, using the system 200 of FIG. 2. The exemplary use case described with respect to FIG. 28 involves the periodic detection of a unique electrical discharge pattern that system 200 has not previously detected. As shown in FIG. 28, at Time t1, a rain event occurs at a home where the sensor devices are installed. As can be appreciated, due to deficiencies in home construction or maintenance, rainwater may seep into the interior of the home and come in contact with electrical wiring to cause arcing (also called wet tracking). As the wet tracking occurs, sensor devices 204 installed in the home sense a multiple cycle voltage waveform generated by electrical activity on the circuit (which includes the wet tracking activity) and transient analysis module 214a detects a unique pattern of electrical discharge activity generated from the wet tracking. In this case, module 214a has not previously detected the same or similar electrical discharge activity pattern. Module 214a applies a label to the detected pattern (e.g., "A") and stores the labeled pattern in, e.g., database 216 for future reference. In some embodiments, module 214a also stores metadata associated with the labeled pattern, including but not limited to customer information, sensor device information (e.g., IP address, MAC address), location of the home, date/time when the pattern is detected, other conditions (e.g., atmospheric conditions at the home, power quality conditions on the grid servicing the home), etc.

Later, at Time t2, another rain event occurs at the location and module 214a detects pattern "A" again. Module 214a determines that the pattern detected at t2 matches the pattern "A" stored in database 216, and module 214a records a second occurrence of pattern "A." The timespan between t1 and t2 (Timespan s1) can be days, weeks, months, years, etc. Again, at Time t3, another rain event occurs and module 214a detects pattern "A" for a third time. As above, module 214a determines that the pattern detected at t3 matches pattern "A," and module 214a records a third occurrence of pattern "A" (along with some or all of the metadata described above). As can be appreciated, due to the randomness and variability of rain events, the timespan between t2 and t3 (Timespan s2) is a different length than Timespan s1. After Time t3, additional rain events occur and module 214a detects further instances of the occurrence of pattern "A" at the home with varying timespans in between the pattern detection.

Then, at Time tn, another rain event occurs and module 214a detects electrical discharge activity corresponding to pattern "A" again. At this point, a sufficient number of occurrences of pattern "A" have been detected to enable module 214a to identify related conditions that align with the occurrences of pattern "A." For example, at each time that pattern "A" is detected, module 214a can determine that it was raining at the home (e.g., using weather data captured from an external data source and tracked over time). As a result, in some embodiments, module 214a can classify pattern A as a wet tracking event. Alert generation module 214b generates an alert message for transmission to the homeowner and/or monitoring service, indicating that a potentially hazardous pattern of electrical discharge activity has occurred at the home a plurality of times and each time it was raining at the home. Using this information, the homeowner/monitoring service can coordinate with an electrician or home repair technician to, e.g., physically inspect the home and the wiring system to determine whether any leaks are occurring that cause the discharge activity. In the event that a leak is found and it is determined that wet tracking is causing the discharge, module 214a can be configured to store pattern "A" in database 216 as a "wet tracking" pattern for reference in the future against other unknown patterns.

As can be appreciated, over time as more and more hazardous electrical discharge activity is detected, correlated to identified conditions, and mitigated, a library of known hazardous electrical discharge activity patterns (and associated causes of such discharge activity) can be generated for use in more efficiently recognizing hazardous discharges and more quickly generating alert messages for homeowners. As one example, a faulty electric blanket produces a unique electrical discharge activity pattern and this unique pattern can be recognized by system 200 in electrical discharge activity captured from another home. Because system 200 has already classified this pattern as a hazard, system 200 can immediately generate an alert message for transmission to the homeowner without requiring analysis of other conditions (e.g., weather, time, power quality, etc.) to determine a potential cause.

Advantageously, as mentioned above database 216 can store a library of known hazardous electrical discharge activity patterns (such as waveform snippets, 2D images, and/or transient characteristics), e.g., that were previously detected by system 200 and confirmed as relating to previously discovered and mitigated fire hazards. Examples of such fire hazards can include but are not limited to: circuit breaker and/or bus bar arcing within an electrical panel of the home, electrical appliances (such as heating pads, electric blankets, space heaters, etc.), and power supplies for computers or other electronics. Transient analysis module 214a can retrieve the known hazardous electrical discharge activity patterns from database 216 and compare the known patterns to one or more patterns detected by sensor devices to determine whether one or more of the known patterns matches the detected patterns. In one example, module 214a can use a fuzzy threshold when determining a match—e.g., if a certain number of transients in the detected pattern match transients in the known pattern(s), then module 214a confirms that the patterns match. When a detected pattern matches one of the known patterns, module 214a classifies the identified pattern as a hazard event according to the known pattern type.

As explained above, the electrical discharge activity patterns can be visualized as two-dimensional (2D) images. These images beneficially enable module 214a to utilize artificial intelligence (AI)-based image classification techniques to identify matching electrical discharge activity patterns. Exemplary AI-based image classification techniques and models implemented in module 214a can comprise convolutional neural networks (CNNs), artificial neural networks, k-nearest neighbor algorithms, decision trees, Random Forest algorithms, and/or support vector machines. Module 214a can train an image classification model using the known hazardous activity patterns, so that when a new, unknown discharge activity pattern is provided as input to the model, the model can generate a classification of the unknown pattern (e.g., hazard, no hazard) as well as identifying one or more known patterns that are closest to the unknown pattern. It should also be appreciated that known electrical discharge activity patterns can be added to database 216 for individual homes, buildings, electrical systems, etc., and module 214a can utilize the above-referenced AI-based image classification techniques to classify incoming electrical discharge activity pattern data using the library of known patterns. Furthermore, when a true physical source of arcing is identified (e.g., during mitigation efforts), the library can be annotated with more specific metadata about the identified hazard. In some embodiments, metadata can include things like series/parallel discharge, a device type and/or device model the hazard is associated with, etc. This metadata beneficially enables the system 200 to, e.g., subsequently identify in future analyses the specific make(s) and model(s) of devices that are well-known hazards.

Figure 29:
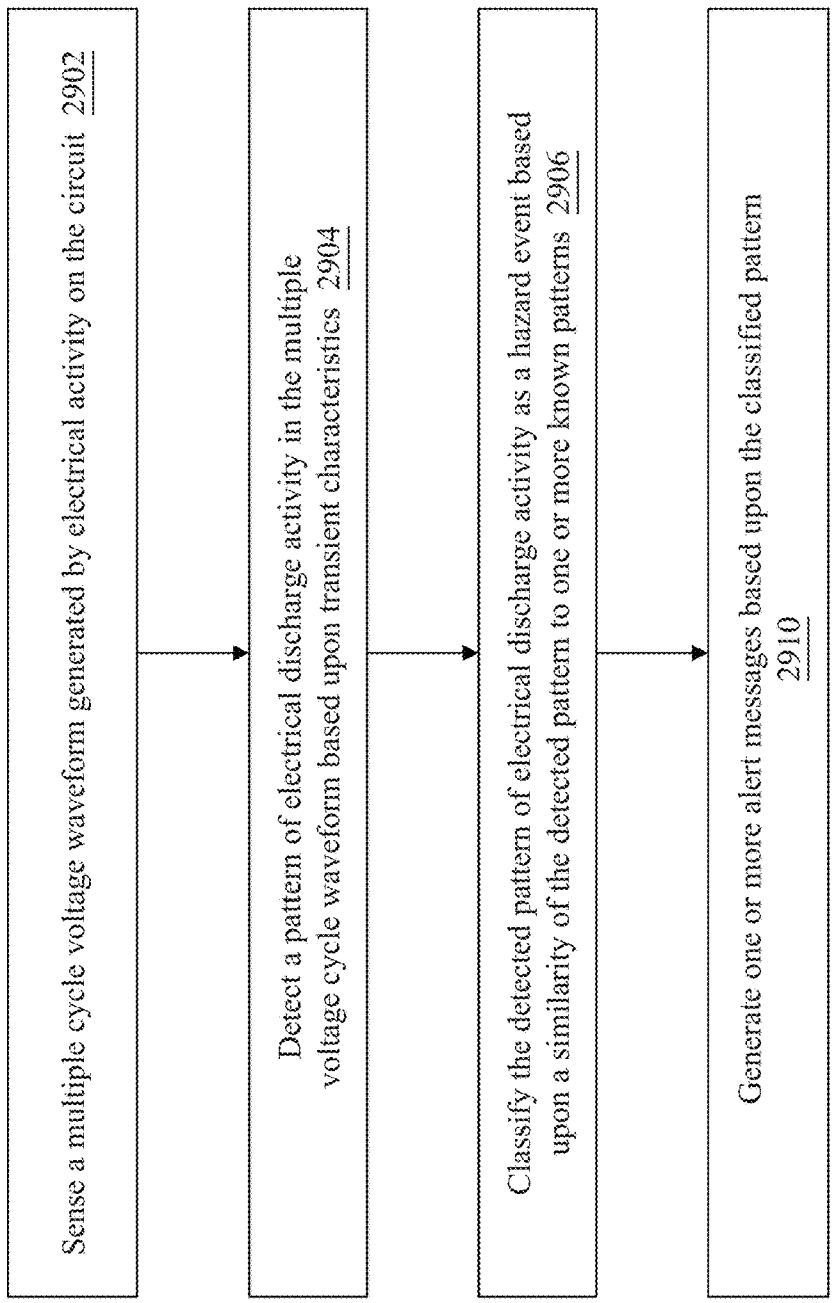
FIG. 29 is a flow diagram of a computerized method of detecting electrical discharges that occur in electrical wiring across multiple cycles of a voltage waveform based upon known hazardous electrical discharges.

FIG. 29 is a flow diagram of a computerized method 2900 of detecting electrical discharges that occur in electrical wiring across multiple cycles of a voltage waveform based upon known hazardous electrical discharges, using the system 200 of FIG. 2. As described previously, one or more sensor devices (e.g., sensor device 204) coupled to a branch circuit (e.g., Branch 1 circuit comprising wires 202) sense (step 2902) a multiple voltage cycle waveform generated by electrical activity on the branch circuit, and the sensor devices 204 transmit the multiple voltage cycle waveform (or at least a portion of the waveform that contains multiple cycles) to server computing device 214. Transient analysis module 214a of server computing device 214 detects (step 2904) one or more patterns of electrical discharge activity in the multiple voltage cycle waveform based upon transient characteristics of the waveform across a plurality of cycles.

After the electrical discharge activity pattern is detected, module 214a can utilize the library of known hazardous discharge activity patterns in database 216 to determine whether the detected pattern is the same as one or more of the known patterns. Module 214a classifies (step 2906) the detected pattern of electrical discharge activity as a hazard event based upon a similarity of the detected pattern to one or more of the known patterns. In some embodiments, module 214a can compare a two-dimensional image of the detected pattern to one or more two-dimensional images of known hazardous patterns (as described above) and determine one or more similarities between the patterns (e.g., pixel similarity, shape similarity, edge similarity, feature extraction, etc.). For example, module 214a can convert the two-dimensional images into multidimensional vectors and compare the vectors to determine a similarity measure. In some cases, the similarity measure can be quantified as a distance measure—such as Euclidean distance, cosine similarity, or Hausdorff distance. Two images can be considered matching where the distance measure is within a predetermined range of values, such as between 0.9 and 1.0 (where 1.0 indicates an exact match and 0.0 indicates no match).

In the event that the detected pattern matches one or more known patterns, module 214a can retrieve metadata associated with the known pattern from database 216 (e.g., conditions associated with the pattern, cause of the pattern, etc.) and generate (step 2908) one or more alert messages based upon the classified pattern and the retrieved metadata for transmission to the homeowner devices/monitoring service. In some embodiments, the known pattern can correspond to a specific device type (e.g., model, make), specific conditions (e.g., atmospheric conditions, time conditions, power quality conditions), and/or other causative factors and modules 214a can include any or all of this information in the alert message.

In some embodiments, after matching the detected pattern to one or more known patterns, transient analysis module 214a can identify one or more conditions related to the detected pattern of electrical discharge activity and/or known patterns of electrical discharge activity. As can be appreciated, the identified conditions can be used to enhance the alert message provided to the homeowner/monitoring service, and assist in more precisely determining a potential cause of the discharge. For example, the detected pattern may match a known pattern relating to power supply arcing. Module 214a can further identify that the detected pattern most often occurs at 8:00 am. Module 214a correlates this timestamp with the detected pattern of electrical discharge activity, and alert generation module 214b can include the timestamp information in an alert message. The timestamp information provides the homeowner with additional context regarding the power supply arcing issue and may lead the homeowner to perform specific investigative steps to confirm the arcing. For example, the homeowner may start his or her work day each morning at 8:00 am by turning on a computer connected to the power supply. With knowledge of a) the power supply arcing and b) the timestamp, the homeowner can quickly isolate the behavior of turning on the computer as generating the arcing issue and determine that the computer power supply is likely to blame.

In some embodiments, a detected pattern may not match any of the known hazardous activity patterns. In this case, transient analysis module 214a can transmit the detected pattern to a remote computing device (not shown)—such as a system analyst device—for visual presentation of the detected pattern to a user. The user can analyze the detected pattern to determine whether the pattern indicates or suggests a hazard event and/or a risk of fire (or at least requires further physical investigation with the homeowner to confirm or rule out). The remote computing device can transmit the decision made by the user to transient analysis module 214a for classification of the detected pattern. When the user determines that the detected pattern is indicative of a hazard event or risk of fire, module 214a can store the detected pattern in database 216 and in some cases, use the detected pattern for comparison and analysis of subsequent electrical activity patterns—thereby producing a self-learning feature for fire detection. Alternatively, when the user determines that the detected pattern is not indicative of a hazard event (e.g., risk of fire), transient analysis module 214a can discard the detected pattern or store the identified pattern in database 216. In another example, if the detected pattern does not match any of the known arcing patterns, module 214a can continue by rejecting or discarding the detected pattern as a false positive hazard event.

It should be appreciated that given the nature of electrical fire precursors—small, hidden, and persistent once they start—it is not enough to indicate to a homeowner via an alert message that a hazard exists. In some embodiments, a monitoring service or operations team can receive the alert message and automatically contact the homeowner to coordinate a plan to identify the source of the problem and mitigate the risk. Typically, the fire risk is not imminent. In many cases, however, the analysis performed by system 200 has revealed a definitive cause type, supplying the homeowner and monitoring service with key information and shaping their discussion to isolate the source. Most homeowners are able to provide some contextual value to isolate further—or even outright identify—the precise cause of the arcing event(s). Therefore, the benefits and advantages of the technology described herein become apparent—enabling the ability to automatically detect fire precursor activity in an electrical system, categorize and classify the activity according to a potential or predicted risk of fire, and proactively coordinate with the homeowner, utility, and/or service professionals to remediate the problem well before any threat of loss of life or property has arisen.

The above-described techniques can be implemented in digital and/or analog electronic circuitry, or in computer hardware, firmware, software, or in combinations of them. The implementation can be as a computer program product, i.e., a computer program tangibly embodied in a machine-readable storage device, for execution by, or to control the operation of, a data processing apparatus, e.g., a programmable processor, a computer, and/or multiple computers. A computer program can be written in any form of computer or programming language, including source code, compiled code, interpreted code and/or machine code, and the computer program can be deployed in any form, including as a stand-alone program or as a subroutine, element, or other unit suitable for use in a computing environment. A computer program can be deployed to be executed on one computer or on multiple computers at one or more sites.

Method steps can be performed by one or more special-purpose processors executing a computer program to perform functions of the technology by operating on input data and/or generating output data. Method steps can also be performed by, and an apparatus can be implemented as, special purpose logic circuitry, e.g., a FPGA (field programmable gate array), a FPAA (field-programmable analog array), a CPLD (complex programmable logic device), a PSoC (Programmable System-on-Chip), ASIP (application-specific instruction-set processor), or an ASIC (application-specific integrated circuit), or the like. Subroutines can refer to portions of the stored computer program and/or the processor, and/or the special circuitry that implement one or more functions.

Processors suitable for the execution of a computer program include, by way of example, both general and special purpose microprocessors, and any one or more processors of any kind of digital or analog computer. Generally, a processor receives instructions and data from a read-only memory or a random access memory or both. The essential elements of a computer are a processor for executing instructions and one or more memory devices for storing instructions and/or data. Memory devices, such as a cache, can be used to temporarily store data. Memory devices can also be used for long-term data storage. Generally, a computer also includes, or is operatively coupled to receive data from or transfer data to, or both, one or more mass storage devices for storing data, e.g., magnetic, magneto-optical disks, or optical disks. A computer can also be operatively coupled to a communications network in order to receive instructions and/or data from the network and/or to transfer instructions and/or data to the network. Computer-readable storage mediums suitable for embodying computer program instructions and data include all forms of volatile and non-volatile memory, including by way of example semiconductor memory devices, e.g., DRAM, SRAM, EPROM, EEPROM, and flash memory devices; magnetic disks, e.g., internal hard disks or removable disks; magneto-optical disks; and optical disks, e.g., CD, DVD, HD-DVD, and Blu-ray disks. The processor and the memory can be supplemented by and/or incorporated in special purpose logic circuitry.

To provide for interaction with a user, the above described techniques can be implemented on a computer in communication with a display device, e.g., a CRT (cathode ray tube), plasma, or LCD (liquid crystal display) monitor, for displaying information to the user and a keyboard and a pointing device, e.g., a mouse, a trackball, a touchpad, or a motion sensor, by which the user can provide input to the computer (e.g., interact with a user interface element). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributed computing system that includes a front-end component. The front-end component can, for example, be a client computer having a graphical user interface, a Web browser through which a user can interact with an example implementation, and/or other graphical user interfaces for a transmitting device. The above described techniques can be implemented in a distributed computing system that includes any combination of such back-end, middleware, or front-end components.

The components of the computing system can be interconnected by transmission medium, which can include any form or medium of digital or analog data communication (e.g., a communication network). Transmission medium can include one or more packet-based networks and/or one or more circuit-based networks in any configuration. Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), Bluetooth, Wi-Fi, WiMAX, general packet radio service (GPRS) network, HiperLAN), and/or other packet-based networks. Circuit-based networks can include, for example, the public switched telephone network (PSTN), a legacy private branch exchange (PBX), a wireless network (e.g., RAN, code-division multiple access (CDMA) network, time division multiple access (TDMA) network, global system for mobile communications (GSM) network), and/or other circuit-based networks.

Information transfer over transmission medium can be based on one or more communication protocols. Communication protocols can include, for example, Ethernet protocol, Internet Protocol (IP), Voice over IP (VOIP), a Peer-to-Peer (P2P) protocol, Hypertext Transfer Protocol (HTTP), Session Initiation Protocol (SIP), H.323, Media Gateway Control Protocol (MGCP), Signaling System #7 (SS7), a Global System for Mobile Communications (GSM) protocol, a Push-to-Talk (PTT) protocol, a PTT over Cellular (POC) protocol, and/or other communication protocols.

Devices of the computing system can include, for example, a computer, a computer with a browser device, a telephone, an IP phone, a mobile device (e.g., cellular phone, personal digital assistant (PDA) device, laptop computer, electronic mail device), and/or other communication devices. The browser device includes, for example, a computer (e.g., desktop computer, laptop computer) with a World Wide Web browser (e.g., Microsoft® Internet Explorer® available from Microsoft Corporation, Mozilla® Firefox available from Mozilla Corporation). Mobile computing device include, for example, a Blackberry®. IP phones include, for example, a Cisco® Unified IP Phone 7985G available from Cisco Systems, Inc., and/or a Cisco® Unified Wireless Phone 7920 available from Cisco Systems, Inc.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein.

What is claimed is:

1. A computerized method of detecting hazardous electrical discharge activity patterns in electrical wiring, the method comprising:
   sensing, by one or more sensor devices coupled to a circuit, a multiple voltage cycle waveform generated by electrical activity on the circuit;
   detecting, by a computing device, a pattern of electrical discharge activity occurring in the multiple voltage cycle waveform based upon transient characteristics of the waveform in each of a plurality of cycles;
   recognizing, by the computing device, the pattern of electrical discharge activity as a hazard event;
   identifying, by the computing device, one or more conditions related to the pattern of electrical discharge activity; and
   generating, by the computing device, one or more alert messages based upon the pattern of electrical discharge activity and the identified conditions.

2. The method of claim 1, wherein detecting the pattern of electrical discharge activity occurring in the multiple voltage cycle waveform comprises:
   detecting an instance of electrical discharge activity in each of a plurality of cycles of the multiple voltage cycle waveform;
   comparing the detected electrical discharge activity instances using characteristics of each electrical discharge activity instance to determine a match; and
   grouping the matching electrical discharge activity instances into a patterns of electrical discharge activity.

3. The method of claim 1, wherein the transient characteristics comprise one or more of: a ratio of (i) average peak transients in one or more phase sections of the waveform cycle near a maximum voltage to (ii) average peak transients near a zero crossing of the waveform cycle, and an average of peak transients in one or more of the phase sections near a maximum voltage when the ratio is above a predetermined threshold.

4. The method of claim 1, further comprising determining, by the computing device, a cause of the pattern of electrical discharge activity using the identified conditions.

5. The method of claim 1, wherein the conditions related to the pattern of electrical discharge activity comprise one or more of: atmospheric conditions at a location of the sensor devices, temporal conditions, electrical activity conditions associated with an electrical device coupled to the circuit, or power quality conditions associated with a power distribution system to which the sensor devices are coupled.

6. The method of claim 5, wherein the atmospheric conditions comprise one or more of: precipitation, wind activity, solar activity, or outdoor temperature.

7. The method of claim 5, wherein the temporal conditions comprise a singular time of day or a continuous period of time.

8. The method of claim 5, wherein the power quality conditions are one or more of: a power surge or a power sag.

9. The method of claim 8, wherein the power quality conditions are identified on a power distribution system inside a building where the sensor devices and the circuit are located.

10. The method of claim 8, wherein the power quality conditions are identified on a power distribution system that provides power to a building where the sensor devices and the circuit are located.

11. The method of claim 5, wherein the electrical activity conditions comprise one or more of: the electrical device turning on or the electrical device turning off.

12. The method of claim 1, further comprising transmitting, by the computing device, the generated alert messages to one or more remote computing devices.

13. The method of claim 12, wherein one or more of the sensor devices receives at least one of the alert messages and activates an alert indication device embedded in the sensor device upon receiving the alert message.

14. The method of claim 13, wherein the alert indication device comprises a light emitting diode (LED).

15. A system for detecting hazardous electrical discharge activity patterns in electrical wiring, the system comprising:
   one or more sensor devices coupled to a circuit that sense a multiple voltage cycle waveform generated by electrical activity on the circuit; and
   a computing device that:
      detects a pattern of electrical discharge activity occurring in the multiple voltage cycle waveform based upon transient characteristics of the waveform in each of a plurality of cycles;
      recognizes the pattern of electrical discharge activity as a hazard event;
      identifies one or more conditions related to the pattern of electrical discharge activity; and
      generates one or more alert messages based upon the pattern of electrical discharge activity and the identified conditions.

16. The system of claim 15, wherein detecting the pattern of electrical discharge activity occurring in the multiple voltage cycle waveform comprises:
   detecting an instance of electrical discharge activity in each of a plurality of cycles of the multiple voltage cycle waveform;
   comparing the detected electrical discharge activity instances using characteristics of each electrical discharge activity instance to determine a match; and
   grouping the matching electrical discharge activity instances into a patterns of electrical discharge activity.

17. The system of claim 15, wherein the transient characteristics comprise one or more of: a ratio of (i) average peak transients in one or more phase sections of the waveform cycle near a maximum voltage to (ii) average peak transients near a zero crossing of the waveform cycle, and an average of peak transients in one or more of the phase sections near a maximum voltage when the ratio is above a predetermined threshold.

18. The system of claim 15, wherein the computing device determines a cause of the pattern of electrical discharge activity using the identified conditions.

19. The system of claim 15, wherein the conditions related to the pattern of electrical discharge activity comprise one or more of: atmospheric conditions at a location of the sensor devices, temporal conditions, electrical activity conditions associated with an electrical device coupled to the circuit, or power quality conditions associated with a power distribution system to which the sensor devices are coupled.

20. The system of claim 19, wherein the atmospheric conditions comprise one or more of: precipitation, wind activity, solar activity, or outdoor temperature.

21. The system of claim 19, wherein the temporal conditions comprise a singular time of day or a continuous period of time.

22. The system of claim 19, wherein the power quality conditions are one or more of: a power surge or a power sag.

23. The system of claim 22, wherein the power quality conditions are identified on a power distribution system inside a building where the sensor devices and the circuit are located.

24. The system of claim 22, wherein the power quality conditions are identified on a power distribution system that provides power to a building where the sensor devices and the circuit are located.

25. The system of claim 19, wherein the electrical activity conditions comprise one or more of: the electrical device turning on or the electrical device turning off.

26. The system of claim 15, wherein the computing device transmits the generated alert messages to one or more remote computing devices.

27. The system of claim 26, wherein one or more of the sensor devices receives at least one of the alert messages and activates an alert indication device embedded in the sensor device upon receiving the alert message.

28. The method of claim 27, wherein the alert indication device comprises a light emitting diode (LED).

29. A computerized method of detecting hazardous electrical discharge activity patterns in electrical wiring, the method comprising:
    sensing, by one or more sensor devices coupled to a circuit, a multiple voltage cycle waveform generated by electrical activity on the circuit;
    detecting, by a computing device, a pattern of electrical discharge activity occurring in the multiple voltage cycle waveform based upon transient characteristics of the waveform in each of a plurality of cycles;
    classifying, by the computing device, the detected pattern of electrical discharge activity as a hazard event based upon a similarity of the detected pattern of electrical discharge activity to one or more known patterns of hazardous electrical discharge activity; and
    generating, by the computing device, one or more alert messages based upon the classified pattern of electrical discharge activity.

30. The method of claim 29, wherein the one or more known patterns of hazardous electrical discharge activity include a pattern of circuit breaker arcing within an electric panel, a pattern of electric device arcing, and a pattern of power supply arcing.

31. The method of claim 29, wherein the one or more known patterns of hazardous electrical discharge activity are stored as two-dimensional images in a database communicatively coupled to the computing device.

32. The method of claim 31, wherein the computing device generates a two-dimensional image of the detected pattern of electrical discharge activity occurring in the multiple voltage cycle waveform.

33. The method of claim 32, wherein classifying the detected pattern of electrical discharge activity as a hazard event comprises comparing one or more characteristics of the two-dimensional image of the detected pattern of electrical discharge activity to one or more characteristics of the two-dimensional images of the known patterns of hazardous electrical discharge activity to determine the similarity.

34. The method of claim 32, wherein classifying the detected pattern of electrical discharge activity as a hazard event comprises executing a machine learning image classification model using the two-dimensional image of the detected pattern of electrical discharge activity as input to generate the similarity to one or more of the two-dimensional images of the known patterns of hazardous electrical discharge activity.

35. The method of claim 34, wherein the machine learning image classification model is based upon a convolutional neural network.

36. The method of claim 29, further comprising transmitting, by the computing device, the generated alert messages to one or more remote computing devices.

37. The method of claim 36, wherein one or more of the sensor devices receives at least one of the alert messages and activates an alert indication device embedded in the sensor device upon receiving the alert message.

38. The method of claim 37, wherein the alert indication device comprises a light emitting diode (LED).

39. The method of claim 29, further comprising identifying, by the computing device, one or more conditions related to the detected pattern of electrical discharge activity.

40. The method of claim 39, wherein the computing device generates the one or more alert messages based upon the classified pattern of electrical discharge activity and the identified conditions.

41. A system for detecting hazardous electrical discharge activity patterns in electrical wiring, the system comprising:
    one or more sensor devices coupled to a circuit that sense a multiple voltage cycle waveform generated by electrical activity on the circuit; and
    a computing device that:
        detects a pattern of electrical discharge activity occurring in the multiple voltage cycle waveform based upon transient characteristics of the waveform in each of a plurality of cycles;
        classifies the detected pattern of electrical discharge activity as a hazard event based upon a similarity of the detected pattern of electrical discharge activity to one or more known patterns of hazardous electrical discharge activity; and
        generates one or more alert messages based upon the classified pattern of electrical discharge activity.

42. The system of claim 41, wherein the one or more known patterns of hazardous electrical discharge activity include a pattern of circuit breaker arcing within an electric panel, a pattern of electric device arcing, and a pattern of power supply arcing.

43. The system of claim 41, wherein the one or more known patterns of hazardous electrical discharge activity are stored as two-dimensional images in a database communicatively coupled to the computing device.

44. The system of claim 43, wherein the computing device generates a two-dimensional image corresponding to the detected pattern of electrical discharge activity occurring in the multiple voltage cycle waveform.

45. The system of claim 44, wherein classifying the detected pattern of electrical discharge activity as a hazard event comprises comparing one or more characteristics of the two-dimensional image of the detected pattern of electrical discharge activity to one or more characteristics of the two-dimensional images of the known patterns of hazardous electrical discharge activity to determine the similarity.

46. The system of claim 44, wherein classifying the detected pattern of electrical discharge activity as a hazard event comprises executing a machine learning image classification model using the two-dimensional image of the detected pattern of electrical discharge activity as input to generate the similarity to one or more of the two-dimensional images of the known patterns of hazardous electrical discharge activity.

47. The system of claim 46, wherein the machine learning image classification model is based upon a convolutional neural network.

48. The system of claim 41, wherein the computing device transmits the generated alert messages to one or more remote computing devices.

49. The system of claim 48, wherein one or more of the sensor devices receives at least one of the alert messages and activates an alert indication device embedded in the sensor device upon receiving the alert message.

50. The system of claim 49, wherein the alert indication device comprises a light emitting diode (LED).

51. The system of claim 41, further comprising identifying, by the computing device, one or more conditions related to the detected pattern of electrical discharge activity.

52. The system of claim 51, wherein the computing device generates the one or more alert messages based upon the classified pattern of electrical discharge activity and the identified conditions.

* * * * *